US012417941B2

(12) United States Patent
Huang et al.

(10) Patent No.: US 12,417,941 B2
(45) Date of Patent: Sep. 16, 2025

(54) ISOLATION STRUCTURES IN SEMICONDUCTOR DEVICES

(71) Applicant: Taiwan Semiconductor Manufacturing Company, Ltd., Hsinchu (TW)

(72) Inventors: Jui-Chen Huang, Hsinchu (TW); Szuya Liao, Hsinchu (TW); Cheng-Yin Wang, Taipei (TW); Wei-Cheng Lin, Taichung (TW); Wei-Cheng Tzeng, Taipei (TW)

(73) Assignee: Taiwan Semiconductor Manufacturing Company, Ltd.

( * ) Notice: Subject to any disclaimer, the term of this patent is extended or adjusted under 35 U.S.C. 154(b) by 485 days.

(21) Appl. No.: 17/821,042

(22) Filed: Aug. 19, 2022

(65) Prior Publication Data

US 2023/0307285 A1    Sep. 28, 2023

Related U.S. Application Data

(60) Provisional application No. 63/322,532, filed on Mar. 22, 2022.

(51) Int. Cl.
*H01L 21/762*        (2006.01)
*H10D 30/01*        (2025.01)
(Continued)

(52) U.S. Cl.
CPC ..... *H01L 21/76224* (2013.01); *H10D 30/014* (2025.01); *H10D 30/43* (2025.01);
(Continued)

(58) Field of Classification Search
CPC . H01L 21/76224; H10D 30/014; H10D 30/43
See application file for complete search history.

(56) References Cited

U.S. PATENT DOCUMENTS

| 8,377,779 B1 * | 2/2013 | Wang | H10D 30/024 |
| | | | 438/269 |
| 9,105,490 B2 | 8/2015 | Wang et al. | |

(Continued)

FOREIGN PATENT DOCUMENTS

| CN | 116435306 A | * | 7/2023 | ....... H01L 21/76224 |
| CN | 118435354 A | * | 8/2024 | ............ B82Y 10/00 |

(Continued)

*Primary Examiner* — Laura M Menz
(74) *Attorney, Agent, or Firm* — Sterne, Kessler, Goldstein & Fox P.L.L.C.

(57) ABSTRACT

A semiconductor device with isolation structures and a method of fabricating the same are disclosed. The semiconductor device includes first and second FETs, an isolation structure, and a conductive structure. The first FET includes a first fin structure, a first array of gate structures disposed on the first fin structure, and a first array of S/D regions disposed on the first fin structure. The second FET includes a second fin structure, a second array of gate structures disposed on the second fin structure, and a second array of S/D regions disposed on the second fin structure. The isolation structure includes a fill portion and a liner portion disposed between the first and second FETs and in physical contact with the first and second arrays of gate structures. The conductive structure is disposed in the liner portion and conductively coupled to a S/D region of the second array of S/D regions.

20 Claims, 64 Drawing Sheets

(51) Int. Cl.
*H10D 30/43* (2025.01)
*H10D 30/67* (2025.01)
*H10D 62/10* (2025.01)
*H10D 62/13* (2025.01)
*H10D 64/01* (2025.01)
*H10D 64/23* (2025.01)
*H10D 84/01* (2025.01)
*H10D 84/03* (2025.01)
*H10D 84/85* (2025.01)

(52) U.S. Cl.
CPC ..... *H10D 30/6729* (2025.01); *H10D 30/6735* (2025.01); *H10D 30/6757* (2025.01); *H10D 62/121* (2025.01); *H10D 62/151* (2025.01); *H10D 64/01* (2025.01); *H10D 64/258* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/856* (2025.01)

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,406,804 B2* | 8/2016 | Huang | H10D 62/021 |
| 9,443,769 B2 | 9/2016 | Wang et al. | |
| 9,520,482 B1* | 12/2016 | Chang | H10D 84/038 |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,157,987 B1* | 12/2018 | Liaw | H01L 23/5226 |
| 10,700,207 B2* | 6/2020 | Chen | H01L 21/76871 |
| 11,114,366 B2* | 9/2021 | Liaw | H10D 84/038 |
| 11,251,284 B2* | 2/2022 | Lin | H10D 64/017 |
| 11,437,277 B2* | 9/2022 | Ko | H10D 84/0158 |
| 11,532,751 B2* | 12/2022 | Chen | H01L 21/76895 |
| 11,575,014 B2 | 2/2023 | Bae et al. | |
| 11,758,736 B2* | 9/2023 | Young | H10B 51/30 257/295 |
| 11,862,561 B2* | 1/2024 | Chang | H01L 24/05 |
| 11,862,701 B2* | 1/2024 | Chung | H10D 30/6211 |
| 11,929,417 B2* | 3/2024 | Diaz | H10D 30/43 |
| 12,002,715 B2* | 6/2024 | Tsai | H10D 84/834 |
| 12,002,718 B2* | 6/2024 | Wu | H10D 84/0177 |
| 12,034,076 B2* | 7/2024 | Chen | H10D 30/6211 |
| 2019/0164882 A1* | 5/2019 | Chen | H10D 84/834 |
| 2019/0326300 A1* | 10/2019 | Liaw | H10D 62/292 |
| 2019/0378722 A1 | 12/2019 | Economikos et al. | |
| 2020/0035543 A1 | 1/2020 | Zang et al. | |
| 2020/0335585 A1* | 10/2020 | Liaw | H10D 84/0186 |
| 2021/0028311 A1* | 1/2021 | Chen | H10D 84/038 |
| 2021/0098338 A1* | 4/2021 | Liaw | H01L 21/76877 |
| 2021/0384351 A1* | 12/2021 | Chen | H01L 21/76895 |
| 2022/0028972 A1* | 1/2022 | Rachmady | H10D 30/6735 |
| 2022/0037497 A1* | 2/2022 | Chung | H10D 62/116 |
| 2022/0278098 A1* | 9/2022 | Lin | H10D 84/0128 |
| 2023/0060742 A1* | 3/2023 | Lin | H10D 84/013 |
| 2023/0067425 A1* | 3/2023 | Lin | H10D 84/0151 |
| 2023/0215767 A1* | 7/2023 | Xie | H10D 30/43 257/329 |
| 2023/0307285 A1* | 9/2023 | Huang | H10D 84/0186 |
| 2024/0107736 A1* | 3/2024 | Wu | H10D 89/10 |
| 2024/0145581 A1* | 5/2024 | Chiu | H10D 84/0167 |
| 2024/0170553 A1* | 5/2024 | Chung | H10D 30/6219 |
| 2024/0186190 A1* | 6/2024 | Lin | H01L 21/76224 |
| 2024/0250087 A1* | 7/2024 | Jin | H10D 84/0186 |
| 2024/0322042 A1* | 9/2024 | Chen | H01L 21/76895 |
| 2024/0365559 A1* | 10/2024 | Young | H10D 30/701 |
| 2024/0413202 A1* | 12/2024 | Tsai | H10D 84/0151 |
| 2025/0063792 A1* | 2/2025 | You | H10D 30/43 |
| 2025/0113596 A1* | 4/2025 | Huang | H10D 62/155 |
| 2025/0126829 A1* | 4/2025 | Kang | H10D 30/6757 |

FOREIGN PATENT DOCUMENTS

| | | | | |
|---|---|---|---|---|
| CN | 118693089 A | * | 9/2024 | ....... H01L 21/76831 |
| CN | 221727116 U | * | 9/2024 | ..... H01L 21/823821 |
| CN | 119108350 A | * | 12/2024 | ..... H01L 21/823412 |
| DE | 102017117794 A1 | * | 6/2018 | ....... H01L 21/28008 |
| DE | 102021113549 B3 | * | 5/2022 | ..... H01L 21/823412 |
| DE | 112022005423 T5 | * | 8/2024 | ............. B82Y 10/00 |
| EP | 4435842 A1 | * | 9/2024 | ....... H01L 21/76831 |
| TW | 202211334 A | | 3/2022 | |
| WO | WO-2023126702 A1 | * | 7/2023 | ............. B82Y 10/00 |

* cited by examiner

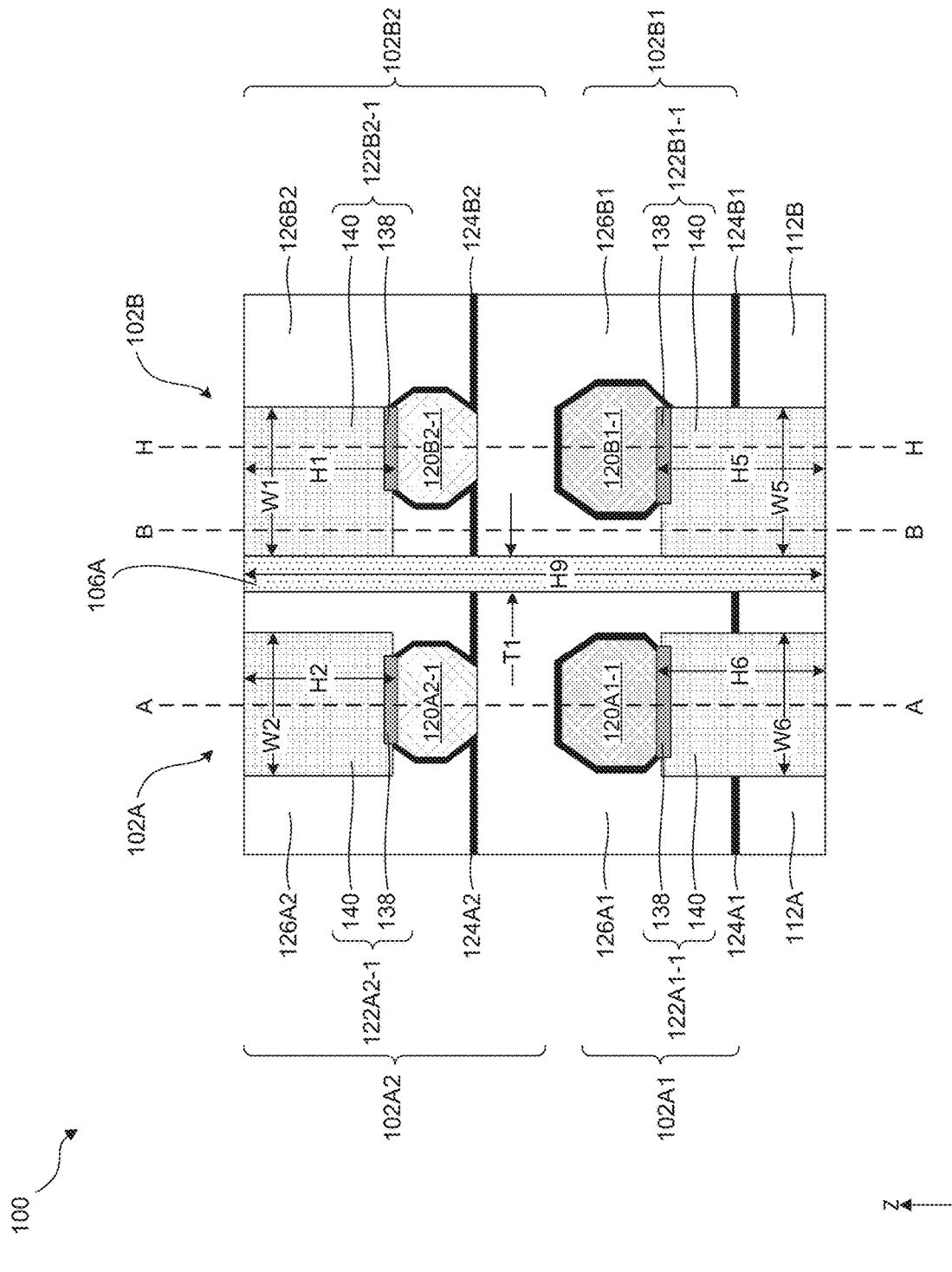

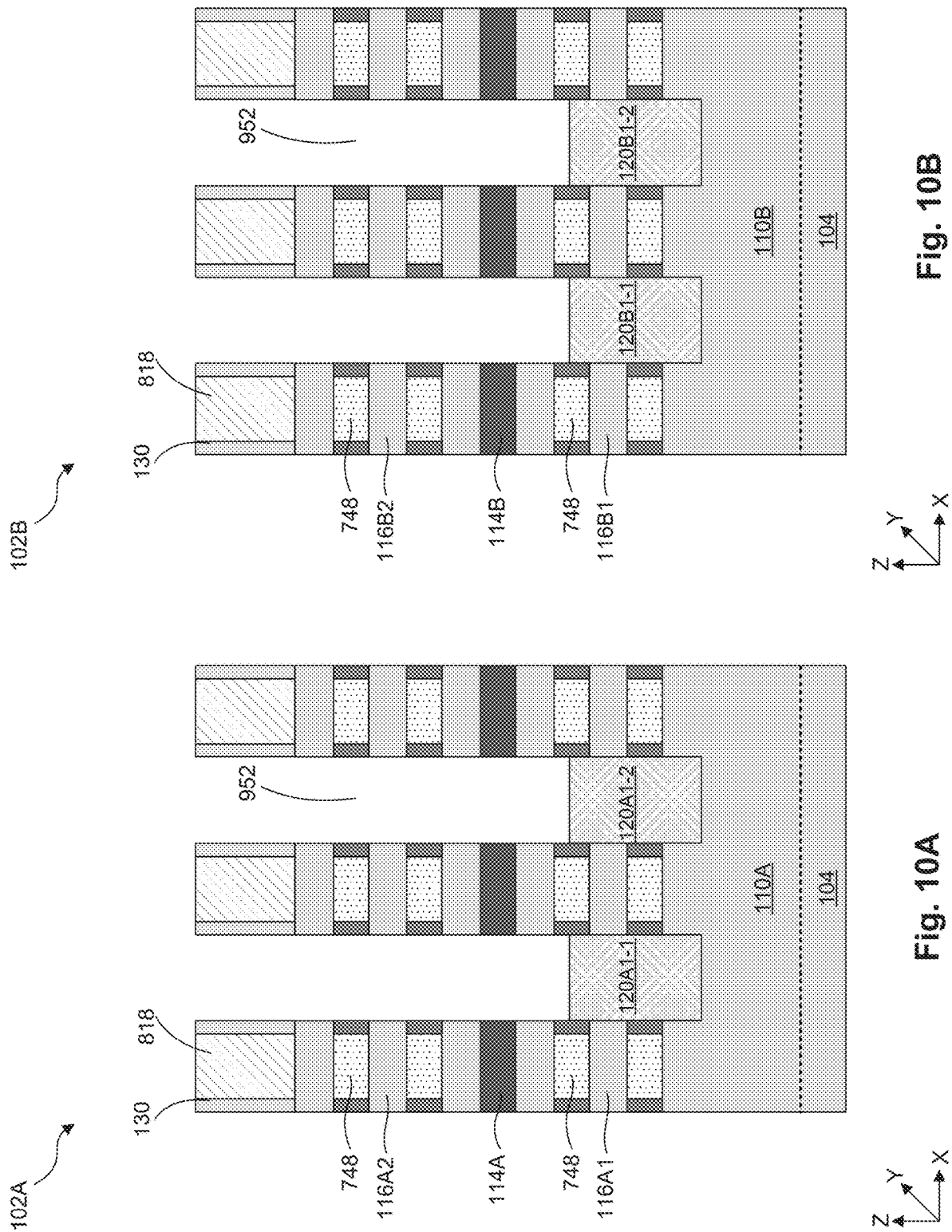

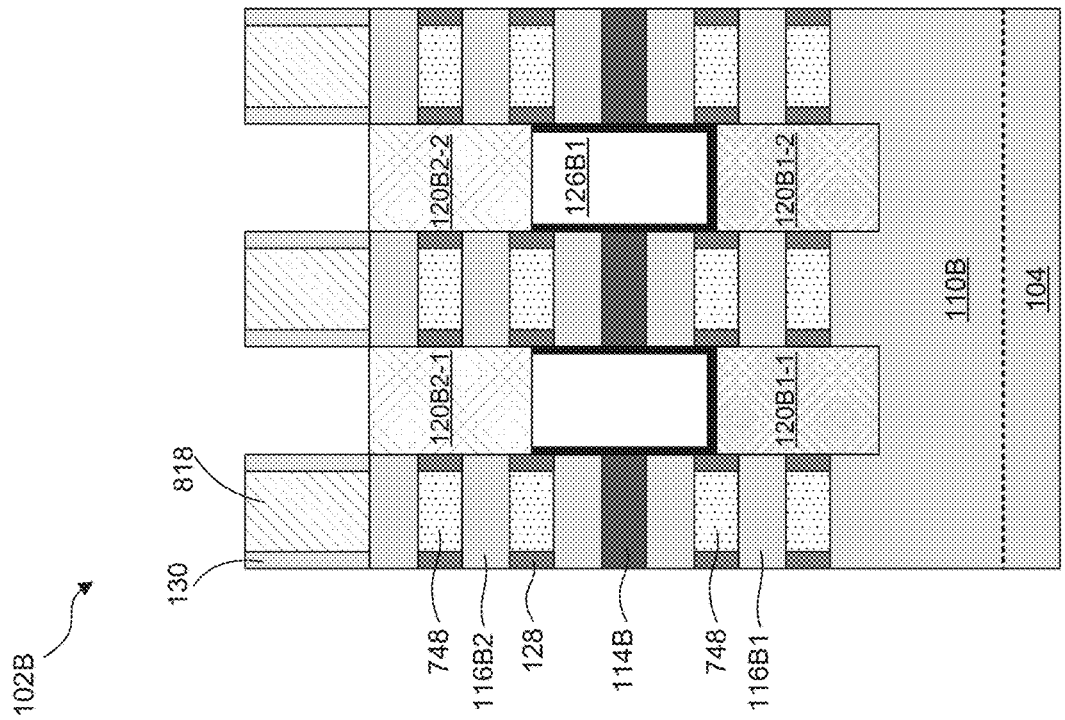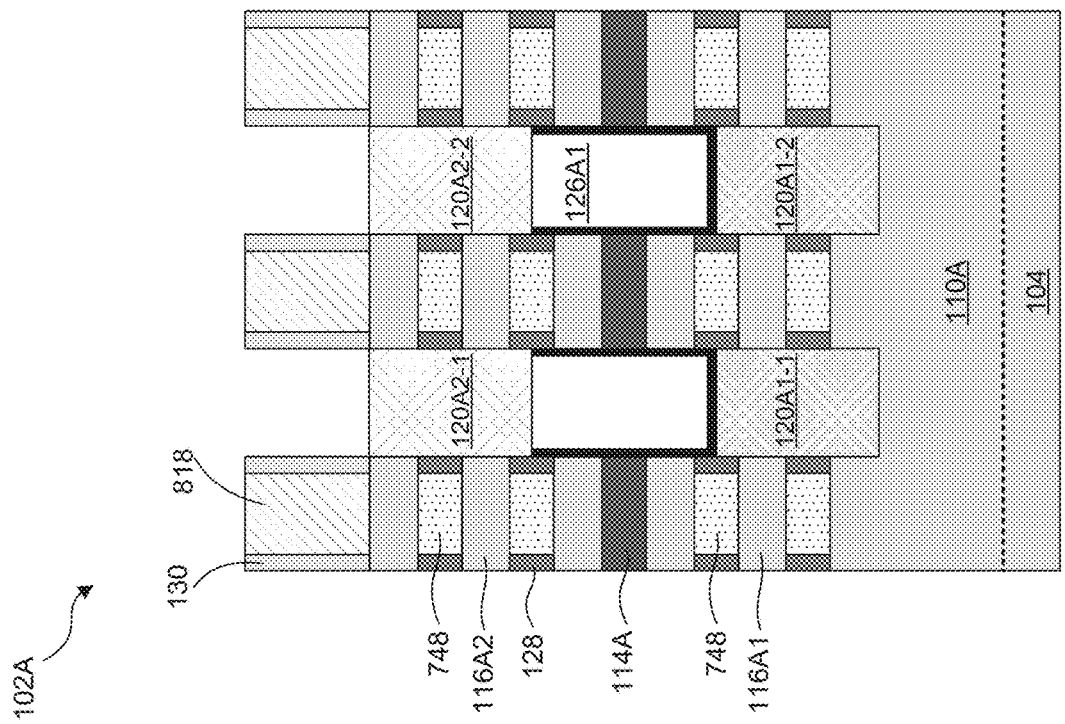
Fig. 12B
Fig. 12A

ISOLATION STRUCTURES IN SEMICONDUCTOR DEVICES

CROSS-REFERENCE TO RELATED APPLICATION

This application claims the benefit of U.S. Provisional Patent Application No. 63/322,532, titled "Semiconductor Device with Vertical Local Interconnect and Method for Forming the Same," filed on Mar. 22, 2022, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around FETs (GAA FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1A-1H illustrate isometric, cross-sectional, and top-down views of a semiconductor device with isolation structures, in accordance with some embodiments.

FIGS. 7, 8A-15B, and 16A-22F illustrate isometric and cross-sectional views of a semiconductor device with isolation structures at various stages of its fabrication process, in accordance with some embodiments.

Figure 1A:
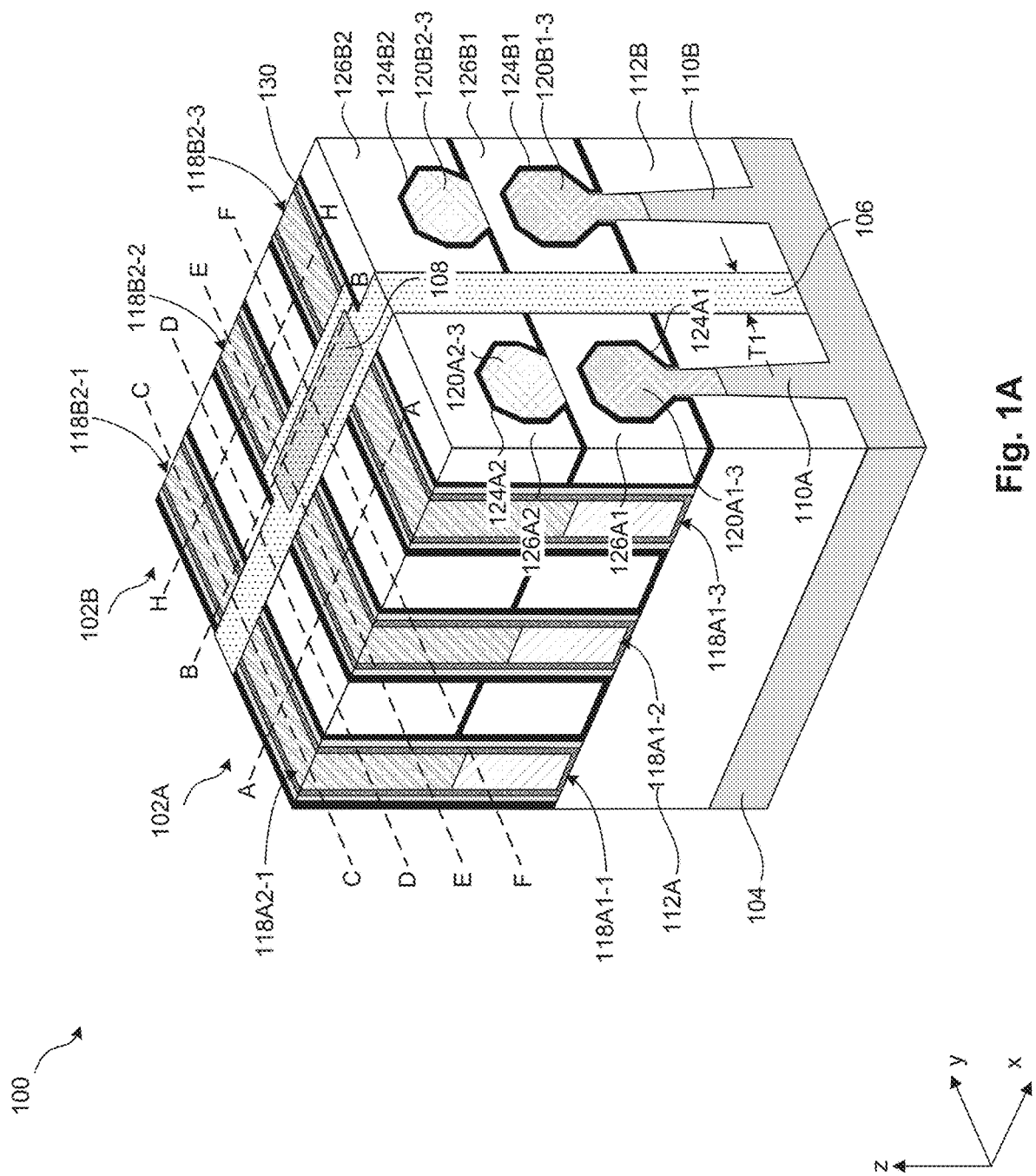

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices with stacked FETs (e.g., stacked gate-all-around (GAA) FETs) and vertical interconnect structures between adjacent stacked FETs. The present disclosure further provides example methods of forming the semiconductor devices. With the use of stacked FETs, the device density of ICs can be increased without aggressively scaling down the devices and compromising the electrical isolation between the devices in the IC. In some embodiments, each of the stacked FETs can include a stack of different conductivity type GAA FETs and/or can include a stack of the same conductivity type GAA FETs. Each of the stacked FETs can further include a channel isolation layer. The channel isolation layer can electrically isolate the channel regions of the stacked FETs from each other.

In some embodiments, the vertical interconnect structures (also referred to as "conductive bridge structures" and "through-via structures") can provide electrical connections between top and bottom GAA FETs in a stacked FET. In some embodiments, the vertical interconnect structures can provide electrical connections between top GAA FETs and an interconnect structure on a back-side of the semiconductor device. In some embodiments, the vertical interconnect structures can provide electrical connections between bottom GAA FETs and an interconnect structure on a front-side of the semiconductor device. The vertical interconnect structures can be electrically connected to S/D contact structures of the top and/or bottom GAA FETs.

The semiconductor device can further include isolation structures formed in a cut-metal-gate (CMG) process to "cut" long metal gate structures, extending over two or more of the stacked FETs, into shorter gate portions and to electrically isolate adjacent stacked FETs from each other. One or more of the isolation structures can include dielectric fill portions and dielectric liner portions. The vertical interconnect structures can be formed in the dielectric liner portions to reduce the device area occupied by the isolation structures and the vertical interconnect structures in the semiconductor device compared to the device area occupied by vertical interconnect structures formed adjacent to isolation structures. The formation of the vertical interconnect structures in the isolation structures also relaxes the dimensional constraints on the vertical interconnect structures. Larger vertical interconnect structures can be formed in the isolation structures, which reduces the resistance of the vertical interconnect structures by about 60% to about 90% compared to the resistance of vertical interconnect structures formed adjacent to isolation structures.

Furthermore, the vertical interconnect structures can be formed in the isolation structures with fewer process steps than the number of process steps involved in forming vertical interconnect structures adjacent to isolation structures. For example, the isolation trenches (also referred to as "metal cuts") formed using a photolithographic process and an etch process during the CMG process can be used to form both the isolation structures and the vertical interconnect structures. Portions of the isolation trenches can be filled with a dielectric material to form the dielectric fill portions. Other portions of the isolation trenches can be lined with the dielectric material to form the dielectric liner portions, which can be subsequently filled with a conductive material to form the vertical interconnect structures. Thus, a single photolithographic process and a single etch process can be used to form both the vertical interconnect structures and the isolation structures, instead of the multiple photolithographic processes and multiple etch processes used for forming vertical interconnect structures adjacent to isolation structures.

FIG. 1A illustrates an isometric view of a semiconductor device 100, according to some embodiments. FIGS. 1B, 1C, 1D, 1E, 1F, and 1G illustrate cross-sectional views of semiconductor device 100 along lines A-A, B—B, C-C, D-D, E-E, and F—F, respectively, of FIGS. 1A-1H, according to some embodiments. FIG. 1H illustrates a top-down view of semiconductor device 100, according to some embodiments. FIGS. 1B-1H illustrate views of semiconductor device 100 with additional structures that are not shown in FIG. 1A for simplicity. The discussion of elements with the same annotations applies to each other, unless mentioned otherwise.

Referring to FIGS. 1A-1H, semiconductor device 100 can include (i) a substrate 104, (ii) a stacked FET 102A disposed on substrate 104, (iii) a stacked FET 102B disposed on substrate 104, (iv) an isolation structure 106 disposed between stacked FETs 102A and 102B, and (v) a vertical interconnect structure 108 disposed in isolation structure 106. The discussion of stacked FETs 102A and 102B applies to each other, unless mentioned otherwise.

In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic).

In some embodiments, stacked FET 102A can include (i) a fin structure 110A disposed on substrate 104, (ii) shallow trench isolation (STI) regions 112A disposed on substrate 104 and adjacent to fin structure 110A, (iii) a GAA FET 102A1 disposed on fin structure 110A and STI regions 112A, (iv) a GAA FET 102A2 disposed on GAA FET 102A1, and (v) channel isolation layers 114A disposed between GAA FETs 102A1 and 102A2. Similarly, in some embodiments, stacked FET 102B can include (i) a fin structure 110B disposed on substrate 104, (ii) STI regions 112B disposed on substrate 104 and adjacent to fin structure 110B, (iii) a GAA FET 102B1 disposed on fin structure 110B and STI regions 112B, (iv) a GAA FET 102B2 disposed on GAA FET 102B1, and (v) channel isolation layers 114B disposed between GAA FETs 102B1 and 102B2. In some embodiments, fin structures 110A-110B can include a material similar to substrate 104 and extend along an X-axis. In some embodiments, STI regions 112A-112B can include an insulating material, such as silicon oxide, silicon nitride (SiN), silicon carbon nitride (SiCN), silicon oxycarbon nitride (SiOCN), and silicon germanium oxide.

Stacked FETs 102A and 102B can be referred to as "complementary FETs (CFETs) 102A and 102B" when GAA FETs 102A1-102B1 have a conductivity type (e.g., n-type or p-type) different from that of GAA FETs 102A2-102B2. In some embodiments, GAA FETs 102A1-102B1 can be n-type and GAA FETs 102A2-102B2 can be p-type. In some embodiments, GAA FETs 102A1-102B1 can be p-type and GAA FET 102A2-102B2 can be n-type. In some embodiments, GAA FETs 102A1-102B1 have a conductivity type different from each other and GAA FETs 102A2-102B2 have a conductivity type different from each other. In some embodiments, GAA FETs 102A1-102A2 can have the same conductivity type and GAA FETs 102B1-102B2 can have the same conductivity type.

Figure 1B:
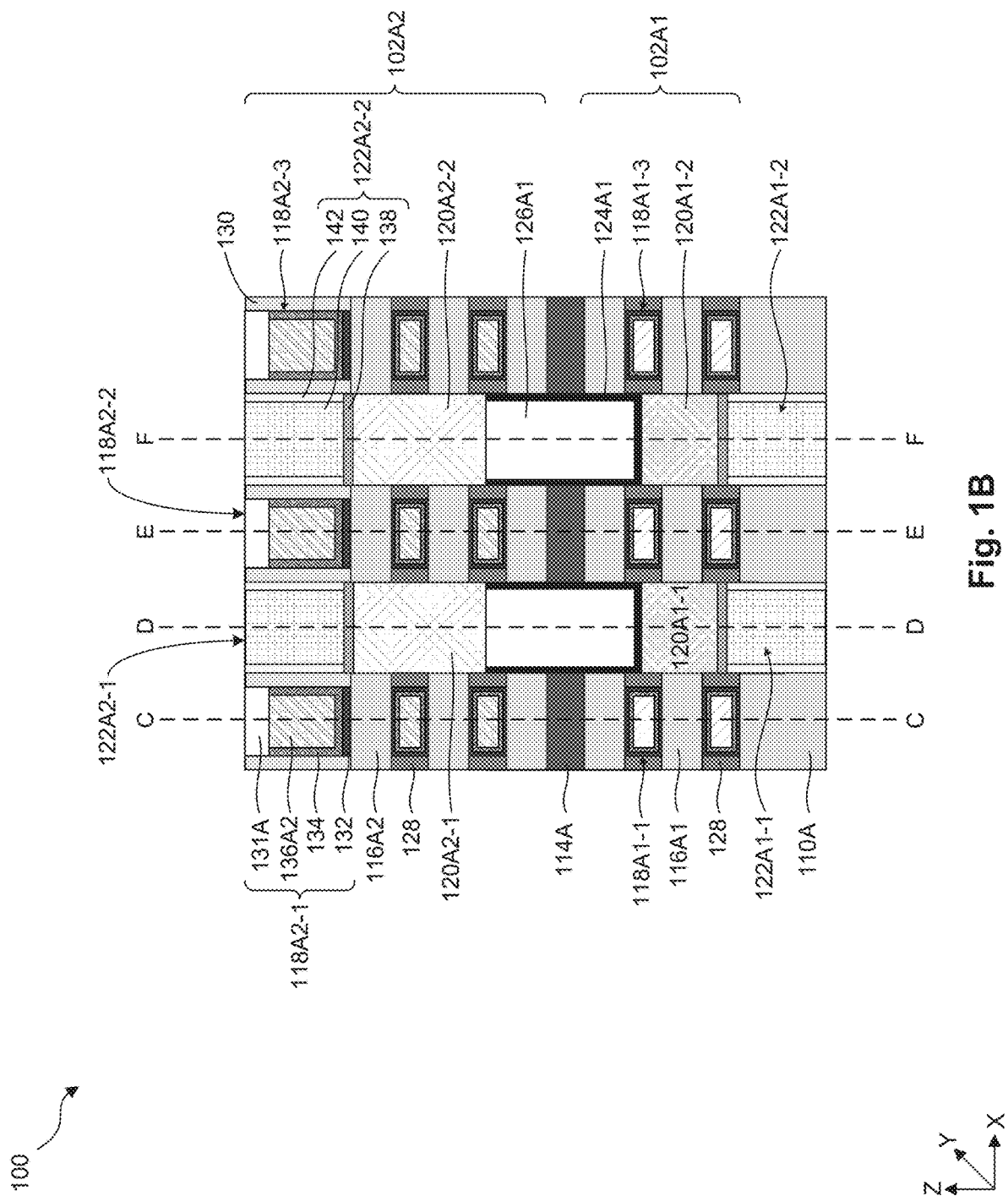
Figure 1C:
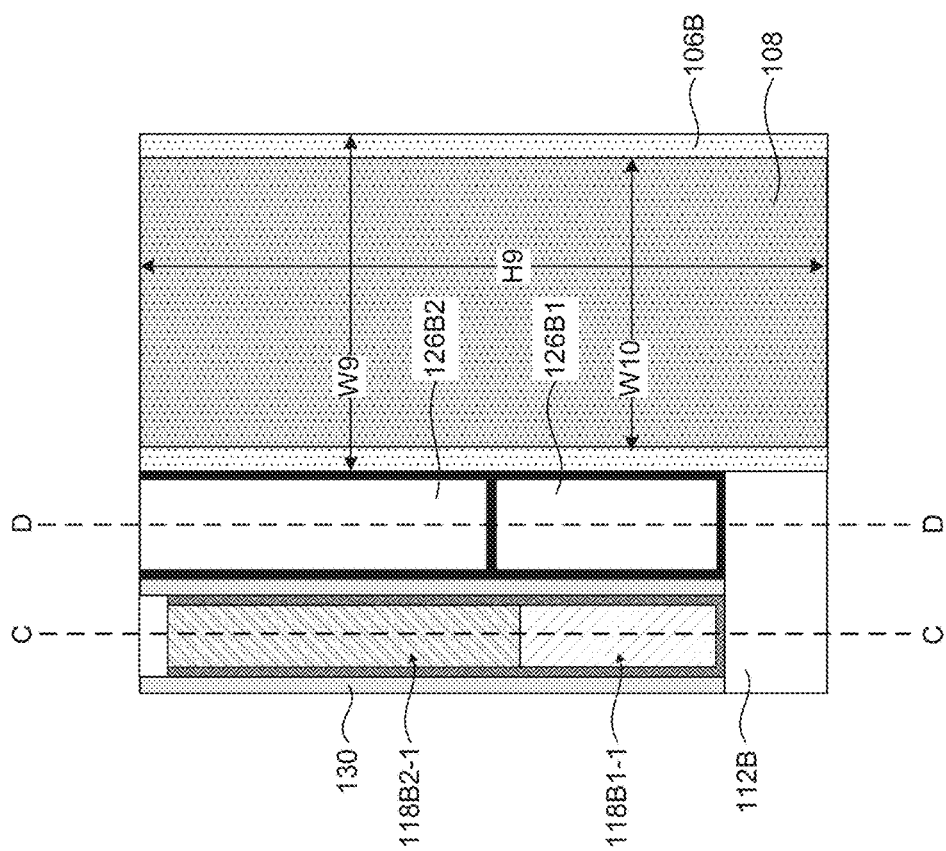
Figure 1D:
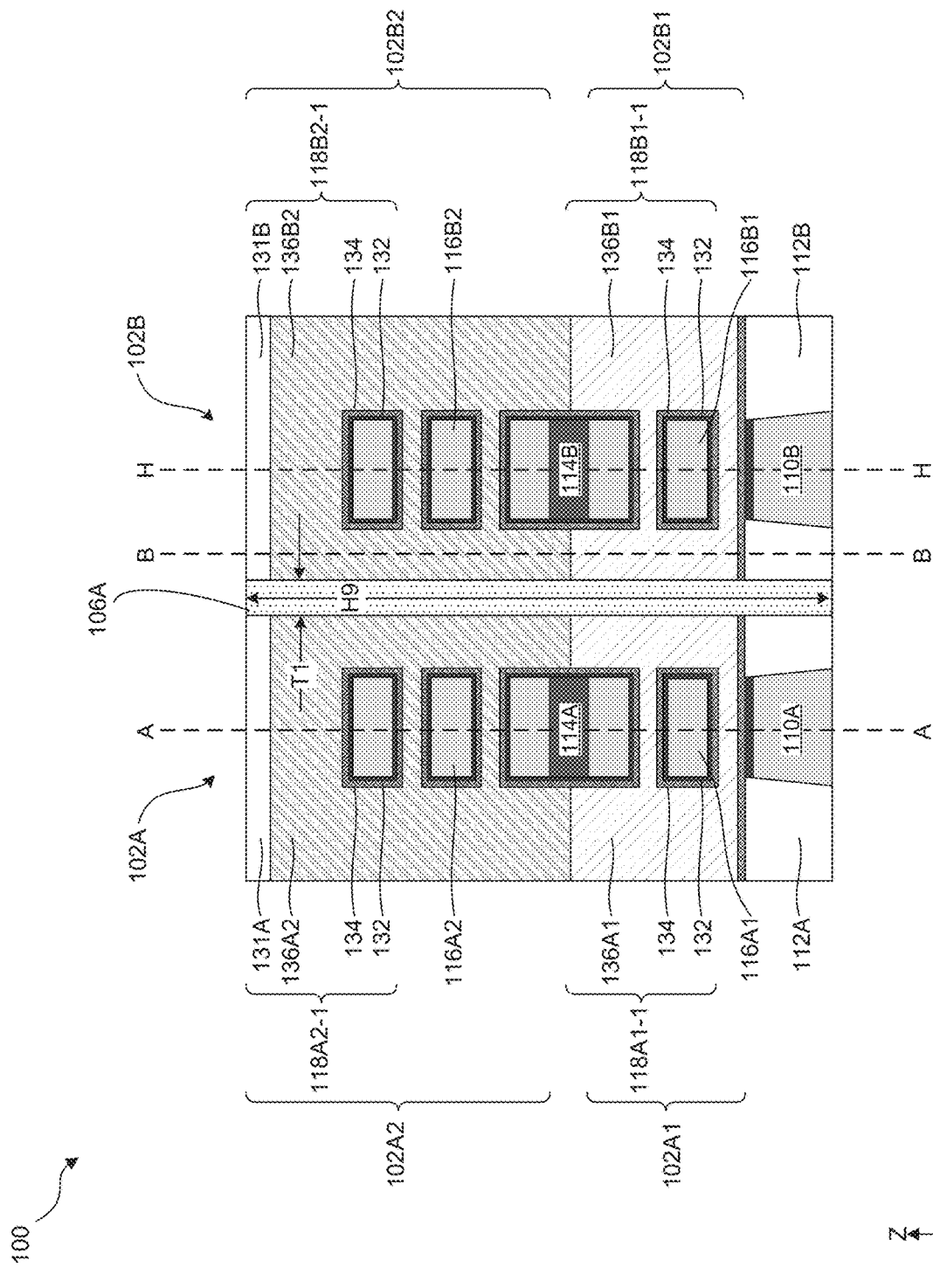
Figure 1F:
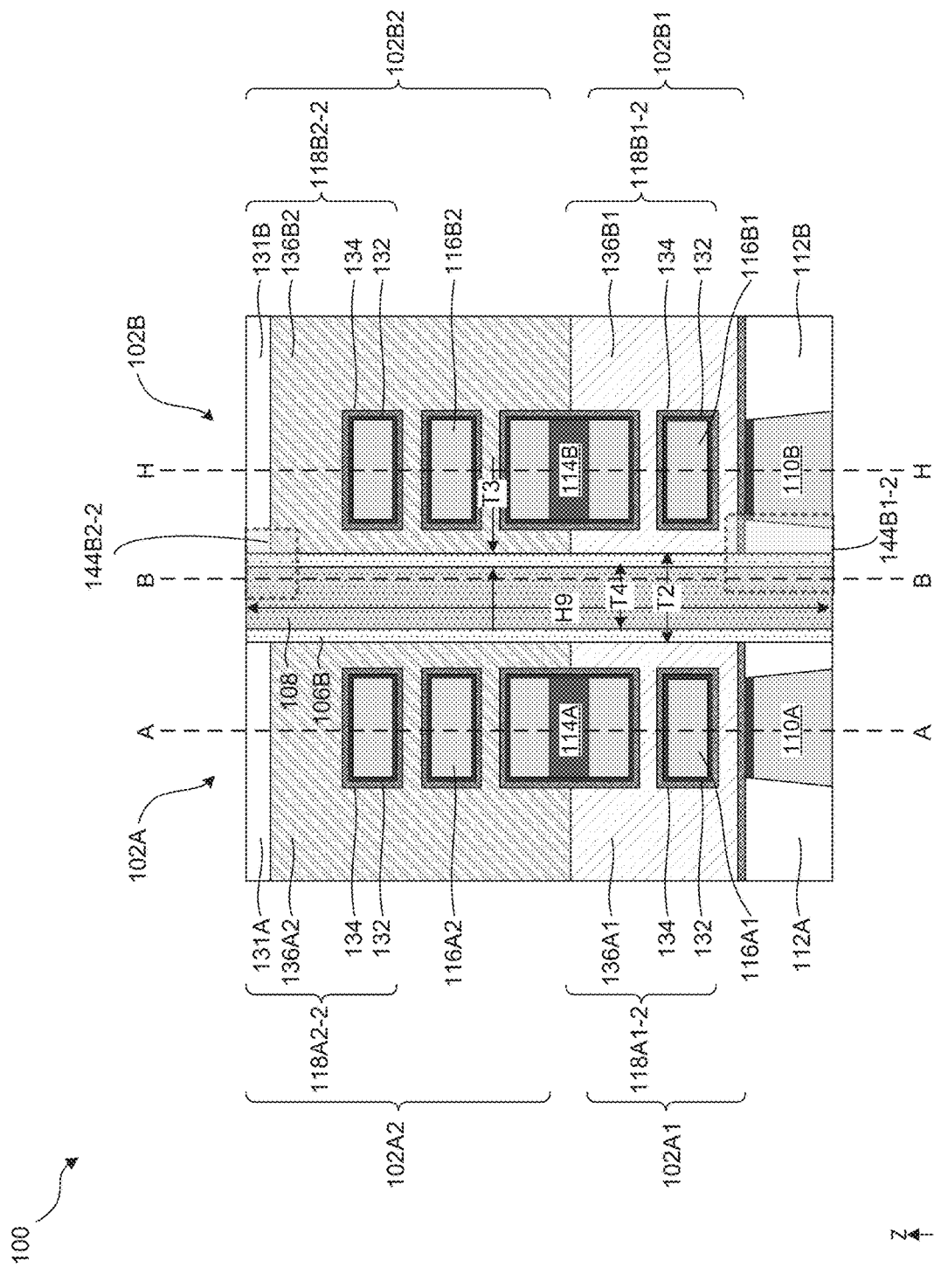
Figure 1G:
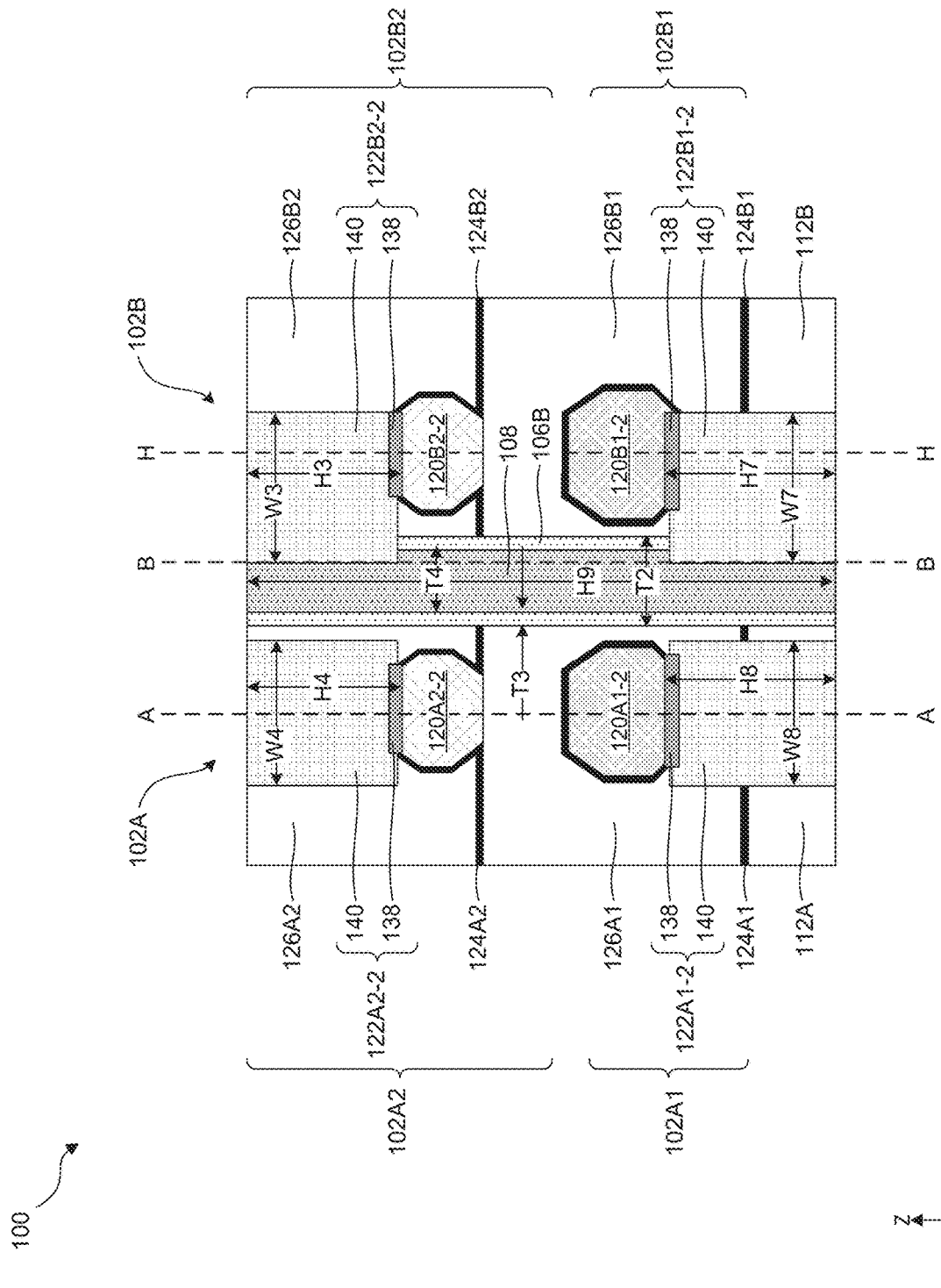
Figure 1H:
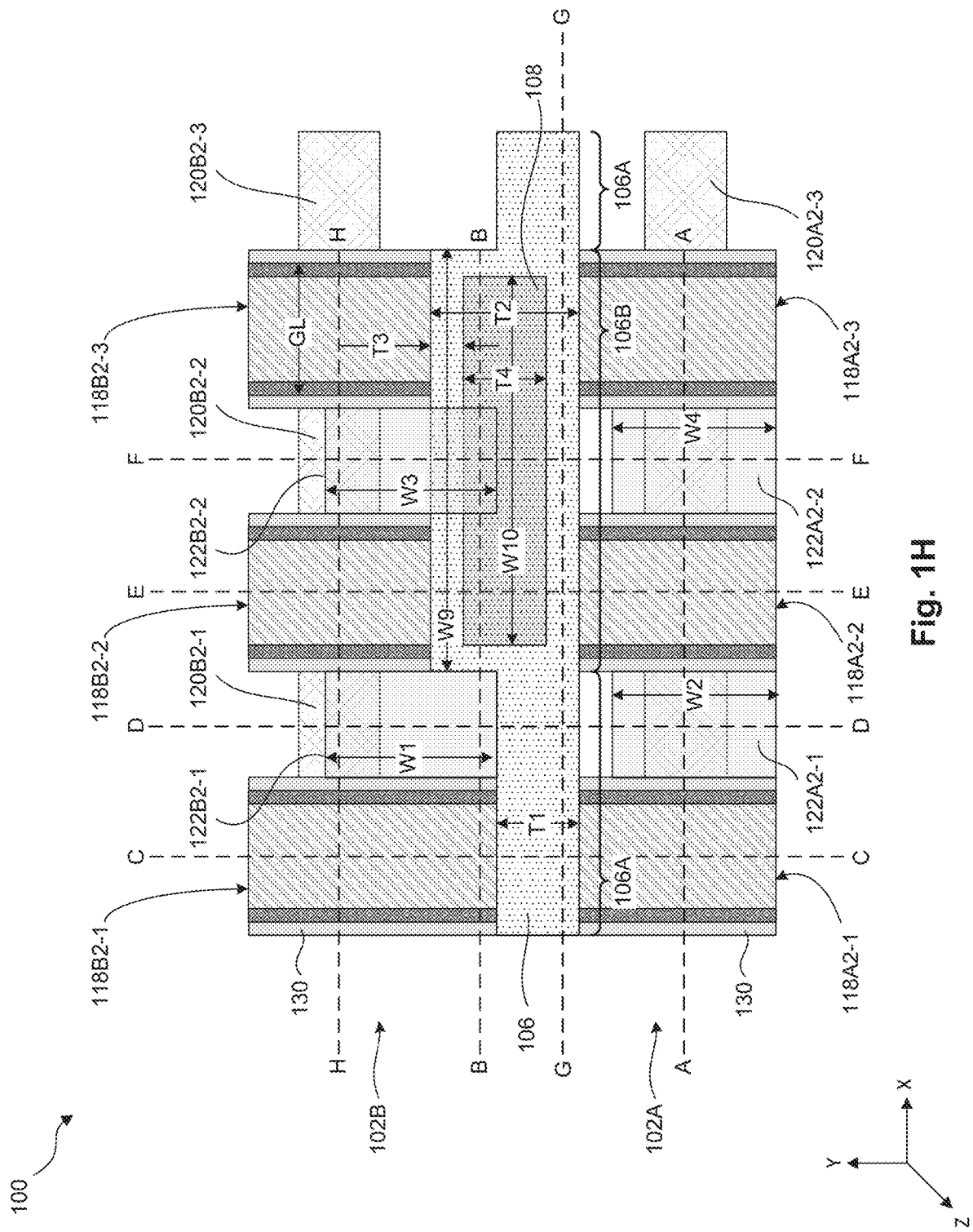

Referring to FIGS. 1A-1H, in some embodiments, GAA FET 102A1 can include (i) stacks of nanostructured layers 116A1 disposed on fin structure 110A, (ii) gate structures 118A1-1, 118A1-2, and 118A1-3 surrounding nanostructured layers 116A1, (iii) S/D regions 120A1-1, 120A1-2, and 120A1-3 disposed adjacent to nanostructured layers 116A1, (iv) S/D contact structures 122A1-1 and 122A1-2 disposed on back-side of S/D regions 120A1-1 and 120A1-2, respectively, (v) etch stop layers (ESLs) 124A1 disposed on S/D regions 120A1-1, 120A1-2, and 120A1-3, (vi) interlayer dielectric (ILD) layers 126A1 disposed on ESLs 124A1, and (vii) inner spacers 128 disposed adjacent to gate structures 118A1-1, 118A1-2, and 118A1-3. Nanostructured layers 116A1 that are adjacent to and in direct contact with S/D regions 120A1-1, 120A1-2, and 120A1-3 function as channel regions. Nanostructured layers 116A1 that are disposed directly on bottom surfaces of channel isolation layers 114A, as shown in FIGS. 1B and 1D, do not function as channel regions. Though a single row of channel regions is shown in FIG. 1B, GAA FET 102A1 can have one or more rows channel regions.

In some embodiments, GAA FET 102A2 can include (i) stacks of nanostructured layers 116A2 disposed on channel isolation layers 114A, (ii) gate structures 118A2-1, 118A2-2, and 118A2-3 surrounding nanostructured layers 116A2, (iii) S/D regions 120A2-1, 120A2-2, and 120A2-3 disposed adjacent to nanostructured layers 116A2 and on ILD layers 126A1, (iv) S/D contact structures 122A2-1 and 122A2-2 disposed on front-side of S/D regions 120A2-1 and 120A2-2, respectively, (v) ESLs 124A2 disposed on S/D regions 120A2-1, 120A2-2, and 120A2-3, (vi) ILD layers 126A2 disposed on ESLs 124A2, (vii) inner spacers 128A2 disposed adjacent to gate structures 118A2-1, 118A2-2, and 118A2-3, (viii) gate spacers 130 disposed adjacent to gate structures 118A2-1, 118A2-2, and 118A2-3, and (ix) gate capping layers 131A disposed on gate structures 118A2-1, 118A2-2, and 118A2-3. Nanostructured layers 116A2 that are adjacent to and in direct contact with S/D regions 120A2-1, 120A2-2, and 120A2-3 function as channel regions. Nanostructured layers 116A2 that are disposed directly on top surfaces of channel isolation layers 114A, as shown in FIGS. 1B and 1D, do not function as channel regions. Though two rows of channel regions are shown in FIG. 1B, GAA FET 102A2 can have one or more rows of channel regions.

In some embodiments, GAA FET 102B1 can include (i) stacks of nanostructured layers 116B1 disposed on fin structure 110B, (ii) gate structures 118B1-1, 118B1-2, and 118B1-3 surrounding nanostructured layers 116B1, (iii) S/D regions 120B1-1, 120B1-2, and 120B1-3 disposed adjacent to nanostructured layers 116B1, (iv) S/D contact structures 122B1-1 and 122B1-2 disposed on back-side of S/D regions 120B1-1 and 120B1-2, respectively, (v) etch stop layers (ESLs) 124B1 disposed on S/D regions 120B1-1, 120B1-2, and 120B1-3, (vi) interlayer dielectric (ILD) layers 126B1 disposed on ESLs 124B1, and (vii) inner spacers 128 disposed adjacent to gate structures 118B1-1, 118B1-2, and 118B1-3. Nanostructured layers 116B1 that are adjacent to and in direct contact with S/D regions 120B1-1, 120B1-2, and 120B1-3 function as channel regions. Nanostructured layers 116B1 that are disposed directly on bottom surfaces of channel isolation layers 114B, as shown in FIG. 1D, do not function as channel regions. GAA FET 102B1 can have one or more rows of channel regions.

In some embodiments, GAA FET 102B2 can include (i) stacks of nanostructured layers 116B2 disposed on channel isolation layers 114B, (ii) gate structures 118B2-1, 118B2-2, and 118B2-3 surrounding nanostructured layers 116B2, (iii) S/D regions 120B2-1, 120B2-2, and 120B2-3 disposed adjacent to nanostructured layers 116B2 and on ILD layers 126B1, (iv) S/D contact structures 122B2-1 and 122B2-2 disposed on front-side of S/D regions 120B2-1 and 120B2-2, respectively, (v) ESLs 124B2 disposed on S/D regions 120B2-1, 120B2-2, and 120B2-3, (vi) ILD layers 126B2 disposed on ESLs 124B2, (vii) inner spacers 128B2 disposed adjacent to gate structures 118B2-1, 118B2-2, and 118B2-3, (viii) gate spacers 130 disposed adjacent to gate structures 118B2-1, 118B2-2, and 118B2-3, and (ix) gate capping layers 131B disposed on gate structures 118B2-1, 118B2-2, and 118B2-3. Nanostructured layers 116B2 that are adjacent to and in direct contact with S/D regions 120B2-1, 120B2-2, and 120B2-3 function as channel regions. Nanostructured layers 116B2 that are disposed directly on top surfaces of channel isolation layers 114B, as shown in FIG. 1D, do not function as channel regions. GAA FET 102B2 can have one or more rows of channel regions.

In some embodiments, the gate structures of stacked FET 102A and 102B can have substantially equal gate lengths along an X-axis. Gate structures 118A1-1, 118A1-2, 118A1-3, 118B1-1, 118B1-2, and 118B1-3 can be referred to as "bottom gate structures" and gate structures 118A2-1, 118A2-2, 118A2-3, 118B2-1, 118B2-2, and 118B2-3 can be referred to as "top gate structures."

The discussion of the elements of GAA FET 102A1 applies to the corresponding elements of GAA FET 102B1 and the discussion of the elements of GAA FET 102A2 applies to the corresponding elements of GAA FET 102B2, unless mentioned otherwise. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured layers 116A1, 116A2, 116B1, and/or 116B2 can have be in the form of nanosheets, nanowires, nanorods, nanotubes, or other suitable nanostructured shapes.

In some embodiments, ESLs 124A1-124A2, ILD layers 126A1-126A2, inner spacers 128A1-128A2, and gate spacers 130 can include an insulating material, such as silicon oxide, silicon nitride (SiN), silicon carbon nitride (SiCN), silicon oxycarbon nitride (SiOCN), and silicon germanium oxide.

Channel isolation layers 114A can electrically isolate channel regions of GAA FET 102A1 from the overlying channel regions of GAA FET 102A2. In some embodiments, channel isolation layers can include a dielectric material with a dielectric constant ranging from about 3 to about 25. In some embodiments, the dielectric material can include SiO2, SiN, silicon oxynitride (SiOxNy), silicon oxycarbon nitride (SiOxCyNz), HfO2, ZrO2, or a combination thereof. In some embodiments, the dielectric material can include a material with a dielectric constant lower than the dielectric constant of SiO2 (about 3.9), such as hydrogenated carbon-doped silicon oxide (SiCOH) (dielectric constant ranging from about 2.7 to about 3.3), fluorosilicate glass (FSG) (dielectric constant of about 3.5 to about 3.9), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, and combinations thereof. In some embodiments, thickness of channel isolation layers 114A can range from about 10 nm to about 30 nm for adequate electrical isolation between channel regions of GAA FETs 102A1 and 102A2 without compromising device size and manufacturing cost. In some embodiments, channel isolation layers 114A can have side surfaces with linear side profiles (shown in FIGS. 1B, 1D, and 1F), faceted side profiles (not shown), or tapered side profiles (not shown).

In some embodiments, nanostructured layers 116A1 and 116A2 can include semiconductor materials similar to or different from substrate 104. In some embodiments, nanostructured layers 116A1 and 116A2 can include Si, SiAs, silicon phosphide (SiP), SiC, SiCP, SiGe, Silicon Germanium Boron (SiGeB), Germanium Boron (GeB), Silicon-Germanium-Tin-Boron (SiGeSnB), a III-V semiconductor compound, or other suitable semiconductor materials.

Though rectangular cross-sections of nanostructured layers 116A1 and 116A2 are shown, nanostructured layers 116A1 and 116A2 can have cross-sections of other geometric shapes (e.g., circular, elliptical, triangular, or polygonal).

The discussion of gate structure 118A1-1 applies to gate structures 118A1-2 and 118A1-3, and the discussion of gate structure 118A2-1 applies to gate structures 118A2-2 and 118A2-3, unless mentioned otherwise. In some embodiments, gate structures 118A1-1 and 118A2-1 can include (i) interfacial oxide (IL) layers 132 disposed on nanostructured layers 116A1 and 116A2, and (ii) high-k (HK) gate dielectric layers 134 disposed on IL layers 132. In some embodiments, IL layers 132 can include silicon oxide ($SiO_2$), silicon germanium oxide ($SiGeO_x$), or germanium oxide ($GeO_x$). In some embodiments, HK gate dielectric layers 134 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$).

In some embodiments, gate structures 118A1-1 and 118A2-1 can further include conductive layers 136A1 and 136A2, respectively. Conductive layers 136A1-136A2 can be multi-layered structures. The different layers of conductive layers 136A1-136A2 are not shown for simplicity. Each of conductive layers 136A1-136A2 can include a WFM layer disposed on HK dielectric layer 134 and a gate metal fill layer on the WFM layer. In some embodiments, the WFM layers can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for n-type GAA FET 102A1 or 102A2. In some embodiments, the WFM layers can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for p-type GAA FET 102A1 or 102A2. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

In some embodiments, gate structures 118A1-1 and 118A2-1 can be electrically isolated from adjacent S/D regions 120A1-1 and 120A2-1 by inner spacers 128. In some embodiments, gate structure 118A2-1 can be electrically isolated from adjacent S/D contact structure 122A2-1 by gate spacer 130.

In some embodiments, S/D regions 120A1-1, 120A1-2, and 120A1-3 can include an epitaxially-grown semiconductor material, such as Si and SiGe, and p-type dopants, such as boron and other suitable p-type dopants. In some embodiments, S/D regions 120A2-1, 120A2-2, and 120A2-3 can include an epitaxially-grown semiconductor material, such as Si, and n-type dopants, such as phosphorus and other suitable n-type dopants. S/D regions 120A1-1, 120A1-2, 120A1-3, 120B1-1, 120B1-2, and 120B1-3 can be referred to as "bottom S/D regions" and S/D regions 120A2-1, 120A2-2, 120A2-3, 120B2-1, 120B2-2, and 120B2-3 can be referred to as "top S/D regions."

Referring to FIGS. 1B, 1E, and 1G-1H, S/D contact structures 122A1-1, 122A1-2, 122B1-1, and 122B1-2 can be referred to as "back-side S/D contact structures" and S/D contact structures 122A2-1, 122A2-2, 122B2-1, and 122B2-2 can be referred to as "front-side S/D contact structures." In some embodiments, each of front- and back-side S/D contact structures can include silicide layers 138, contact plugs 140 disposed on silicide layers 138, and nitride barrier layers 142 along sidewalls of contact plugs 140. In some embodiments, silicide layers 138 can include titanium silicide ($Ti_xSi_y$), tantalum silicide ($Ta_xSi$), molybdenum silicide ($Mo_xSi_y$), nickel silicide ($Ni_xSi_y$), cobalt silicide ($Co_xSi_y$), tungsten silicide ($W_xSi_y$), or a combination thereof. In some embodiments, contact plugs 140 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

In some embodiments, the front-side S/D contact structures can be electrically connected to power supplies and/or other active devices through front-side interconnect structure (not shown) formed on GAA FETs 102A2 and 102B2. In some embodiments, the back-side S/D contact structures can be electrically connected to power supplies and/or other active devices through back-side interconnect structure (not shown) formed on the back-side S/D contact structures. In some embodiments, S/D contact structures 122B1-2 and 122B2-2 can be electrically connected to each other through vertical interconnect structure 108, as shown in FIG. 1G. In some embodiments, instead of both S/D contact structures 122B1-2 and 122B2-2 being connected to vertical interconnect structure 108, S/D contact structure 122B1-2 can be electrically connected to the front-side interconnect structure through vertical interconnect structure 108 or S/D contact structure 122B2-2 can be electrically connected to the back-side interconnect structure through vertical interconnect structure 108. In some embodiments, instead of S/D contact structures 122B1-2 and 122B2-2, gate contact structures 144B1-2 and/or 144B2-2 can be electrically connected to vertical interconnect structure 108, as shown in FIG. 1F. Thus, vertical interconnect structure 108 can provide flexible routing for S/D regions and gate structures in stacked FETs, such as stacked FETs 102A-102B.

Referring to FIGS. 1E and 1G, the front-side S/D contact structures can have heights H1-H4 of about 15 nm to about 35 nm and the back-side S/D contact structures can have heights H5-H8 of about 25 nm to about 35. Within these ranges of heights H1-H8, the front- and back-side S/D contact structures can form adequate contact areas with corresponding top and bottom S/D regions without compromising the structure of the top and bottom S/D regions and the device manufacturing cost. In some embodiments, heights H1-H4 of the front-side S/D contact structures can be substantially equal to or different from each other and heights H5-H8 of the back-side S/D contact structures can be substantially equal to or different from each other.

In some embodiments, the front-side S/D contact structures can have widths W1-W4 of about 5 nm to about 35 nm and the back-side S/D contact structures can have widths W5-W8 of about 25 nm to about 65 nm. Within these ranges of widths W1-W8, the front- and back-side S/D contact structures can form adequate contact areas with corresponding top and bottom S/D regions and can provide adequate landing areas for via structures (not shown) formed on the front- and back-side S/D contact structures. Furthermore, within these ranges of widths W1-W8, (i) S/D contact structures 122B1-2 and 122B2-2 can form adequate contact areas with vertical interconnect structure 108, and (ii) S/D contact structures 122A1-1, 122A1-2, 122A2-1, 122A2-2, 122B1-1, and 122B2-1 can form adequate contact areas with corresponding top and bottom S/D regions without overlapping with vertical interconnect structure 108 and isolation structure 106. In some embodiments, widths W1-W4 of the front-side S/D contact structures can be formed substantially equal to each other and widths W5-W8 of the back-side S/D contact structures can be formed substantially equal to each other for the ease of fabrication. In some embodiments, widths W5-W8 of the back-side S/D contact structures can be formed greater than widths W1-W4 of the front-side S/D contact structures as fabrication of the back-side S/D contact structures are less constrained than that of the front-side S/D contact structures due to fewer elements formed on the back-side of semiconductor device 100 compared to its front-side.

Referring to FIGS. 1A and 1C-1H, in some embodiments, isolation structure 106 can electrically isolate stacked FETs 102A and 102B from each other. FIG. 1H does not show ESLs 124A2-124B2 and ILD layers 126A2-126B2 for simplicity. Isolation structure 106 can be formed in a CMG process (described in further detail below) to cut long gate structures (e.g., along a Y-axis) formed across fin structures 110A and 110B into shorter gate structures of stacked FETs 102A and 102B. In some embodiments, isolation structure 106 can include dielectric fill portions 106A and a dielectric liner portion 106B. In some embodiments, dielectric fill portions 106A and dielectric liner portion 106B can include a nitride material, such as silicon nitride.

In some embodiments, dielectric liner portion 106B can have a thickness T2 greater than thickness T1 of dielectric fill portions 106A because of vertical interconnect structure 108 disposed in dielectric liner portion 106B. Dielectric liner portion 106B can surround vertical interconnect structure 108, as shown in FIG. 1H. The inner sidewalls of dielectric liner portion 106B can be in physical contact with the sidewalls of vertical interconnect structure 108, except for the sidewall portions of vertical interconnect structure 108 in physical contact with S/D contact structures 122B1-2 and/or 122B2-2 or gate structures 144B1-2 and/or 144B2-2. In some embodiments, vertical interconnect structure 108 can include a conductive material, such as Co, W, Ru, Ir, Ni, Os, Rh, Al, Mo, Cu, Ag, Au, and a combination thereof.

Vertical interconnect structure 108 can be formed in isolation structure 106 to reduce the device area occupied by isolation structure 106 and the vertical interconnect structure 108 compared to the device area occupied by vertical interconnect structures formed adjacent to isolation structures. The formation of vertical interconnect structure 108 in isolation structure 106 also relaxes the dimensional constraints on vertical interconnect structure 108. Vertical interconnect structure 108 with greater thickness along a Y-axis can be formed in isolation structure 106 compared to vertical interconnect structures formed adjacent to isolation structures. As a result of larger vertical interconnect structure 108, the resistance of vertical interconnect structure 108 can be reduced by about 60% to about 90% compared to the resistance of vertical interconnect structures formed adjacent to isolation structures.

Furthermore, vertical interconnect structure 108 can be formed in isolation structure 106 with fewer process steps than the number of process steps involved in forming vertical interconnect structures adjacent to isolation structures. For example, isolation trenches 1806 (shown in FIGS. 18B-18F) formed using a photolithographic process and an etch process during the CMG process can be used to form both isolation structure 106 and vertical interconnect structure 108, as described below with reference to FIGS. 18A-20F. A portion of the isolation trench 1806 can be lined with a dielectric material to form dielectric liner portion 106B, which can be subsequently filled with a conductive material to form vertical interconnect structure 108 and other portions of isolation trench 1806 can be filled with the dielectric material to form dielectric fill portions 106A. Thus, a single photolithographic process and a single etch process can be used to form both vertical interconnect structure 108 and isolation structure 106, instead of the multiple photolithographic processes and multiple etch processes used for forming vertical interconnect structures adjacent to isolation structures.

In some embodiments, sidewalls of dielectric fill portions 106A and dielectric liner portion 106B along an X-axis and facing stacked FET 102A can be substantially coplanar with each other. In some embodiments, sidewalls of dielectric fill portions 106A and dielectric liner portion 106B along an X-axis and facing stacked FET 102B can be non-coplanar. In some embodiments, a portion of dielectric liner portion 106B and a portion of vertical interconnect structure 108 facing stacked FET 102B can be protruded from sidewalls of dielectric fill portions 106A facing stacked FET 102B. The protruding portions of dielectric liner portion 106B and vertical interconnect structure 108 can be in physical contact with S/D contact structures 122B1-2 and 122B2-2. Due to these protruding portions, S/D contact structures 122B1-2 and 122B2-2 can be electrically connected to vertical interconnect structure 108 with widths substantially equal to widths of other S/D contact structures of stacked FET 102B that are not electrically connected to vertical interconnect structure 108. The formation of the front-side S/D contact structures with substantially equal widths W1-W4 and of the back-side S/D contact structures with substantially equal widths W5-W8 reduces the complexity of fabrication, thus increasing manufacturing yield and decreasing manufacturing cost.

Referring to FIGS. 1C-1H, in some embodiments, isolation structure 106 can have a height H9 of about 110 nm to about 170 nm to provide adequate electrical isolation between stacked FETs 102A and 102B. As vertical interconnect structure 108 is disposed in isolation structure 106, and top and bottom surfaces of vertical interconnect structure 108 are substantially coplanar with those of isolation structure 106, vertical interconnect structure 108 can have height H9 to provide adequate electrical connection between S/D contact structures 122B1-2 and 122B2-2. In some embodiments, dielectric fill portions 106A can have a thickness T1 of about 10 nm to about 20 nm to provide adequate electrical isolation between stacked FETs 102A and 102B.

In some embodiments, dielectric liner portion 106B can have a thickness T2 of about 30 nm to about 40 nm and a width W9 of about 50 nm to about 220 nm or of about 1.5 contacted poly pitch (CPP) to about 4.5 CPP. In some embodiments, 1 CPP can be about 45 nm to about 48 nm and 4.5 CPP can be greater than about 200 nm. Within these ranges of thickness T2 and width W9, dielectric liner portion 106B provide adequate electrical isolation between stacked FETs 102A and 102B without overlapping with their S/D regions and provide adequate space to enclose vertical interconnect structure 108. The CPP (also referred to as "gate pitch") is defined as a sum of a distance along an X-axis between adjacent gate structures of substantially equal gate lengths (e.g., gate structures 118B2-2 and 118B2-3) and a gate length (e.g., GL shown in FIG. 1H) of one of the adjacent gate structures. The CPP is also defined as a distance along an X-axis between the symmetry lines along a Y-axis of adjacent gate structures of substantially equal gate lengths.

In some embodiments, dielectric liner portion 106B can have a thickness T3 of 5 nm to about 10 nm surrounding vertical interconnect structure 108 to provide adequate electrical isolation between vertical interconnect structure 108 and gate structures 118A1-2, 118A1-3, 118A2-2, 118A2-3, 118B1-2, 118B1-3, 118B2-2, and 118B2-3. Furthermore, in some embodiments, sidewalls of dielectric liner portion 106B along a Y-axis can be aligned with sidewalls of gate spacers 130 along a Y-axis to prevent misalignment of vertical interconnect structure 108 with S/D contact structures 122B1-2 and 122B2-2. In some embodiments, standard cell boundary G-G can be aligned between sidewalls of isolation structure 106 and vertical interconnect structure 108 along an X-axis and facing stacked FET 102A.

In some embodiments, vertical interconnect structure 108 can have a thickness T4 of about 15 nm to about 25 nm to have an aspect ratio (e.g., H9:T4) of about 5 to about 10 without compromising device size and manufacturing cost. Within these aspect ratio ranges, fabrication defects (e.g., voids) in vertical interconnect structure 108 can be prevented or minimized, thus improving the electrical conductivity of vertical interconnect structure 108. Furthermore, vertical interconnect structure 108 can have a width W10 of about 45 nm to about 200 nm or about 1 CPP (e.g., about 45 nm to about 48 nm) to about 4 CPP (e.g., greater than about 180 nm) to improve its electrical conductivity and to prevent misalignment with S/D contact structures 122B1-2 and 122B2-2. These ranges of width W10 can also provide adequate contact area between vertical interconnect structure 108 and S/D contact structures 122B1-2 and 122B2-2. In some embodiments, width W10 can be about 1 CPP to about 1.5 CPP when vertical interconnect structure 108 are electrically connected to one front- and/or one back-side S/D contact structure, such as S/D contact structures 122B1-2 and 122B2-2.

FIGS. 2-5 illustrate different top-down views of semiconductor device 100 with different configurations of isolation structures and vertical interconnect structures, according to some embodiments. FIGS. 2-5 illustrate views of semiconductor device 100 with additional structures that are not shown in FIGS. 1A-1H for simplicity. Elements in FIGS. 2-5 with the same annotations as elements in FIGS. 1A-1H are described above.

Referring to FIGS. 2-5, stacked FETs 102A and 102B can include gate structures 118A2-4, 118A2-5, 118B2-4, and 118B2-5, S/D regions 120A2-3 and 120B2-3, and S/D contact structures 122A2-3, 122B2-3, and 122B2-4 that are not shown in FIGS. 1A-1H for simplicity. The discussion of gate structures, S/D regions, and S/D contact structures of FIGS. 1A-1H applies to those of FIGS. 2-5, unless mentioned otherwise.

Figure 2:
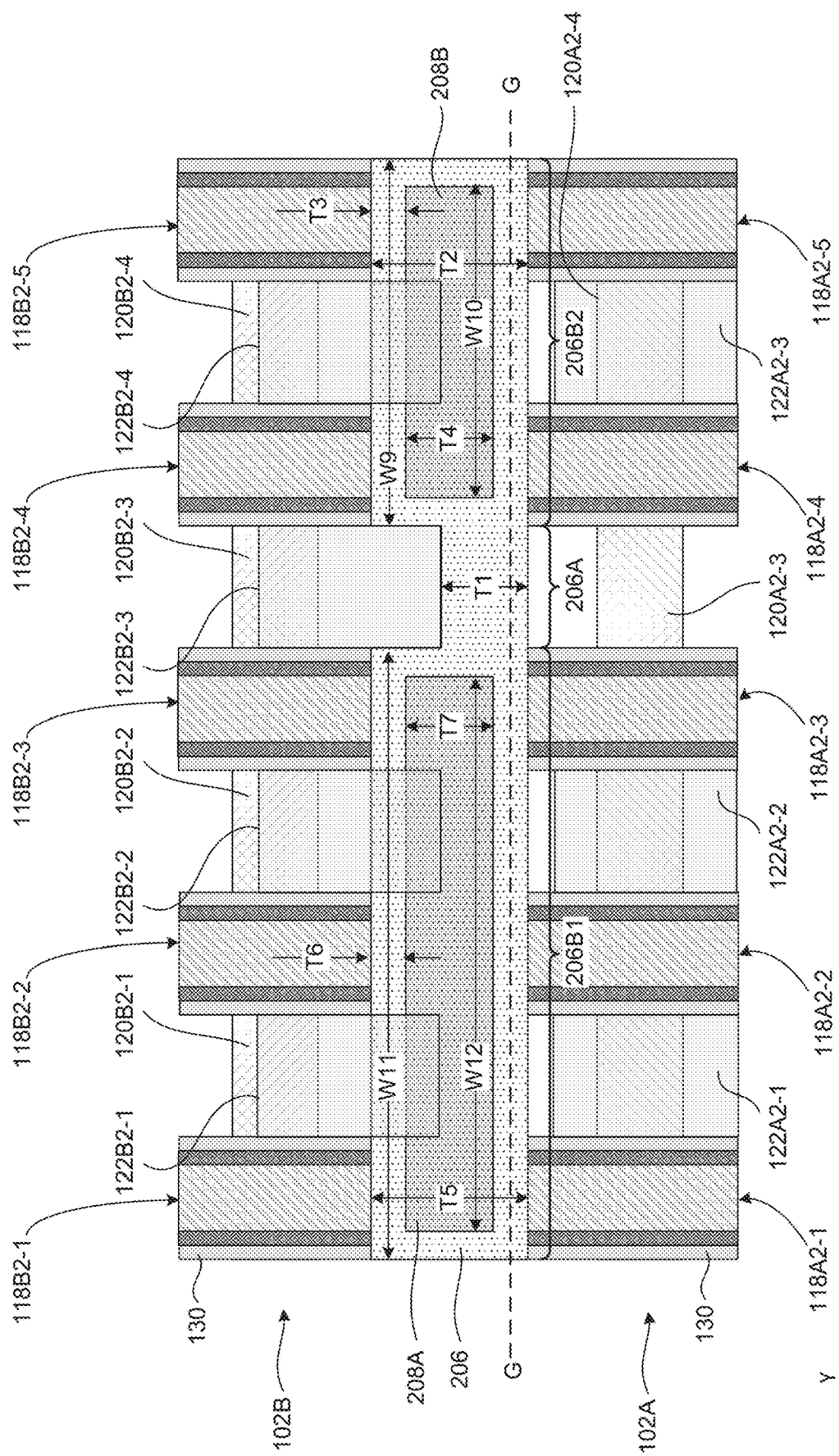
FIGS. 2-5 illustrate top-down views of other semiconductor devices with isolation structures, in accordance with some embodiments.
Figure 3:
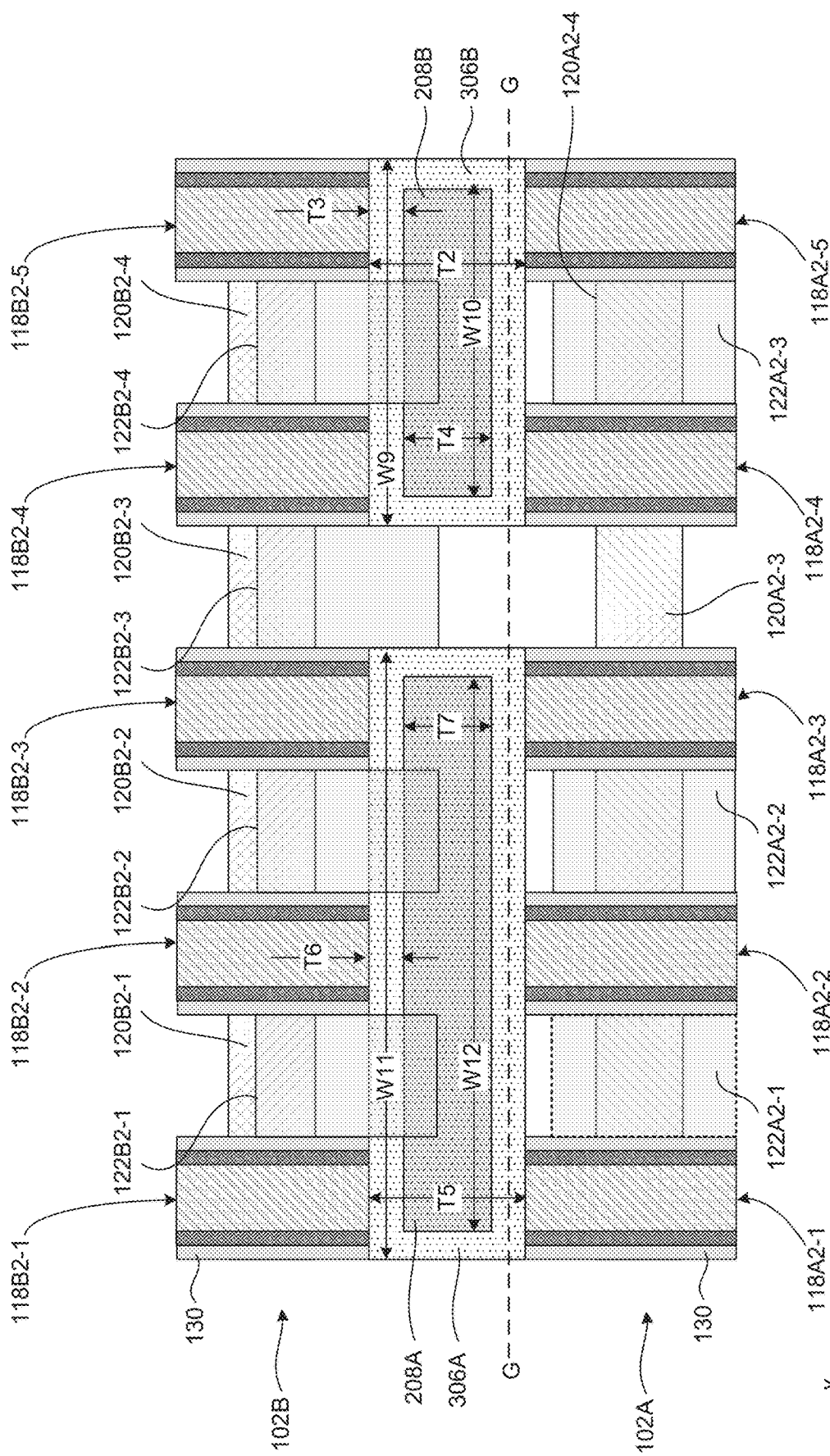
Figure 4:
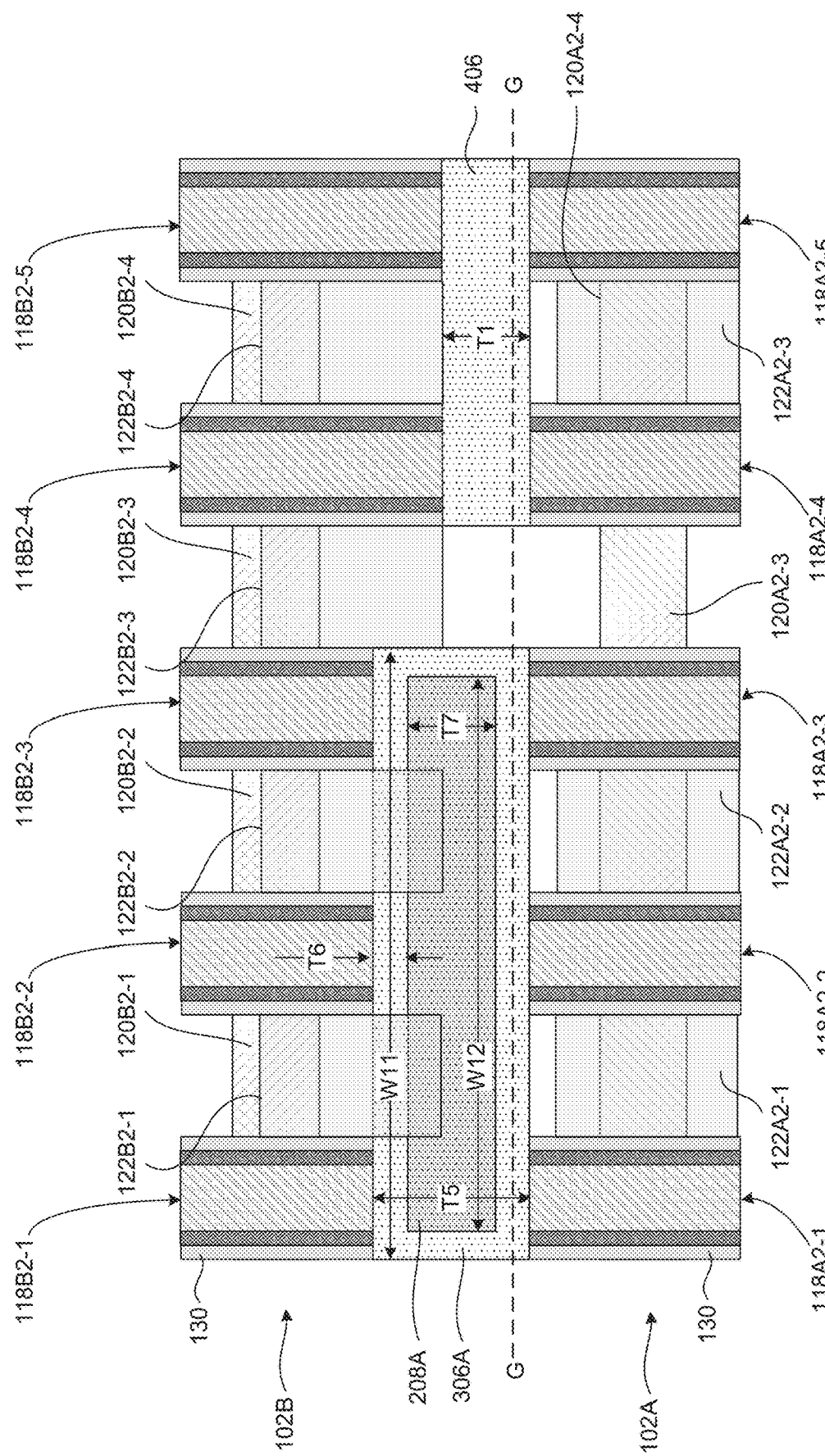
Figure 5:
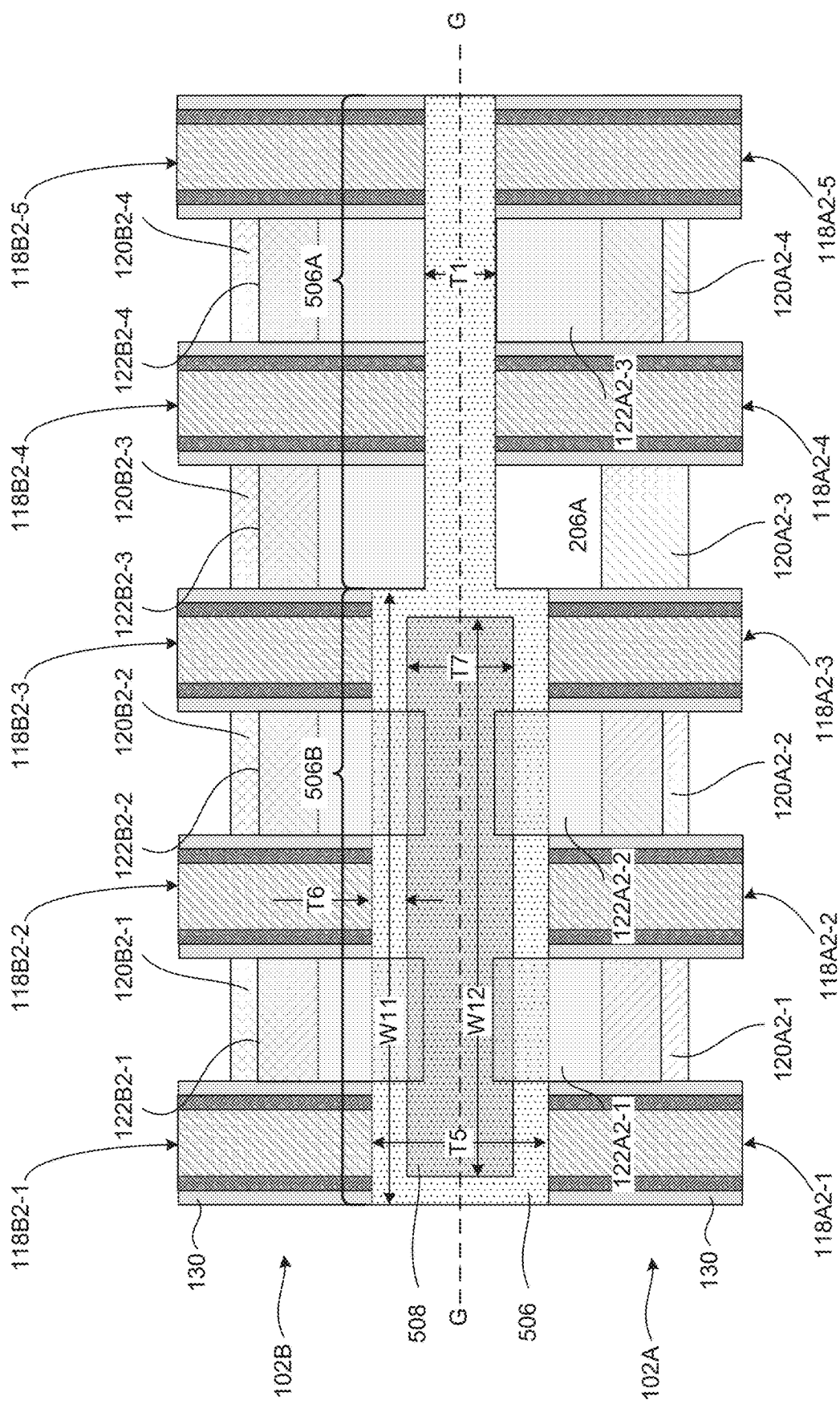

In some embodiments, instead of isolation structure 106 and vertical interconnect structure 108, semiconductor device 100 can have (i) an isolation structure 206 and vertical interconnect structures 208A-208B, as shown in FIG. 2, (ii) isolation structures 306A-306B and vertical interconnect structures 208A-208B, as shown in FIG. 3, (iii) isolation structures 306A and 406 and a vertical interconnect structure 208A, as shown in FIG. 4, or (iv) an isolation structure 506 and a vertical interconnect structure 508, as shown in FIG. 5, disposed between stacked FETs 102A and 102B. In some embodiments, isolation structure 106 and vertical interconnect structure 108 can be disposed between stacked FETs 102A and 102B, and the isolation structures and vertical interconnect structures of FIGS. 2, 3, 4, and/or 5 can be disposed in different device areas and between different pairs of stacked FETs of semiconductor device 100 similar to the pair of stacked FETs 102A-102Bs. In some embodiments, semiconductor device 100 can have any combination of the isolation structures and vertical interconnect structures shown in FIGS. 1H and 2-5.

Referring to FIG. 2, in some embodiments, isolation structure 206 can include a dielectric fill portion 206A and dielectric liner portions 206B1-206B2. Vertical interconnect structures 208A and 208B can be disposed in dielectric liner portions 206B1 and 206B2, respectively. The discussion of dielectric liner portion 106B and vertical interconnect structure 108 applies to dielectric liner portion 206B2 and vertical interconnect structure 208B, respectively, unless mentioned otherwise. Isolation structure 206 can include a material similar to that of isolation structure 106 and vertical interconnect structures 208A-208B can include a material similar to that of vertical interconnect structure 108. Dielectric liner portion 206B1 can have thicknesses T5 and T6 substantially equal to thicknesses T2 and T3, respectively, of dielectric liner portion 206B2. Vertical interconnect structure 208A can have a thickness T7 substantially equal to thickness T4 of vertical interconnect structure 208B. Isolation structure 206 and vertical interconnect structures 208A-208B can have heights similar to height H9 of isolation structure 106 and vertical interconnect structures 108. Vertical interconnect structures 208A-208B can have aspect ratios similar to that of vertical interconnect structure 108.

Vertical interconnect structure 208A can be configured to be in physical contact with two S/D contact structures 122B2-1 and 122B2-2 and vertical interconnect structure 208B can be configured to be in physical contact with one of S/D contact structures 122B2-1. In some embodiments, vertical interconnect structure 208A can have a width W12 of about 2 CPP to about 4 CPP to improve its electrical conductivity and to prevent misalignment with S/D contact structures 122B2-1 and 122B2-2. This range of width W12 can also provide adequate contact area between vertical interconnect structure 208A and S/D contact structures 122B2-1 and 122B2-2. In some embodiments, width W11 can be about 2 CPP to about 2.5 CPP when vertical interconnect structure 208A are electrically connected to two S/D contact structures, such as S/D contact structures 122B2-1 and 122B2-2.

Isolation structure 206 can be configured to (i) align dielectric fill portion 206A with S/D contact structures (e.g., S/D contact structure 122B2-3) that are not electrically connected to any vertical interconnect structures, and (ii) align dielectric liner portions 206B1-206B2 with S/D contact structures (e.g., S/D contact structures 122B2-1, 122B2-2, and 122B2-4) that are electrically connected to vertical interconnect structures (e.g., vertical interconnect structures 208A and 208B). In some embodiments, dielectric liner portion 206B1 can have a thickness T5 of about 30 nm to about 40 nm and a width W11 of about 50 nm to about 160 nm or of about 2.5 CPP to about 4.5 CPP. Within these ranges of thickness T5 and width W11, dielectric liner portion 206B1 provide adequate electrical isolation between stacked FETs 102A and 102B without overlapping with their S/D regions and provide adequate space to enclose vertical interconnect structure 208A.

In some embodiments, thickness T6 of dielectric liner portion 206B1 surrounding vertical interconnect structure 208A provide adequate electrical isolation between vertical interconnect structure 208A and gate structures 118A2-1, 118A2-2, 118A2-3, 118B2-1, 118B2-2, and 118B2-3. In some embodiments, sidewalls of dielectric liner portion 206B 1 along a Y-axis can be aligned with sidewalls of gate spacers 130 along a Y-axis to prevent misalignment of vertical interconnect structure 208A with S/D contact structures 122B2-1 and 122B2-2. In some embodiments, sidewalls of dielectric liner portion 206B2 along a Y-axis can be aligned with sidewalls of gate spacers 130 along a Y-axis to prevent misalignment of vertical interconnect structure 208B with S/D contact structure 122B2-4.

Referring to FIG. 3, in some embodiments, semiconductor device 100 can have segmented isolation structures 306A and 306B, which are spaced apart from each other along an X-axis. In some embodiments, isolation structures 306A and 306B can be similar to dielectric liner portions 206B1 and 206B2, respectively. However, unlike dielectric liner portions 206B1 and 206B2, isolation structures 306A and 306B are not connected to each other through a dielectric fill portion, such as dielectric fill portion 206A. Vertical interconnect structures 208A and 208B can be disposed in isolation structures 306A and 306B, respectively.

Referring to FIG. 4, in some embodiments, semiconductor device 100 can have segmented isolation structures 306A and 406, which are spaced apart from each other along an X-axis. In some embodiments, isolation structure 406 can be similar to dielectric fill portion 106A.

Referring to FIG. 5, in some embodiments, isolation structure 506 can include a dielectric fill portion 506A and a dielectric liner portion 506B. Vertical interconnect structure 508 can be disposed in dielectric liner portion 506B. Dielectric liner portion 506B can be similar to dielectric liner portion 206A, but unlike dielectric liner portion 206A, dielectric liner portion 506B can be in physical contact with S/D contact structures of both stacked FETs 102A and 102B. Vertical interconnect structure 508 can be similar to vertical interconnect structure 208A, but unlike vertical interconnect structure 208A, vertical interconnect structure 508 can be in physical contact with S/D contact structures of both stacked FETs 102A and 102B. That is, vertical interconnect structure 508 can be electrically connected to S/D contact structures 122A2-1 and/or 122A2-2 and S/D contact structures 122B2-1 and/or 122B2-2. Furthermore, unlike isolation structure 206, the symmetry line of isolation structure 506 can be substantially aligned with standard cell boundary G-G.

Figure 6:
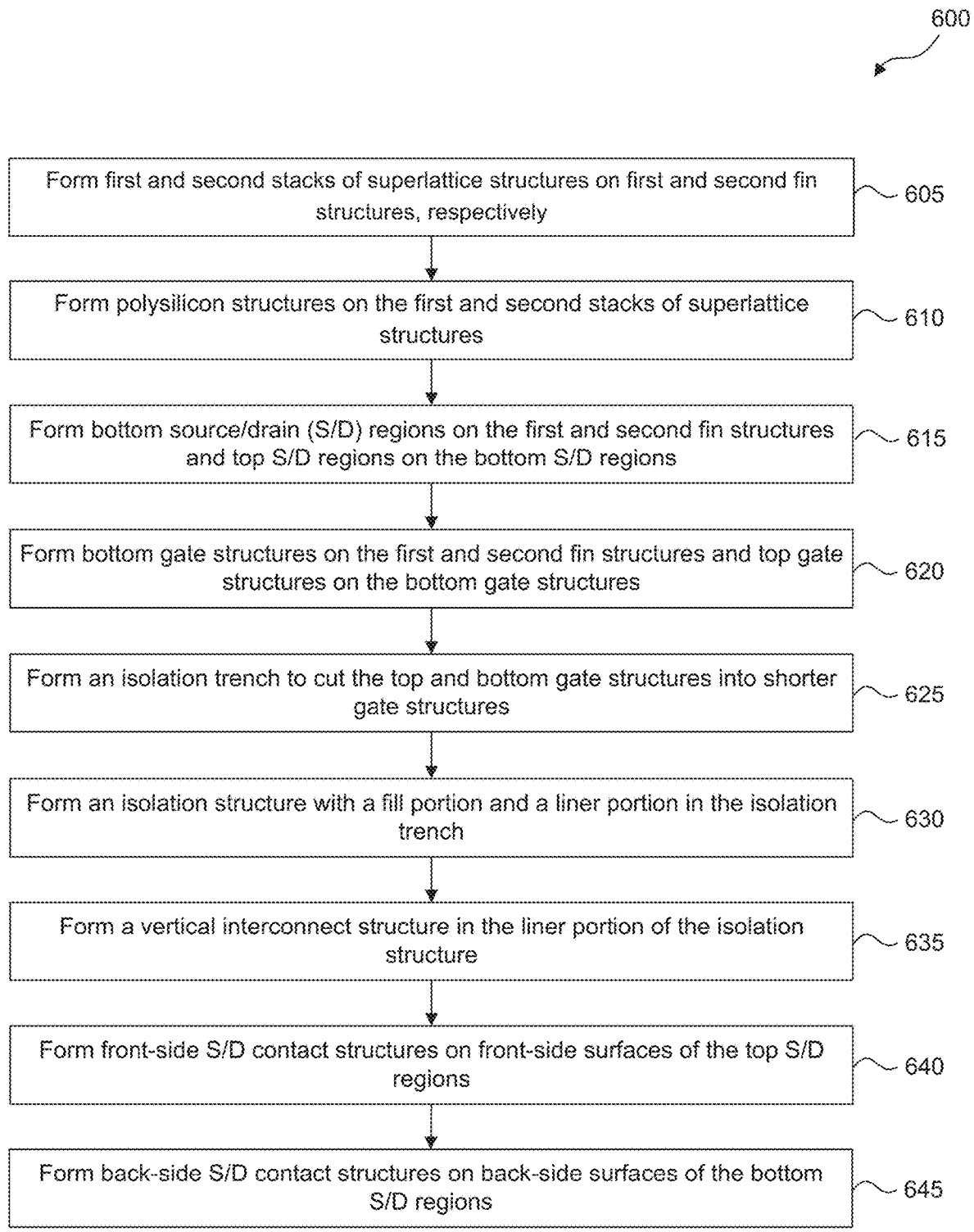
FIG. 6 is a flow diagram of a method for fabricating a semiconductor device with isolation structures, in accordance with some embodiments.
Figure 7:
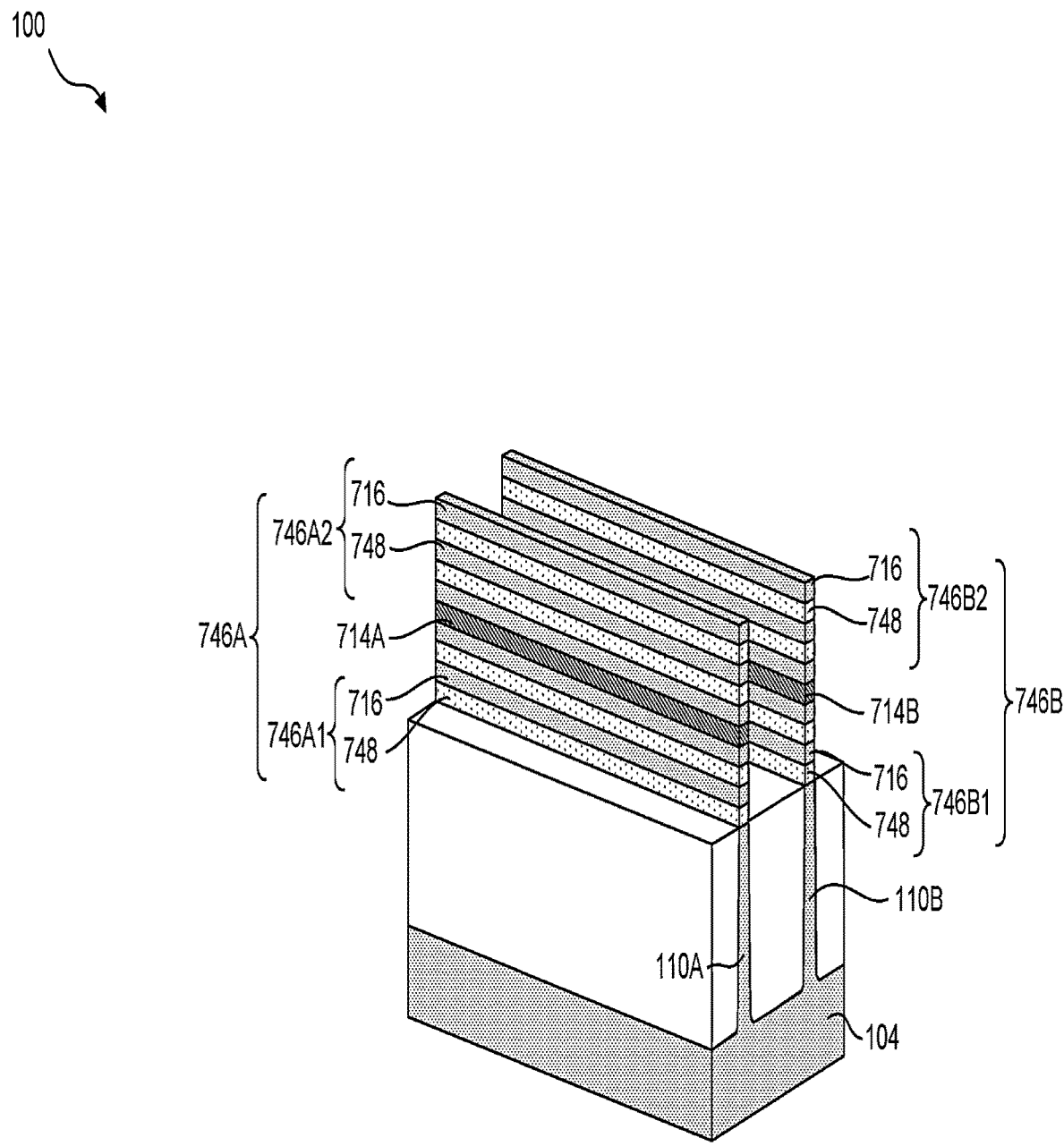

FIG. 6 is a flow diagram of an example method 600 for fabricating semiconductor devices 100 shown in FIGS. 1A-1H, according to some embodiments. For illustrative purposes, the operations illustrated in FIG. 6 will be described with reference to the example fabrication process for fabricating semiconductor devices 100 as illustrated in FIGS. 7, 8A-15B, and 16A-22F. FIG. 7 is an isometric view of semiconductor device 100 at a stage of fabrication, according to some embodiments. FIGS. 8A-15A are cross-sectional views of semiconductor devices 100 along lines A-A of FIGS. 1A and 1D-1H at various stages of fabrication, according to some embodiments. FIGS. 8B-15B are cross-sectional views of semiconductor devices 100 along lines H—H of FIGS. 1A and 1D-1H at various stages of fabrication, according to some embodiments.

FIGS. 16A-22A are cross-sectional views of semiconductor devices 100 along lines A-A of FIGS. 1A and 1D-1H at various stages of fabrication, according to some embodiments. FIGS. 16B-22B are cross-sectional views of semiconductor devices 100 along lines B-B of FIGS. 1A and 1D-1H at various stages of fabrication, according to some embodiments. FIGS. 16C-22C are cross-sectional views of semiconductor devices 100 along lines C-C of FIGS. 1A-1C and 1H at various stages of fabrication, according to some embodiments. FIGS. 16D-22D are cross-sectional views of semiconductor devices 100 along lines D-D of FIGS. 1A-1C and 1H at various stages of fabrication, according to some embodiments. FIGS. 16E-22E are cross-sectional views of semiconductor devices 100 along lines E-E of FIGS. 1A-1C and 1H at various stages of fabrication, according to some embodiments. FIGS. 16F-22F are cross-sectional views of semiconductor devices 100 along lines F-F of FIGS. 1A-1C and 1H at various stages of fabrication, according to some embodiments.

Operations can be performed in a different order or not performed depending on specific applications. It should be noted that method 600 may not produce a semiconductor device 100. Accordingly, it is understood that additional processes can be provided before, during, and after method 600, and that some other processes may only be briefly described herein. Elements in FIGS. 7-15B and 16A-22F with the same annotations as elements in FIGS. 1A-1H are described above.

Referring to FIG. 6, in operation 605, first and second stacks of superlattice structures are formed on first and second fin structures, respectively. For example, as shown in FIG. 7, first and second stacks of superlattice structures 746A and 746B are formed on first and second fin structures 110A and 110B, respectively. First stack of superlattice structure 746A can include first and second superlattice structures 746A1 and 746A2 and a nanostructured isolation layer 714A disposed between first and second superlattice structures 746A1 and 746A2. Second stack of superlattice structure 746B can include first and second superlattice structures 746B1 and 746B2 and a nanostructured isolation layer 714B disposed between first and second superlattice structures 746B1 and 746B2.

Each of superlattice structures 746A1-746A2 and 746B1-746B2 can include nanostructured layers 716 and 748. In some embodiments, nanostructured layer 716 can include Si and nanostructured layer 748 can include SiGe. Nanostructured layers 716 can form nanostructured layers 116A1-116A2 and 116B1-116B in subsequent processing. Nanostructured isolation layers 714A-714B can form channel isolation layers 114A-114B in subsequent processing. In some embodiments, the formation of first and second stacks of superlattice structures 746A and 746B can include epitaxially growing the materials of nanostructured layers 716 and 748 and depositing the material of nanostructured isolation layers 714A-714B on substrate 104, followed by a photolithography process and an etching process.

Figure 8A:
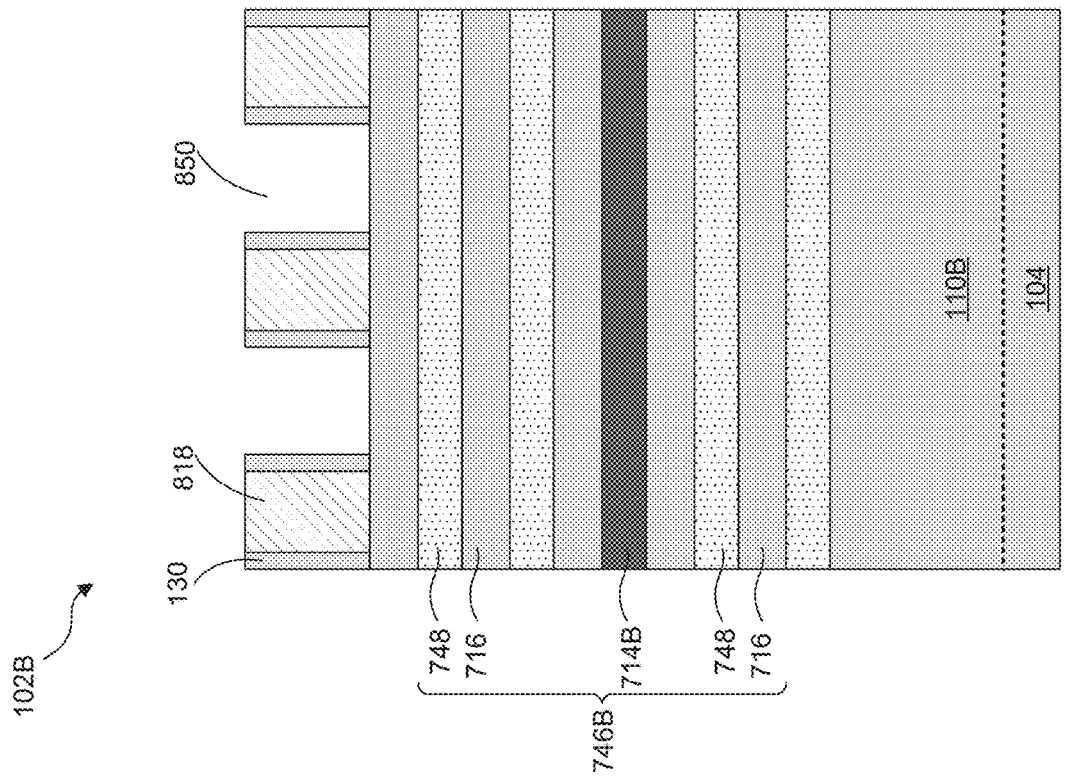
Figure 8B:
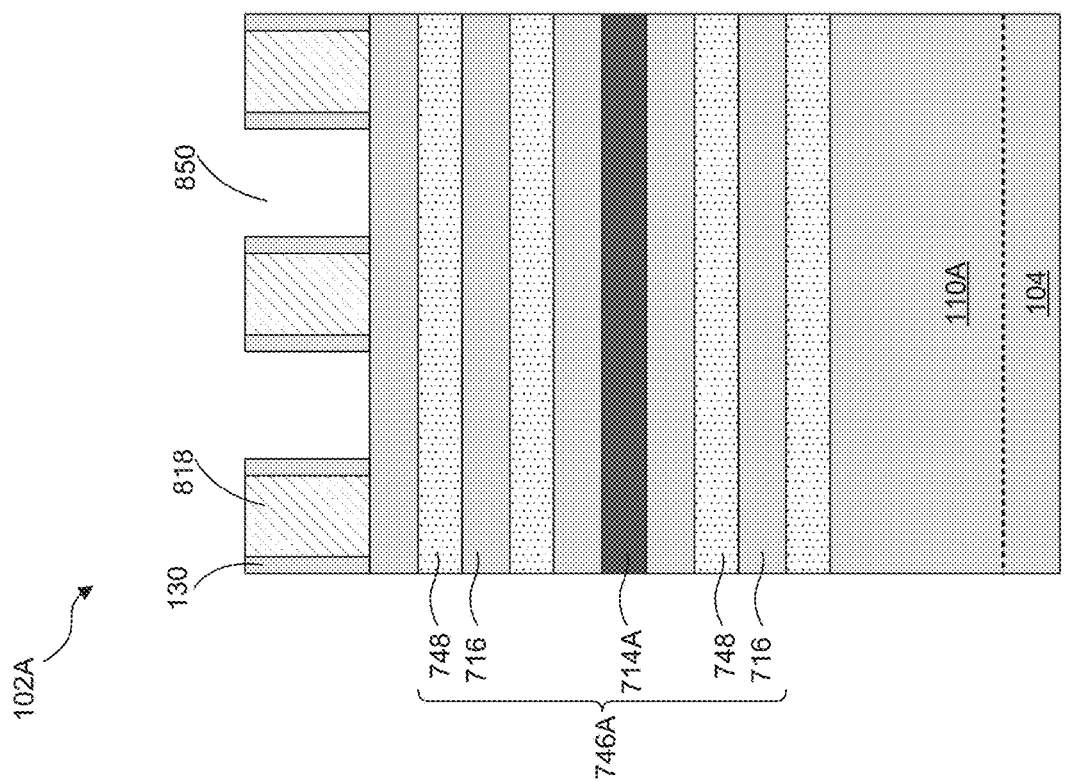

Referring to FIG. 6, in operation 610, polysilicon structures are formed on the first and second stacks of superlattice structures. For example, as shown in FIGS. 8A-8B, polysilicon structures 818 are formed on first and second stacks of superlattice structures 746A and 746B.

Referring to FIG. 6, in operation 615, bottom S/D regions are formed on the first and second fin structures and top S/D regions are formed on the bottom S/D regions. For example, as described with reference to FIGS. 9A-12B, S/D regions 120A1-1, 120A1-2, 120B1-1, and 120B1-2, referred to as "bottom S/D regions," are formed on fin structures 110A and 110B, and S/D regions 120A2-1, 120A2-2, 120B2-1, and 120B2-2, referred to as "top S/D regions," are formed on the bottom S/D regions.

Figure 9B:
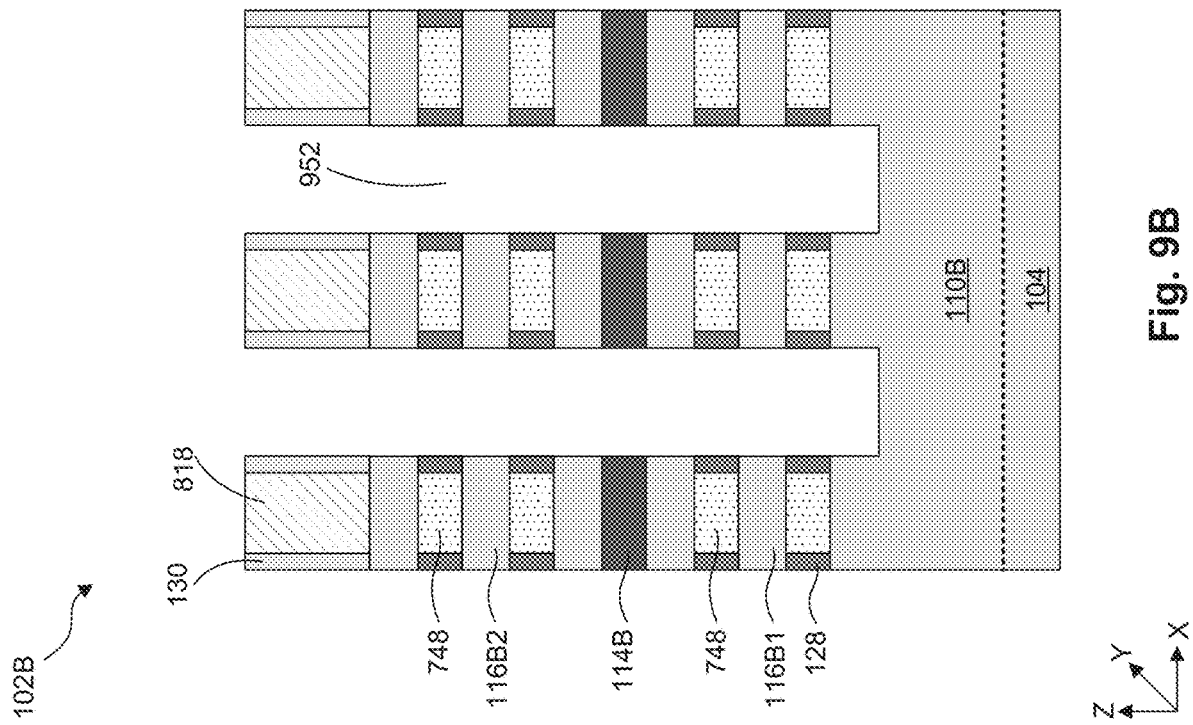
Figure 9A:
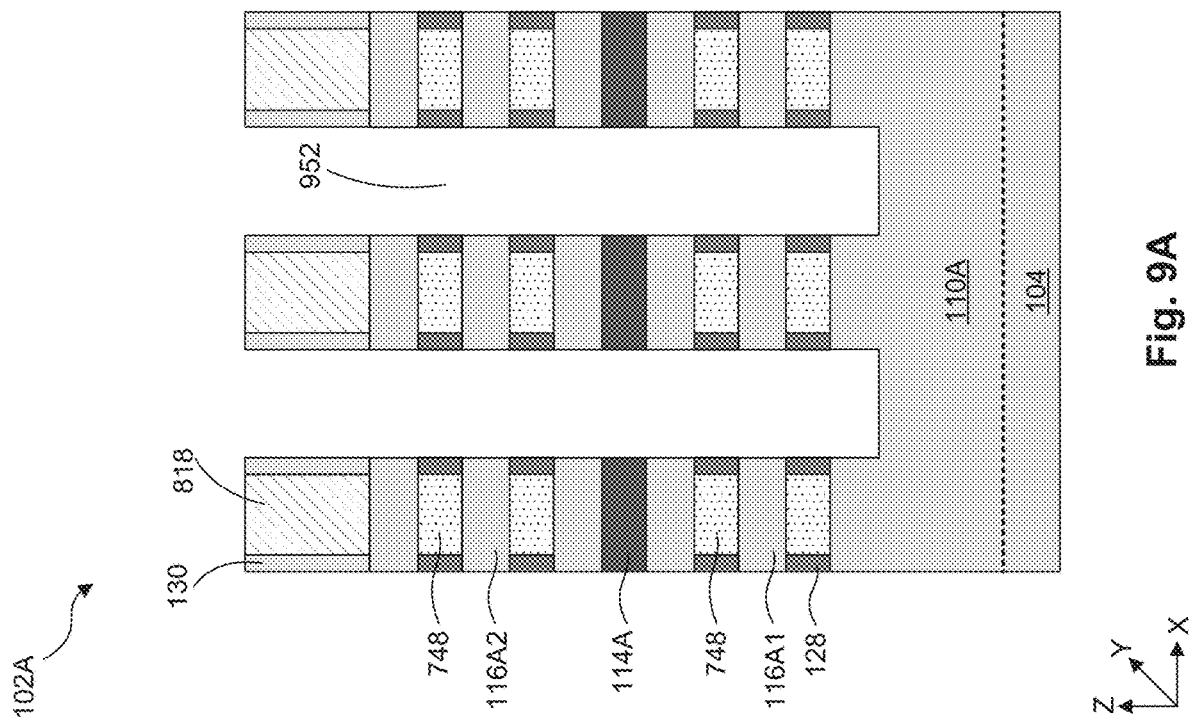
Figure 11A:
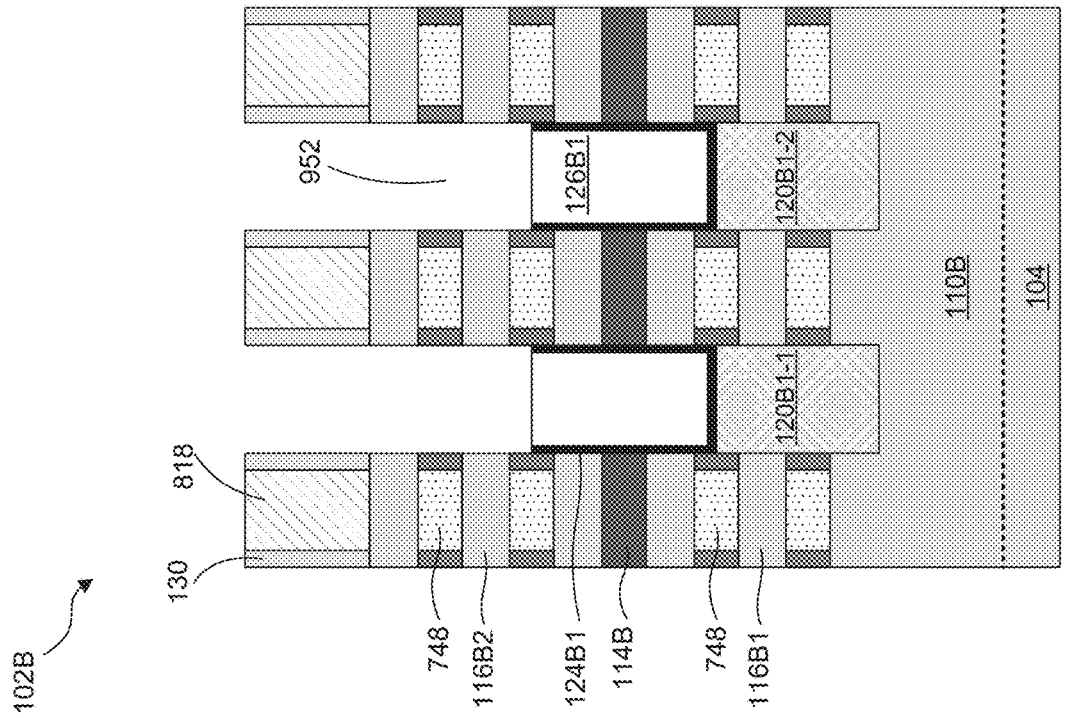
Figure 11B:
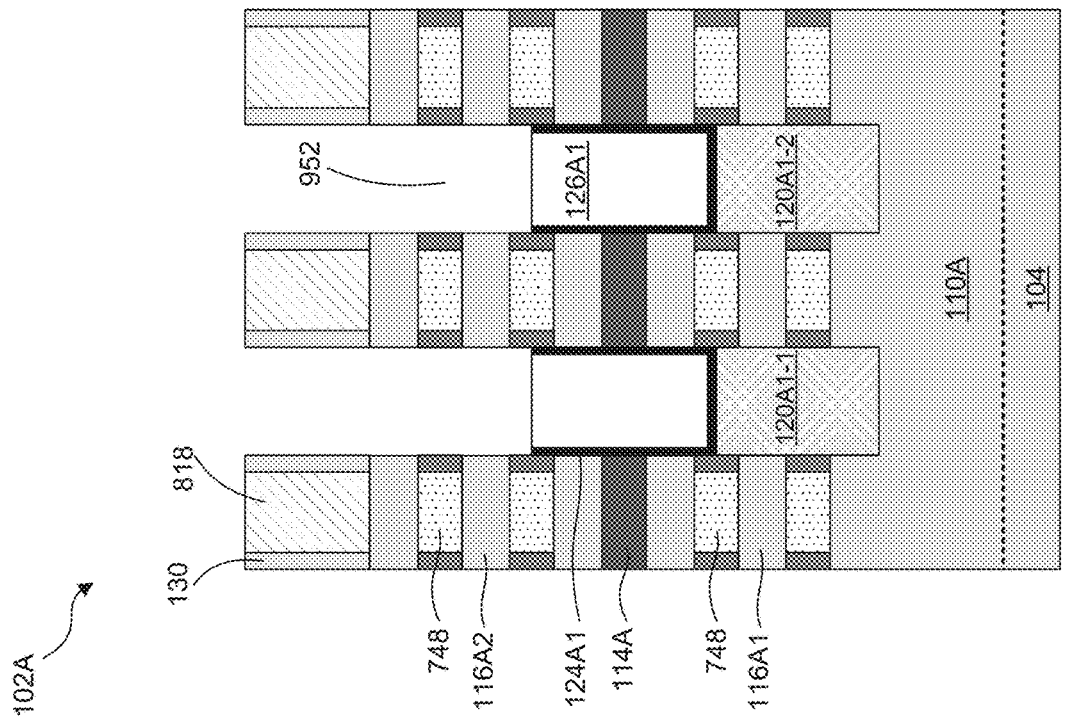

The formation of the bottom S/D regions can include sequential operations of (i) forming S/D openings 952, as shown in FIGS. 9A-9B, by etching first and second stacks of superlattice structures 746A and 746B through openings 850 (shown in FIGS. 8A-8B), and (ii) epitaxially growing a semiconductor layer with a first conductivity type dopants (e.g., p-type dopants) in S/D openings 952 to form the structures of FIGS. 10A-10B. In some embodiments, inner spacers 128 can be formed between operations (i) and (ii) of the formation process of the bottom S/D regions, as shown in FIGS. 9A-9B. The formation of the bottom S/D regions can be followed by the formation of ESLs 124A1-124B1 and ILD layers 126A1-126B1 on the bottom S/D regions, as shown in FIGS. 11A-11B.

The formation of the top S/D regions can include epitaxially growing a semiconductor layer with a second conductivity type dopants (e.g., n-type dopants) in S/D openings 952 to form the structures of FIGS. 12A-12B. The semiconductor layer can epitaxially grow on the sidewalls of nanostructured layers 116A2 and 116B2 facing S/D openings 952. During the epitaxial growth of the semiconductor layer, the semiconductor layer can extend laterally and vertically to substantially fill S/D openings 952. The semiconductor layer does not grow epitaxially on the non-semiconductor material of inner spacers 128 and ILD layers 126A1-126B1. As a result, in some embodiments, there can be air gaps (not shown) at the interfaces between the top S/D regions and inner spacers 128 and between the top S/D regions and ILD layers 126A1-126B1. In some embodiments, top surfaces of the top S/D regions can be substantially coplanar with bottom surfaces of polysilicon structures 818, as shown in FIGS. 12A-12B. Following the formation of the top S/D regions, ESLs 124A2-124B2 and ILD layers 126A2-126B2 can be formed, as shown in FIGS. 13A-13B.

Referring to FIG. 6, in operation 620, bottom gate structures are formed on the first and second fin structures and top gate structures are formed on the bottom gate structures. For example, as described with reference to FIGS. 13A-15B and 16A-16F, gate structures 1518A-1, 1518A-2, and 1518A-3, referred to as "bottom gate structures," are formed on fin structures 110A and 110B, and gate structures 1518B-1, 1518B-2, and 1518B-3, referred to as "top gate structures," are formed on the bottom gate structures.

Figure 13A:
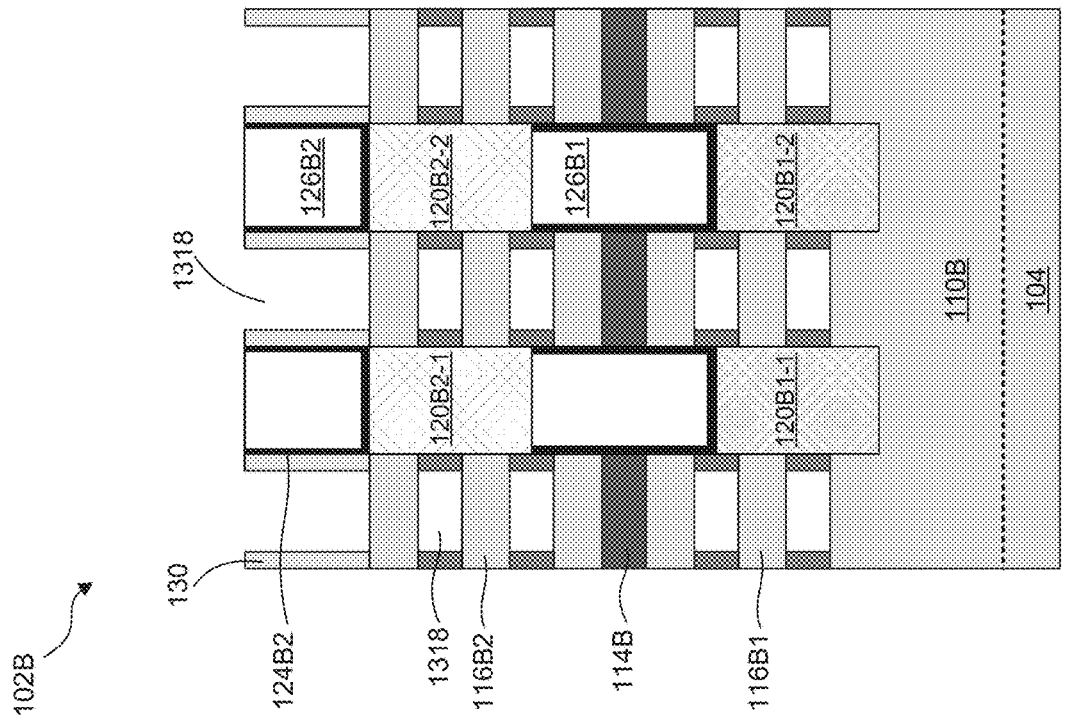
Figure 13B:
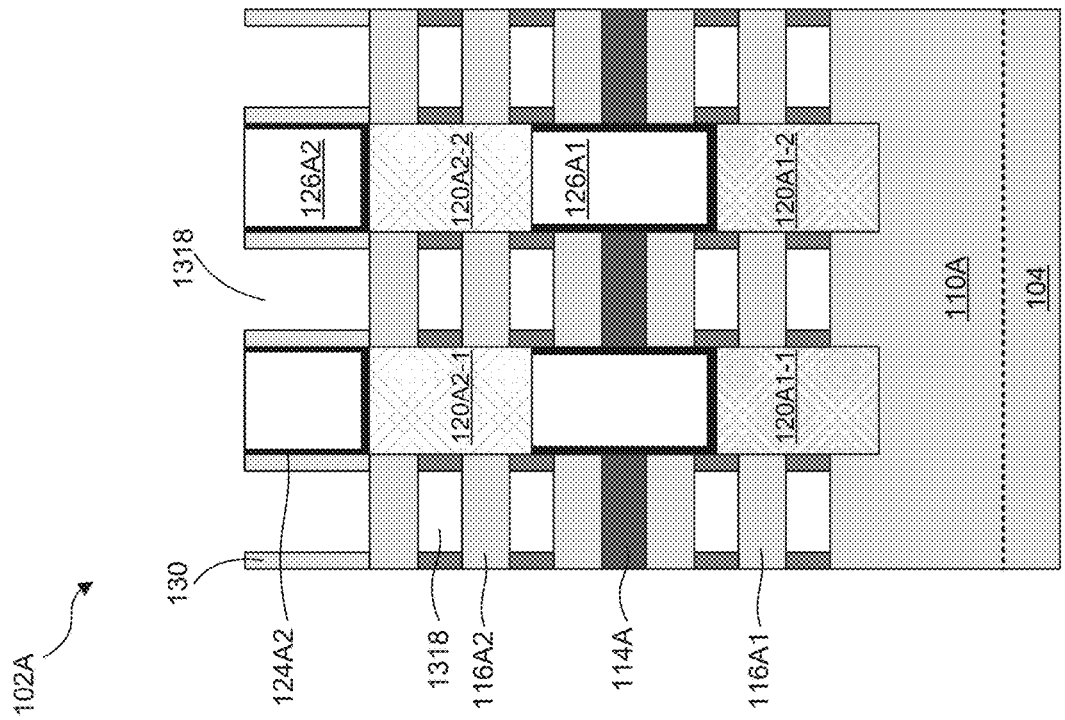
Figure 14B:
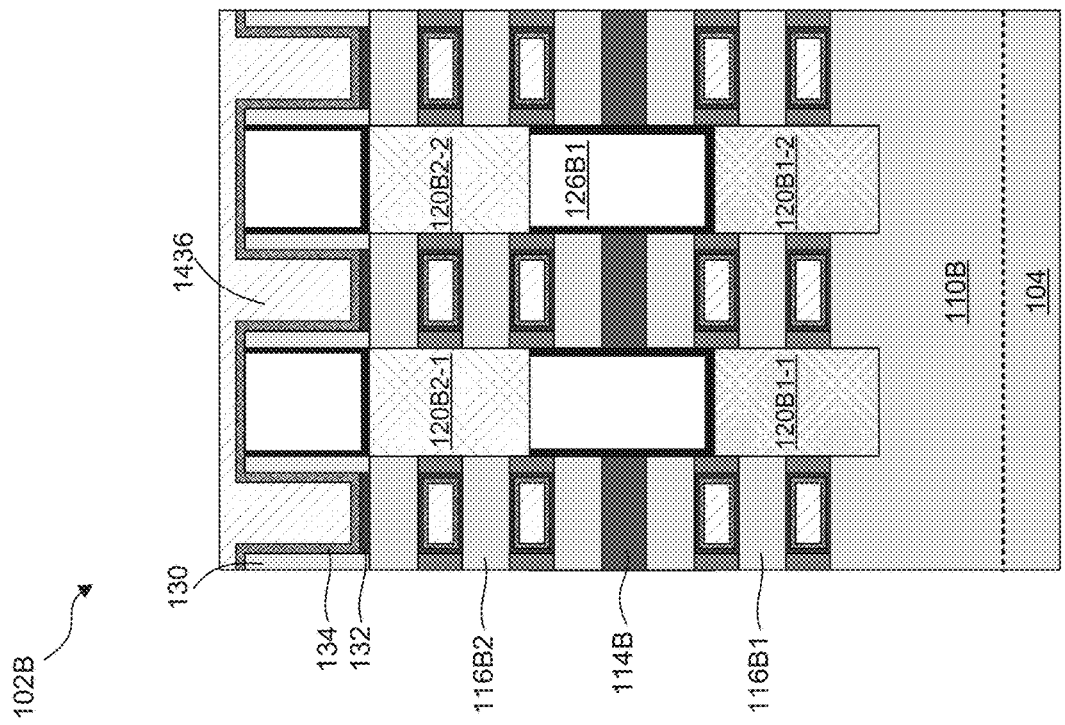
Figure 14A:
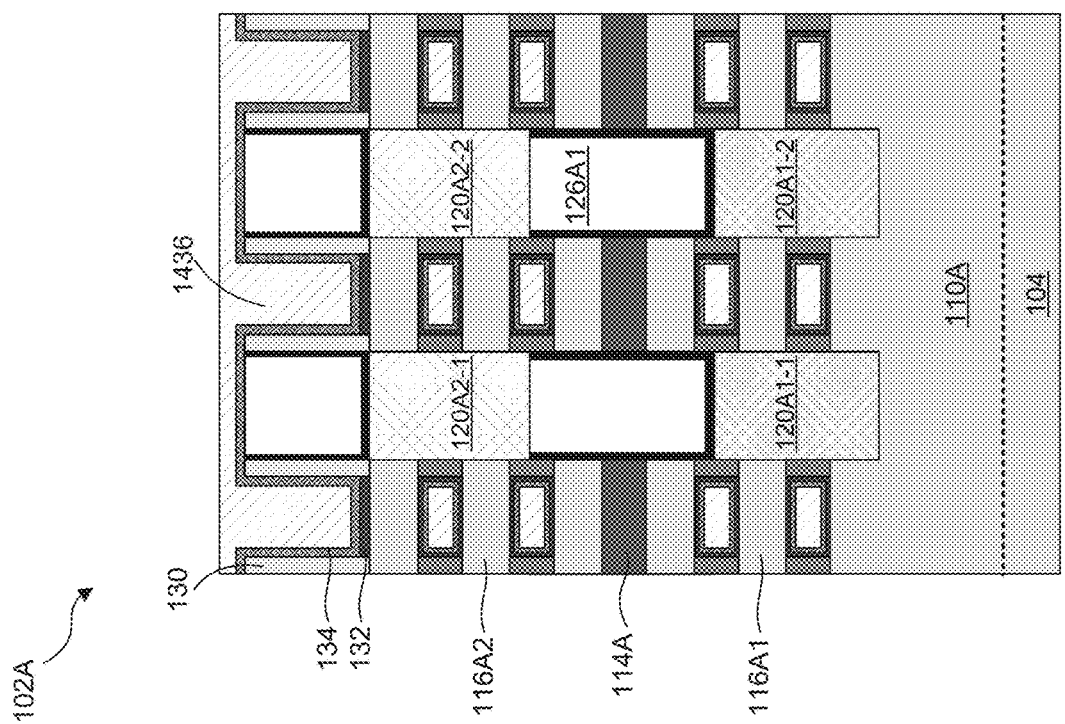
Figures 15A, 15B:
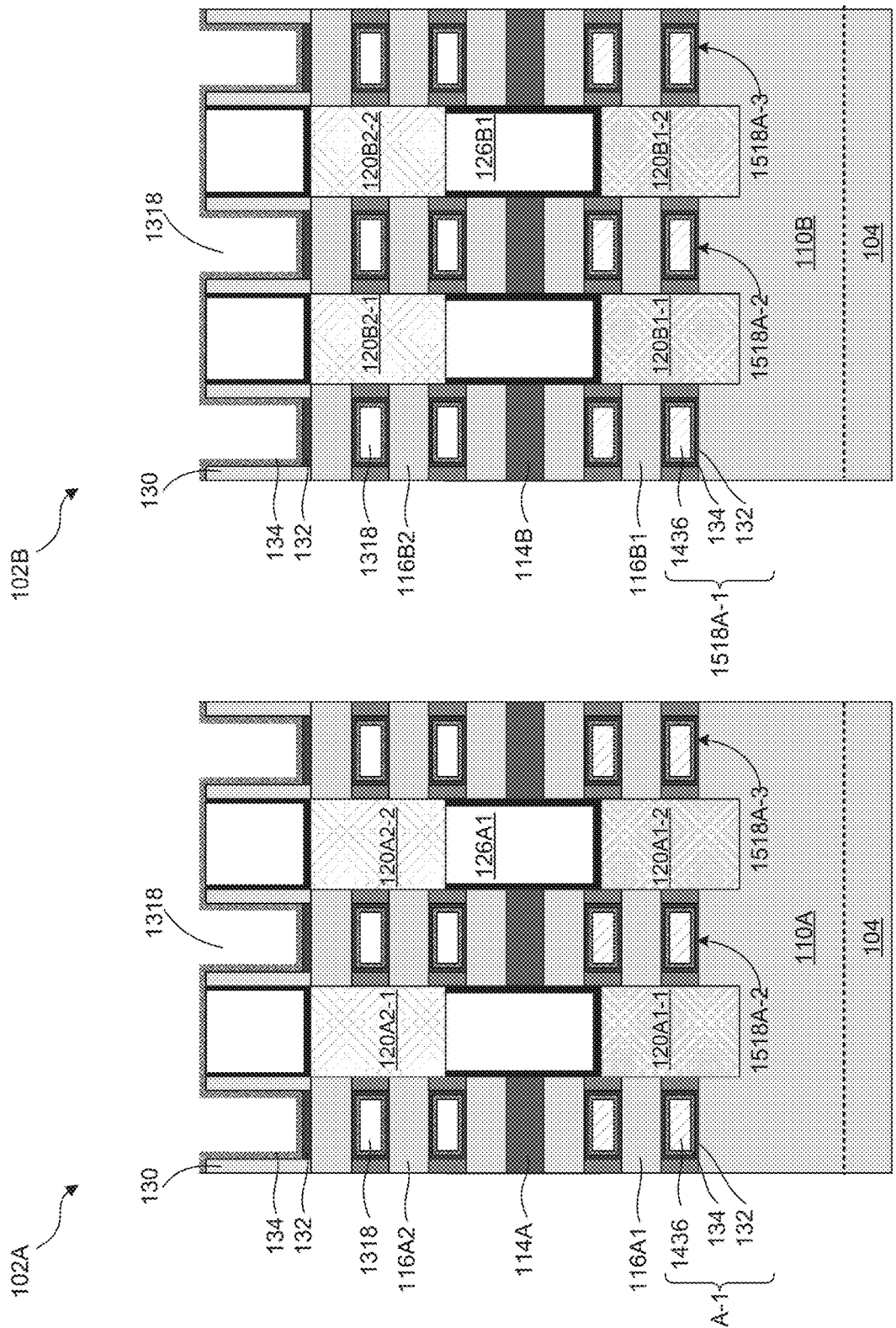
Figure 16A:
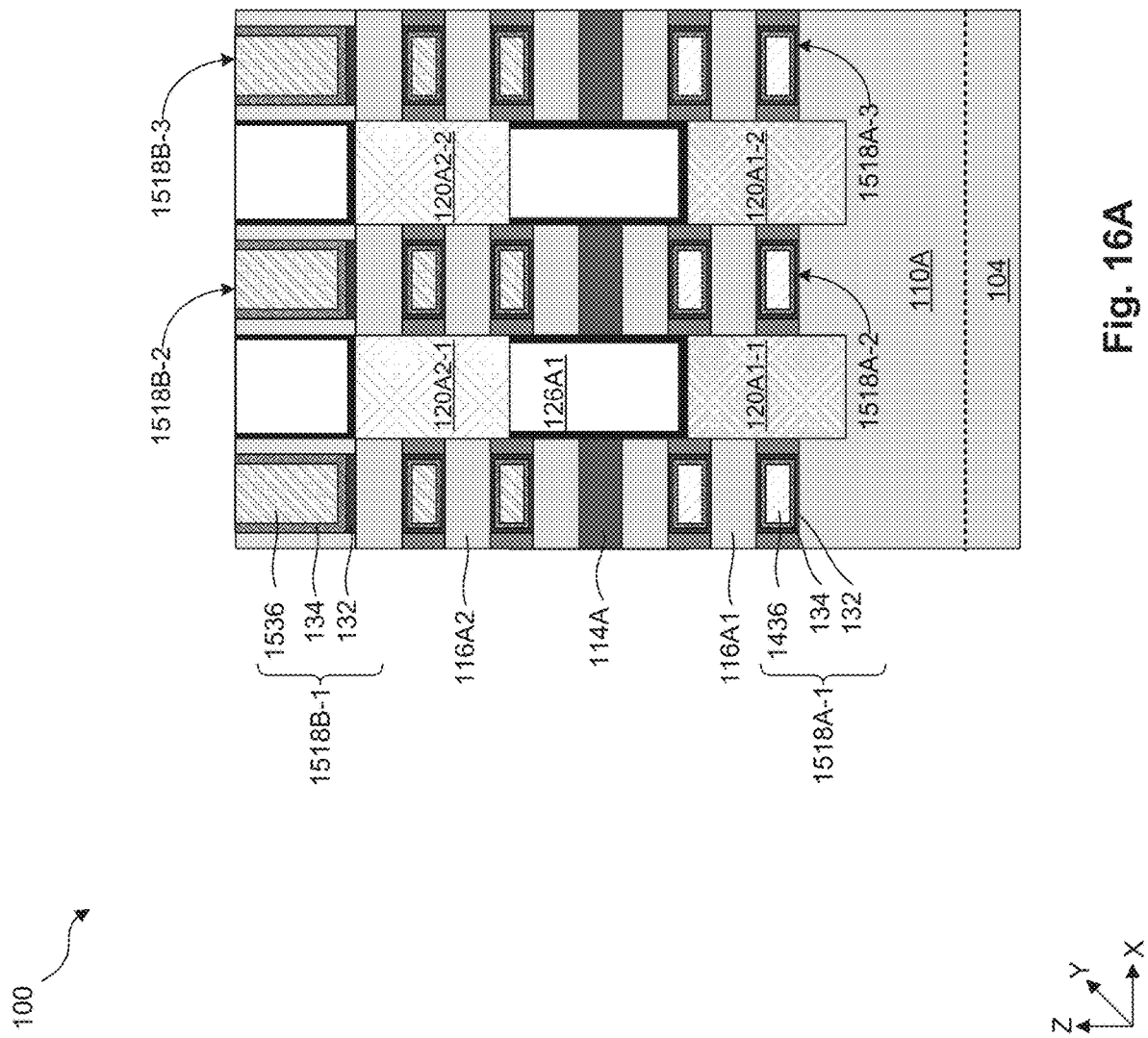
Figure 16B:
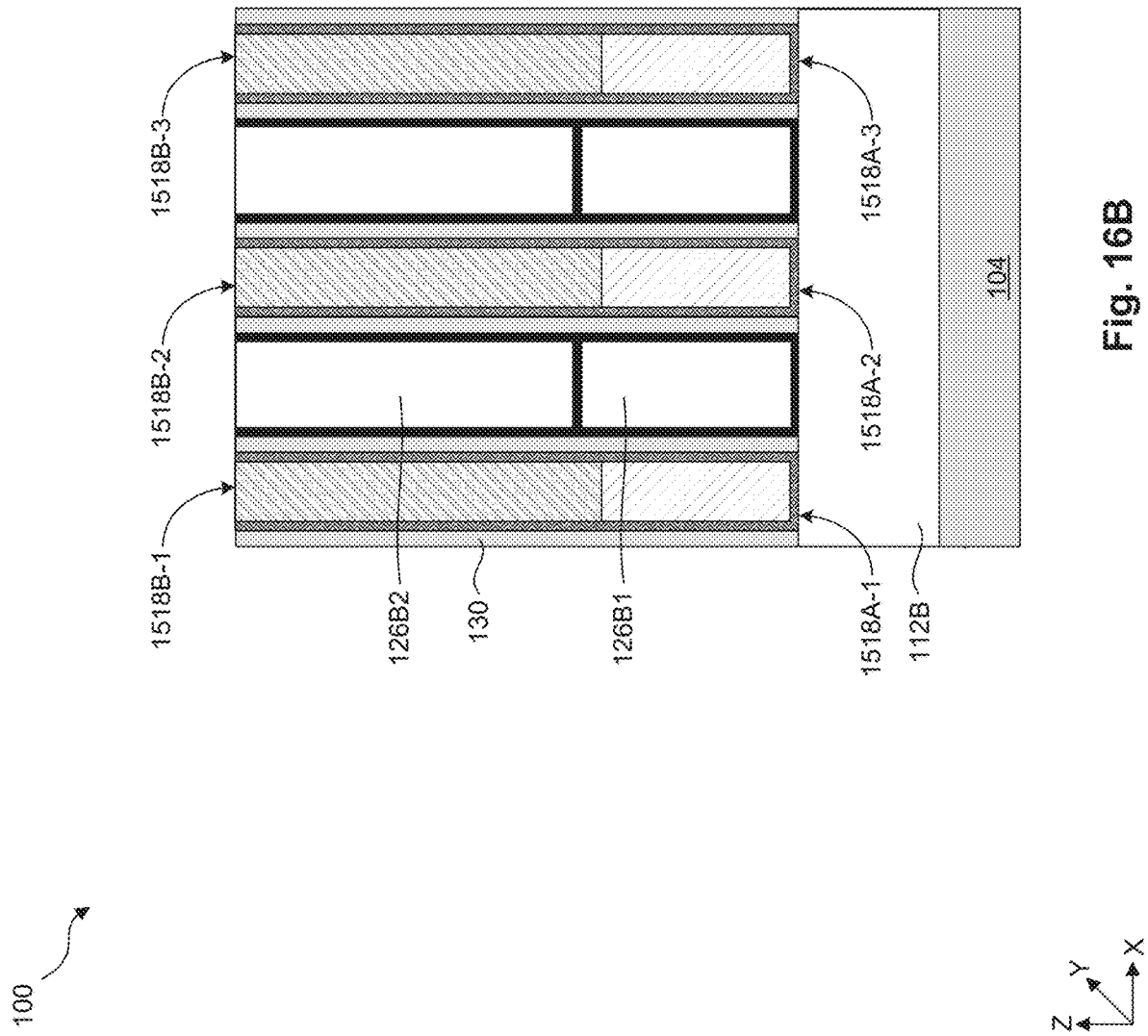
Figure 16C:
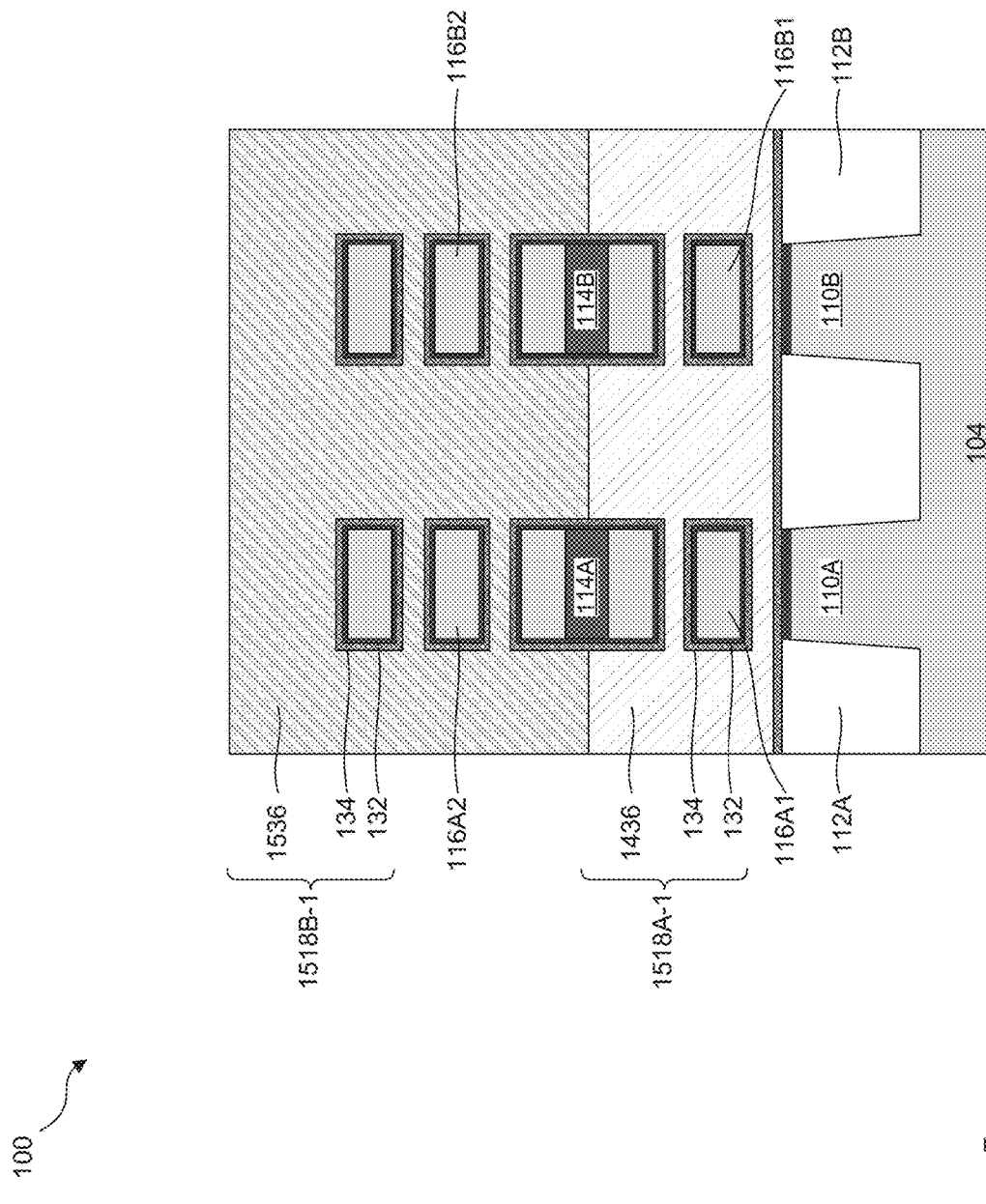
Figure 16D:
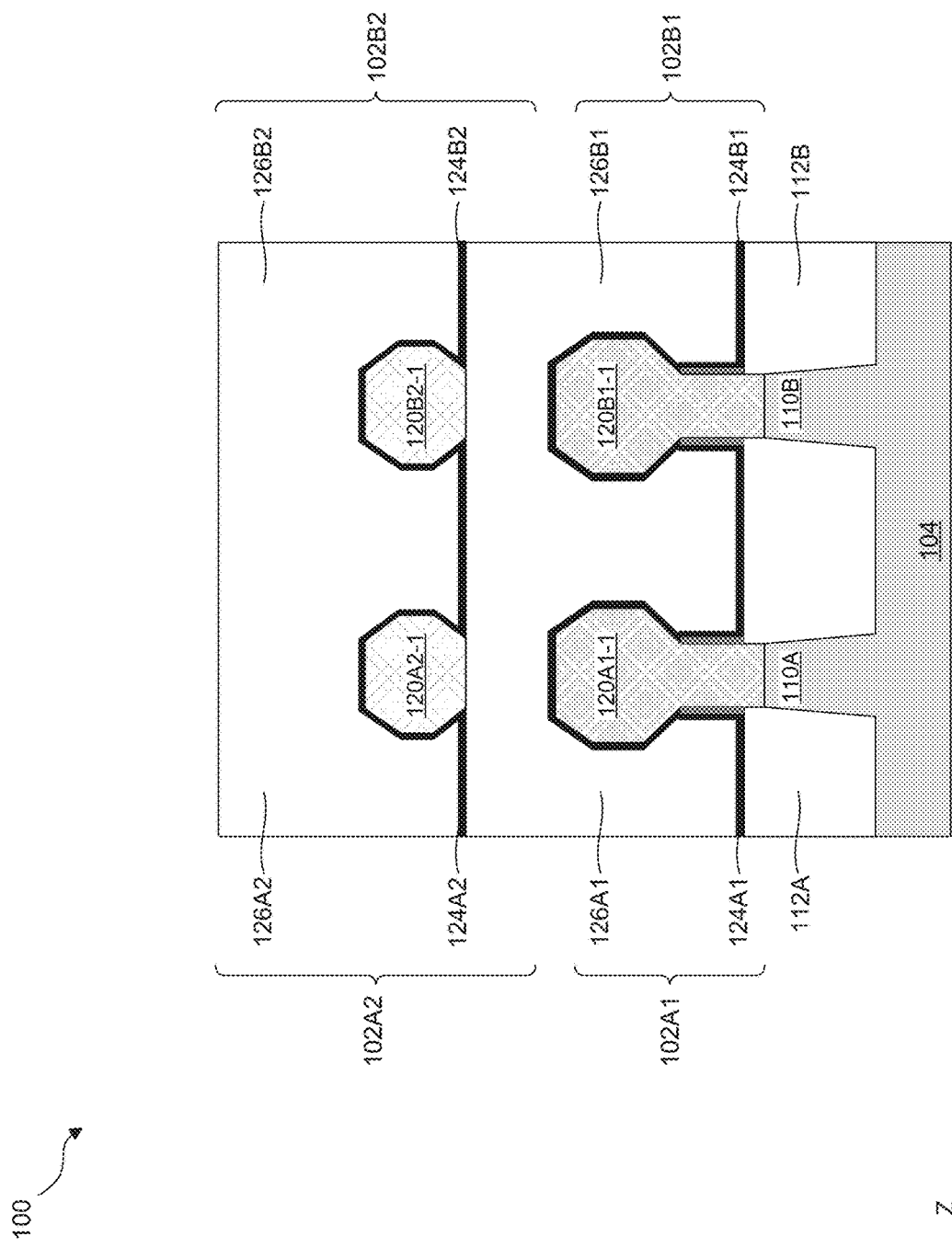
Figure 16E:
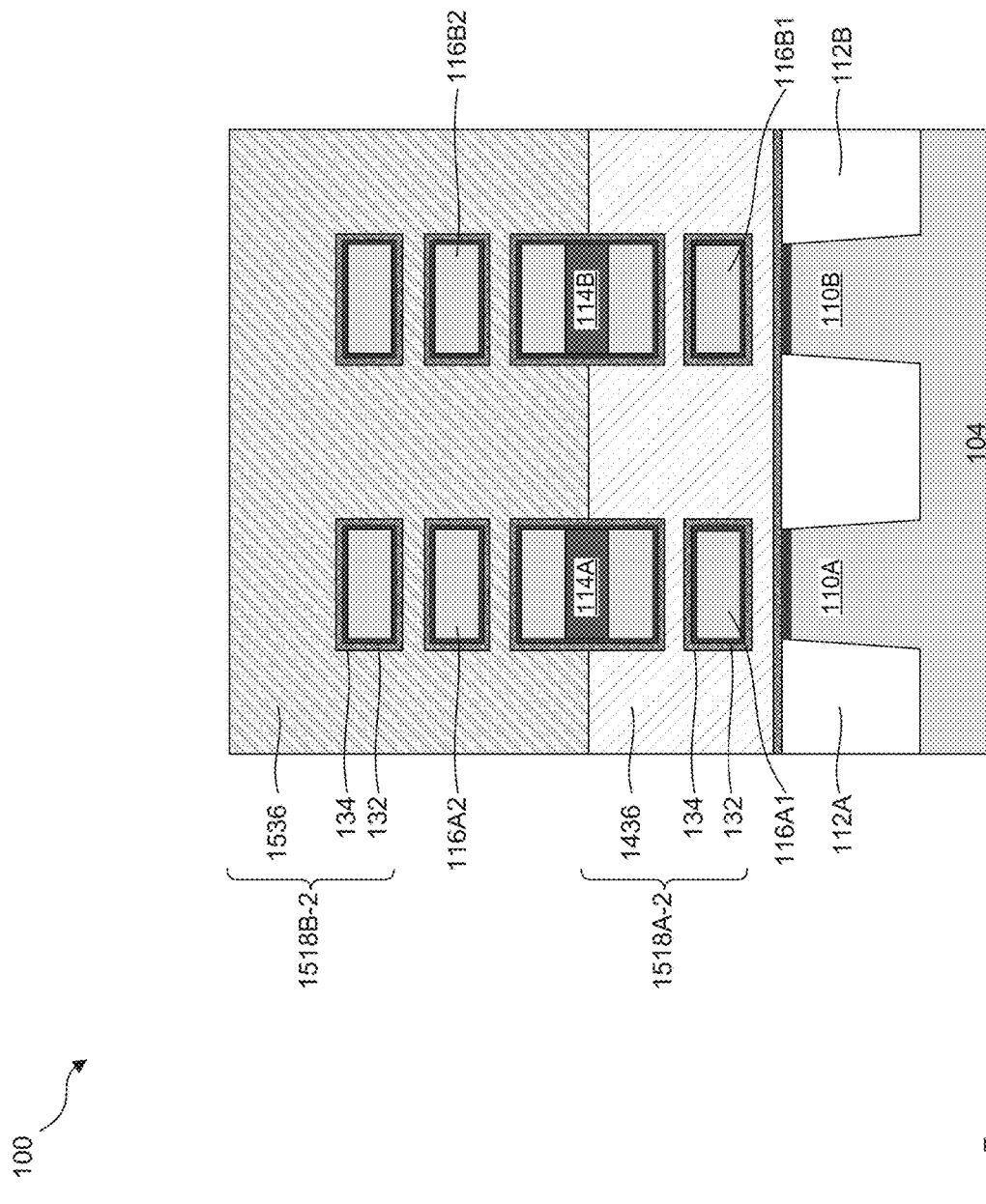
Figure 16F:
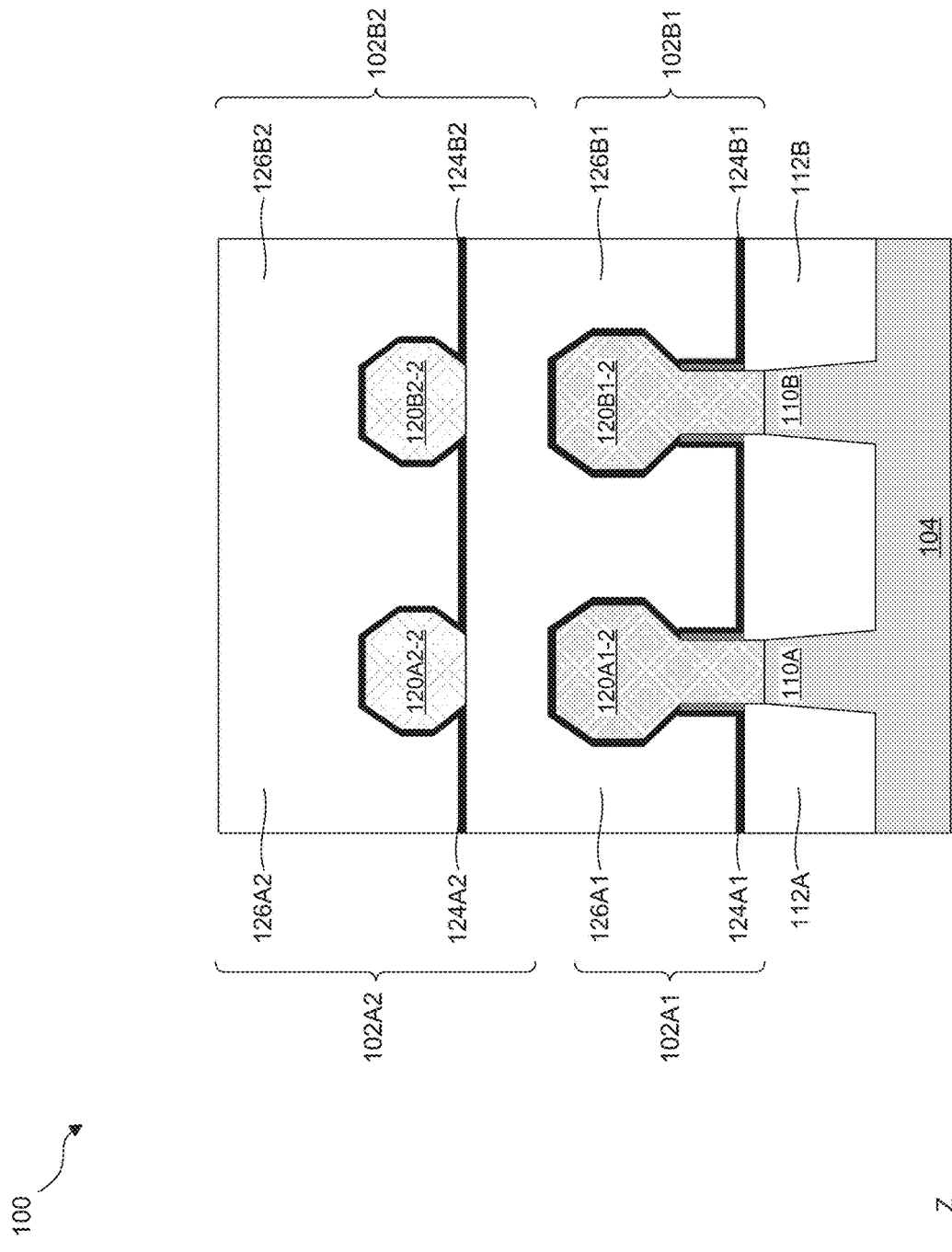
Figure 17A:
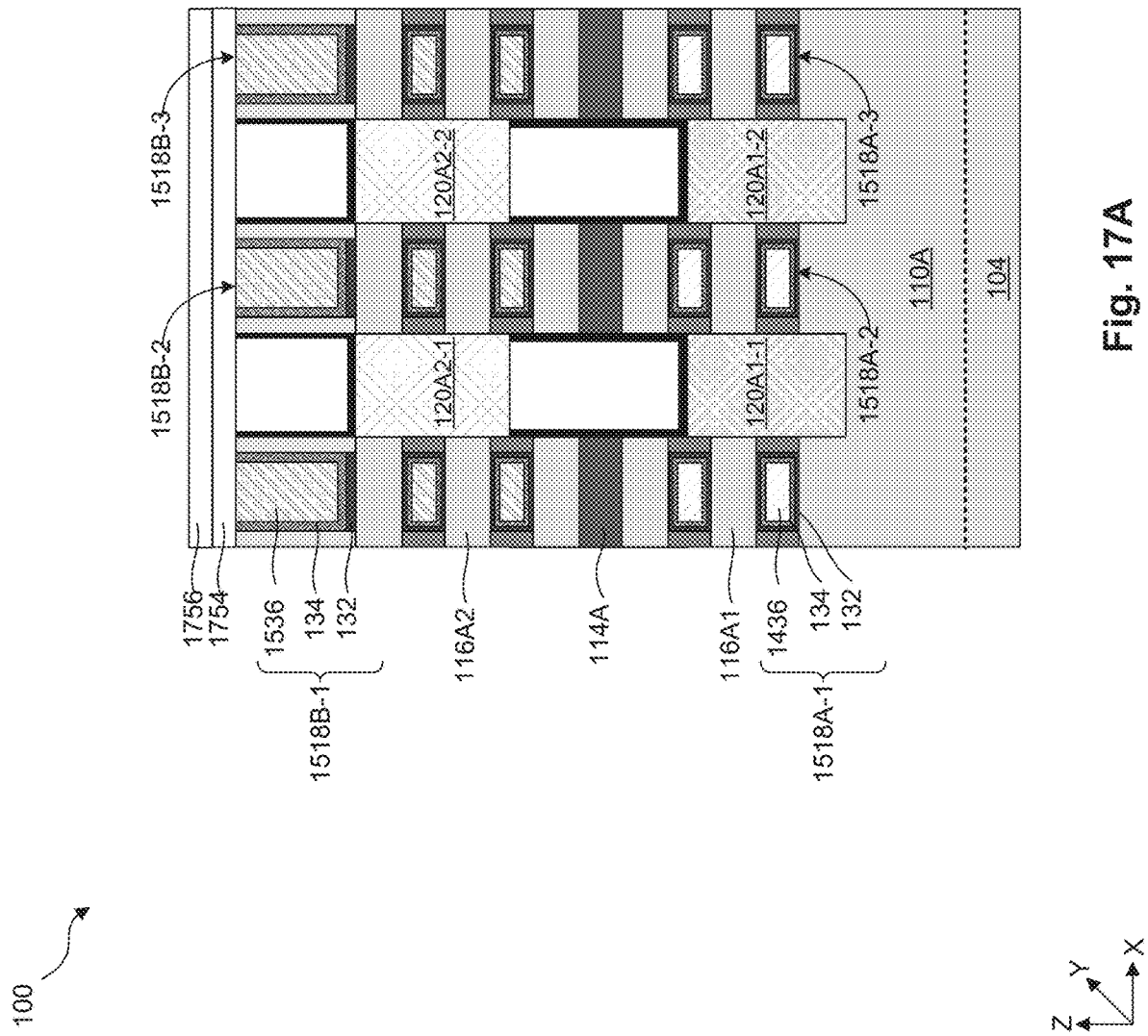
Figure 17B:
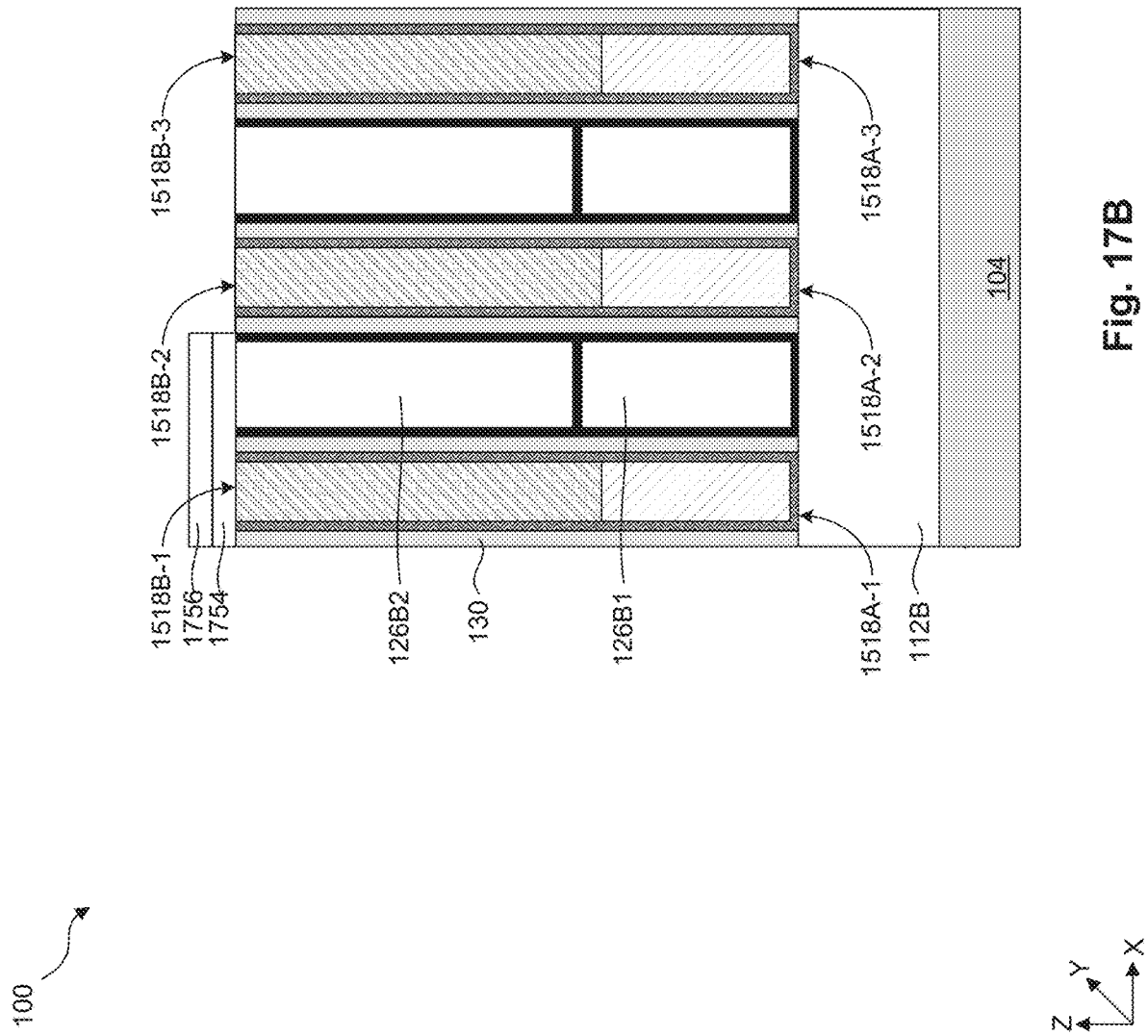
Figure 17C:
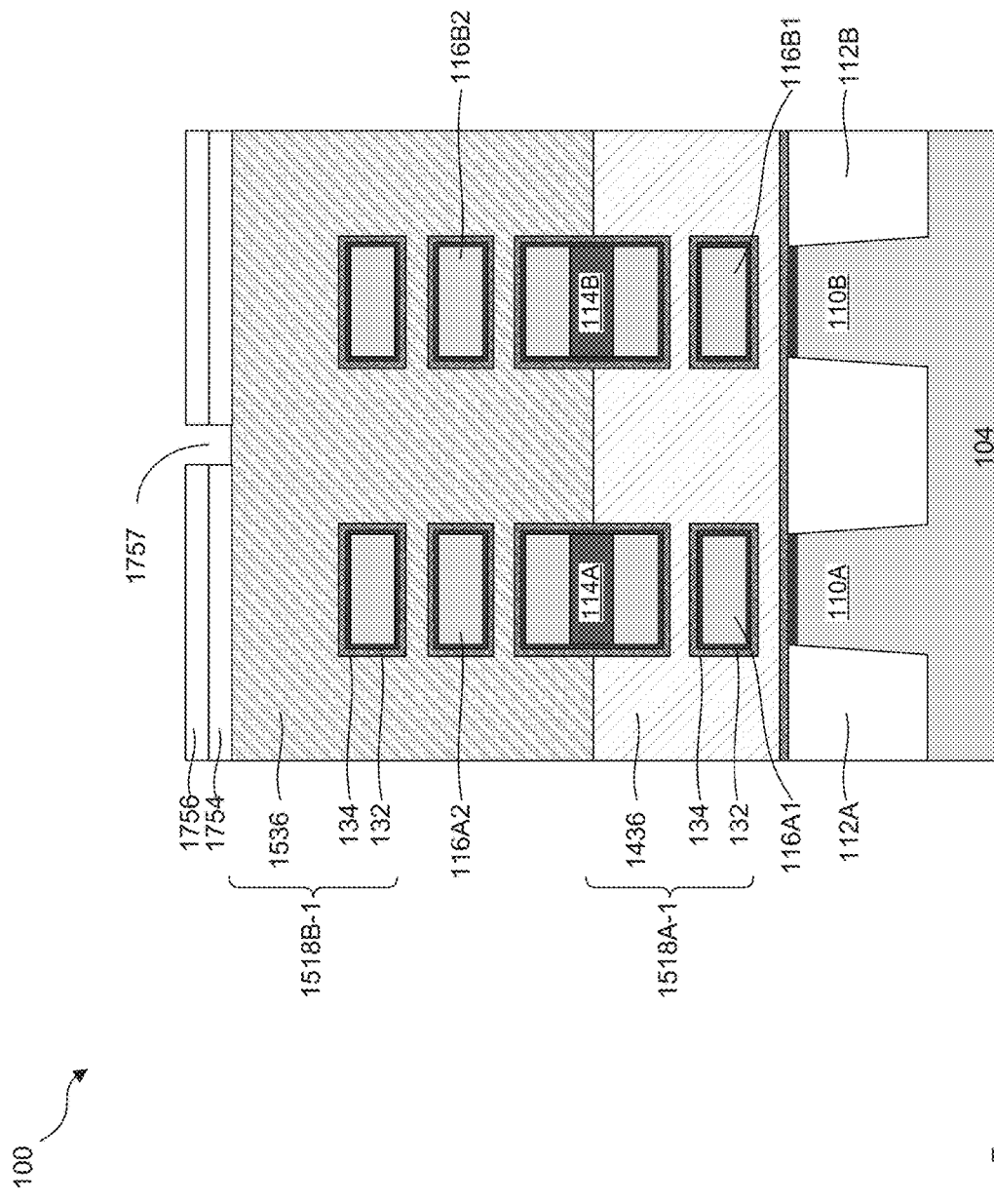
Figure 17D:
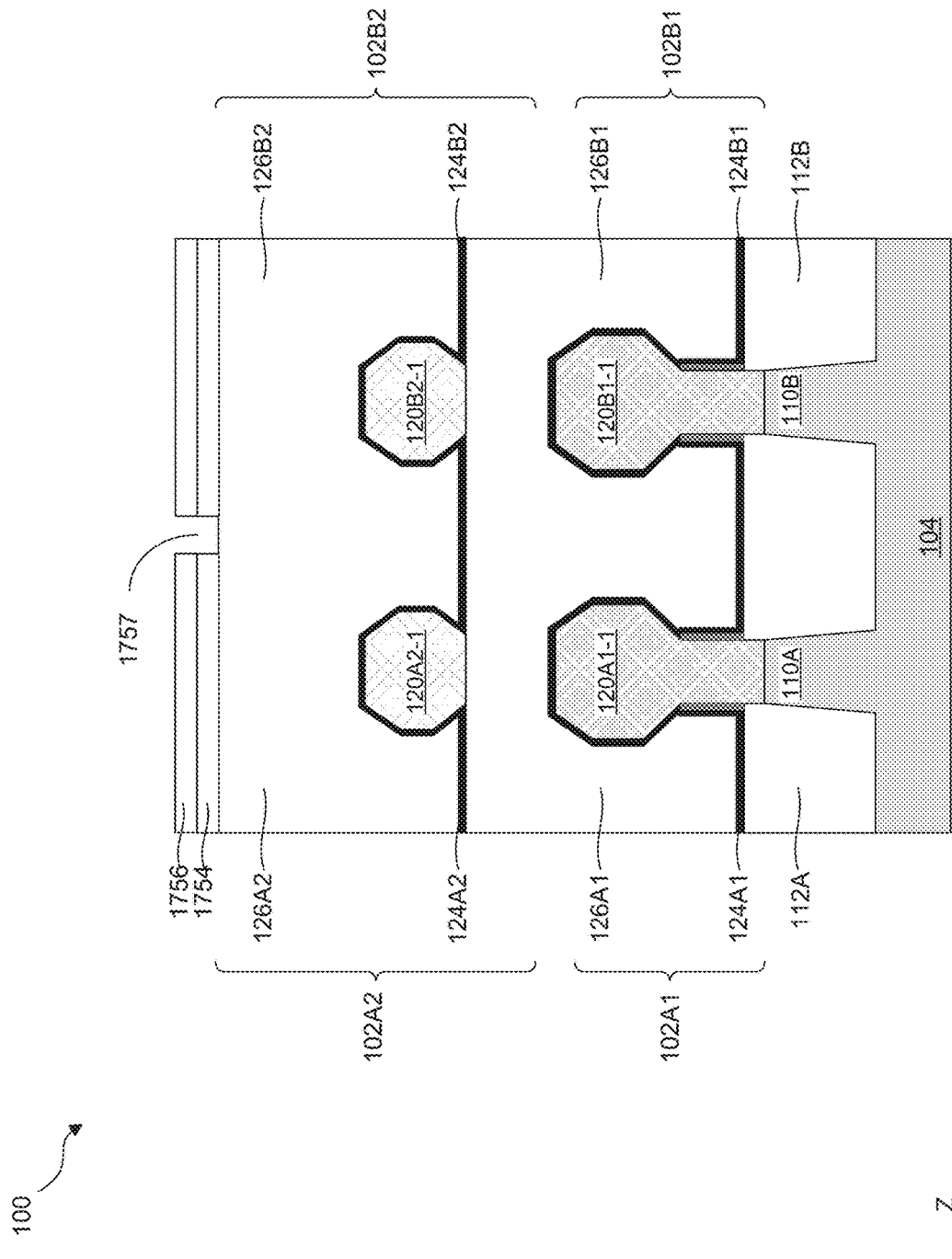
Figure 17E:
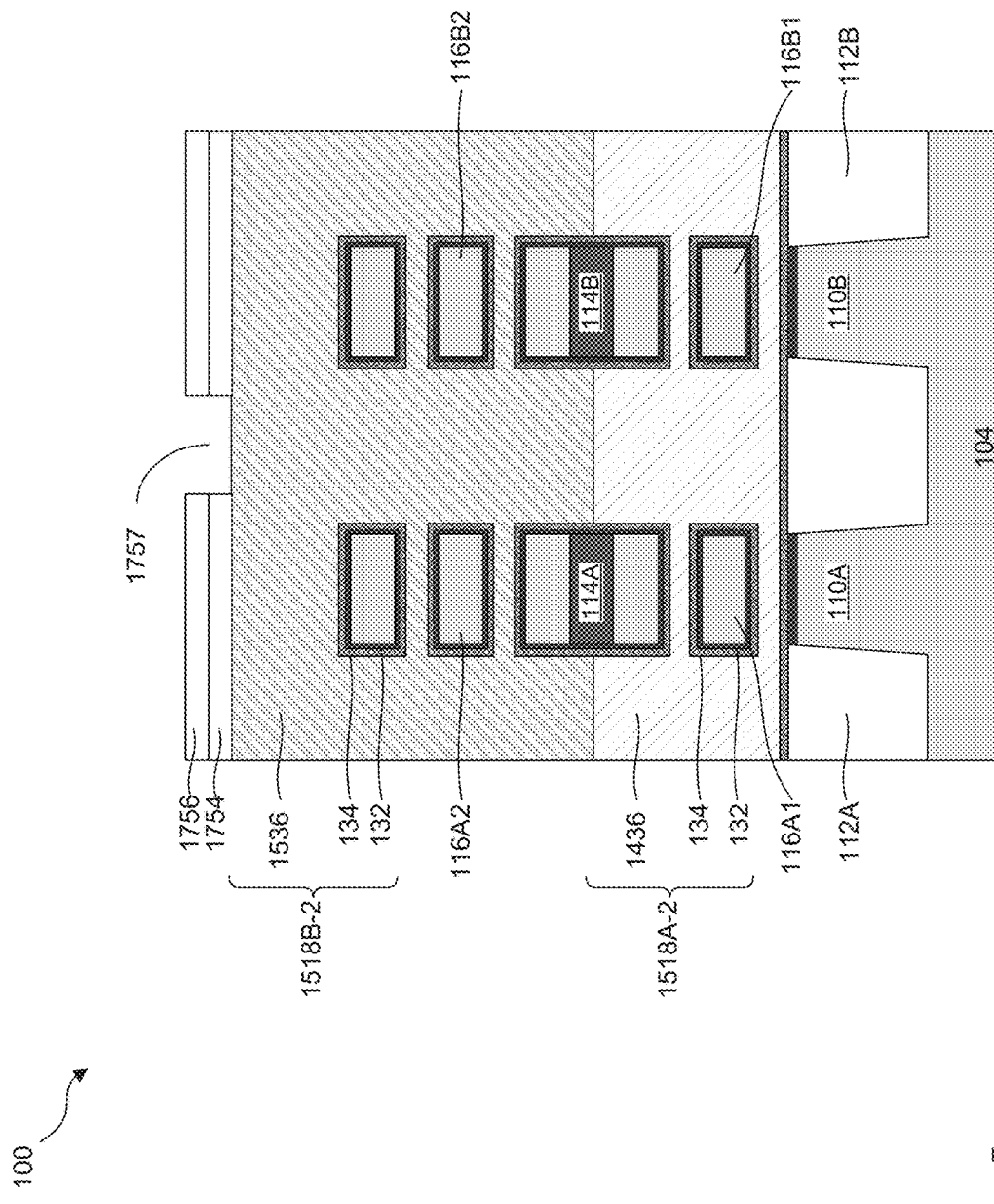
Figure 17F:
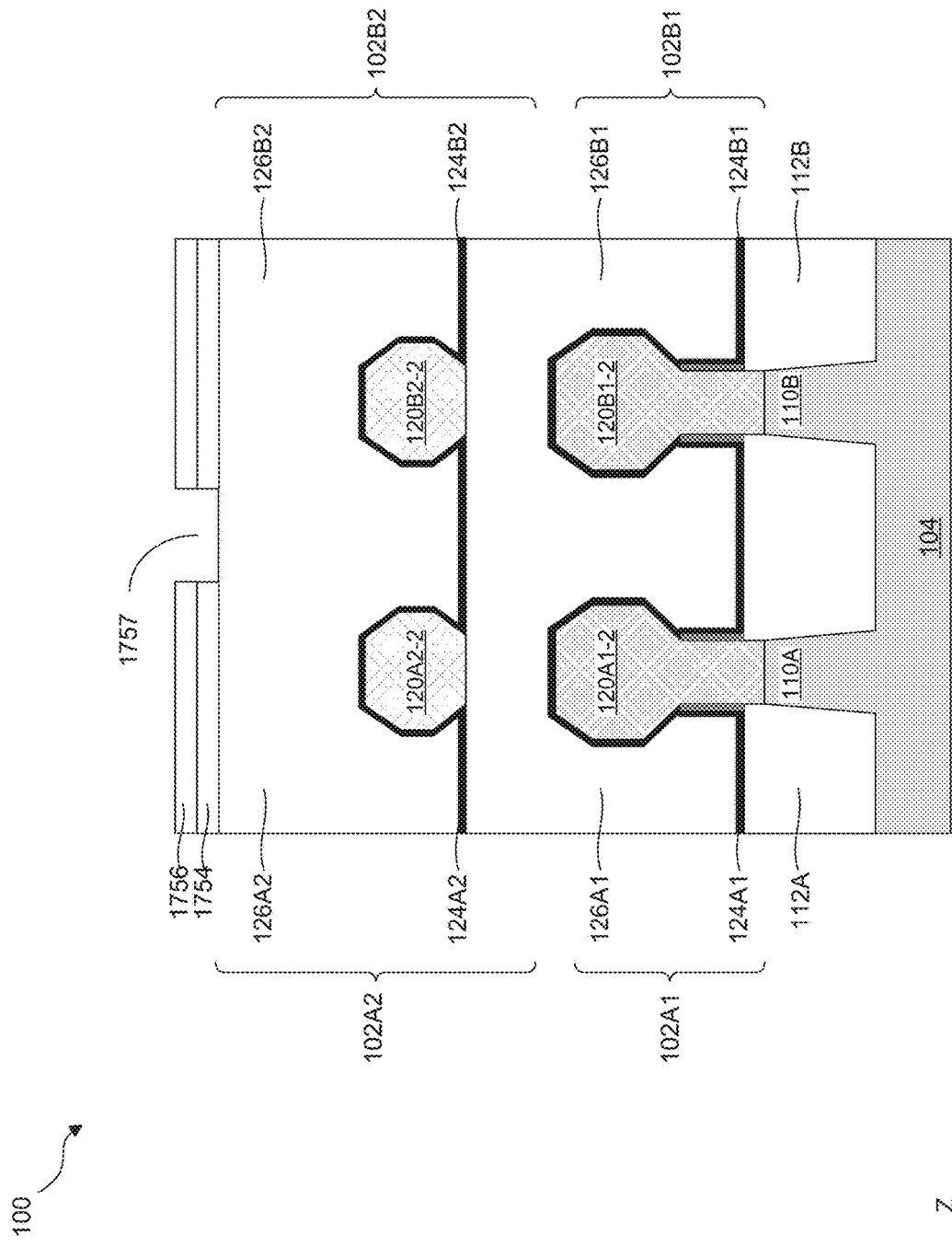
Figure 18A:
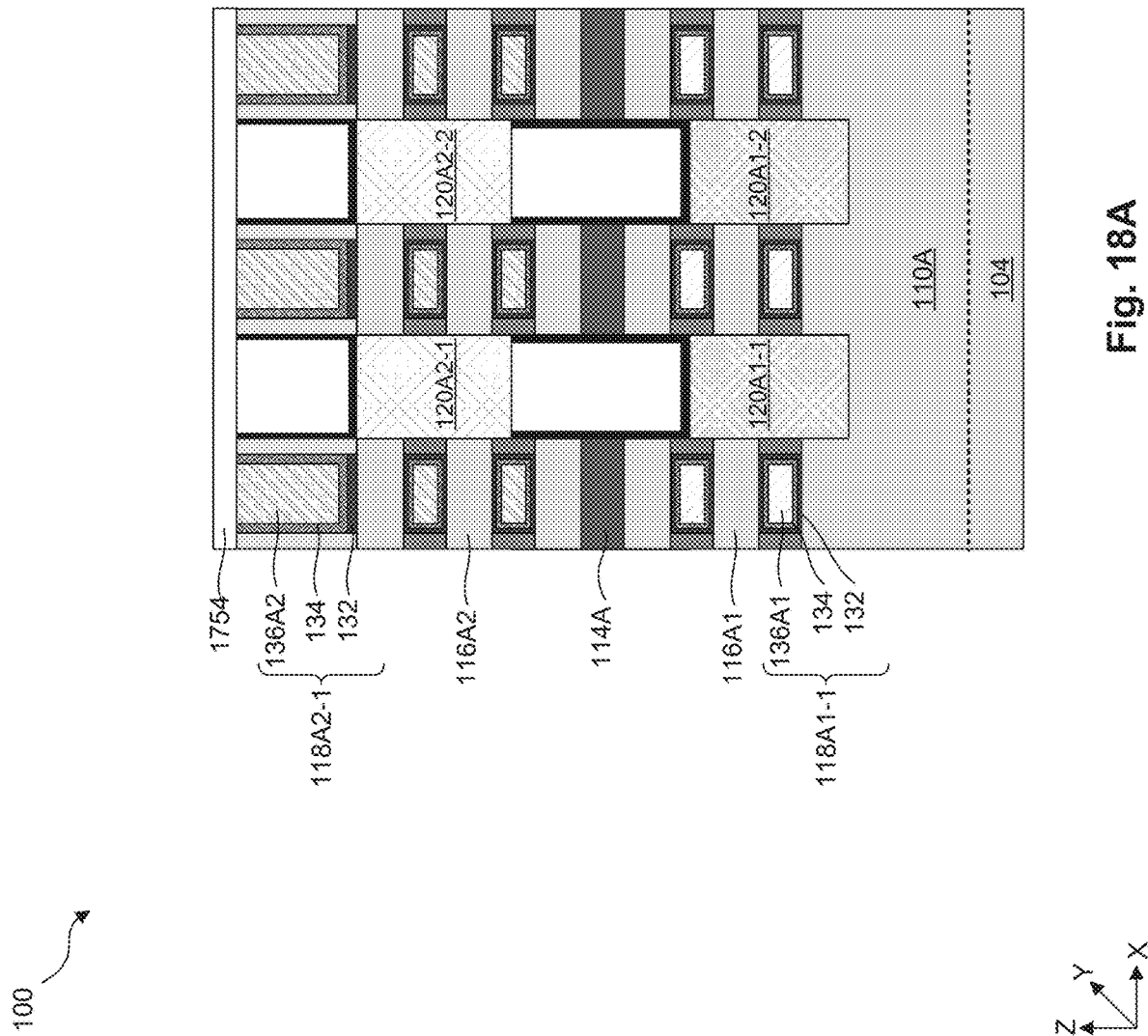
Figure 18B:
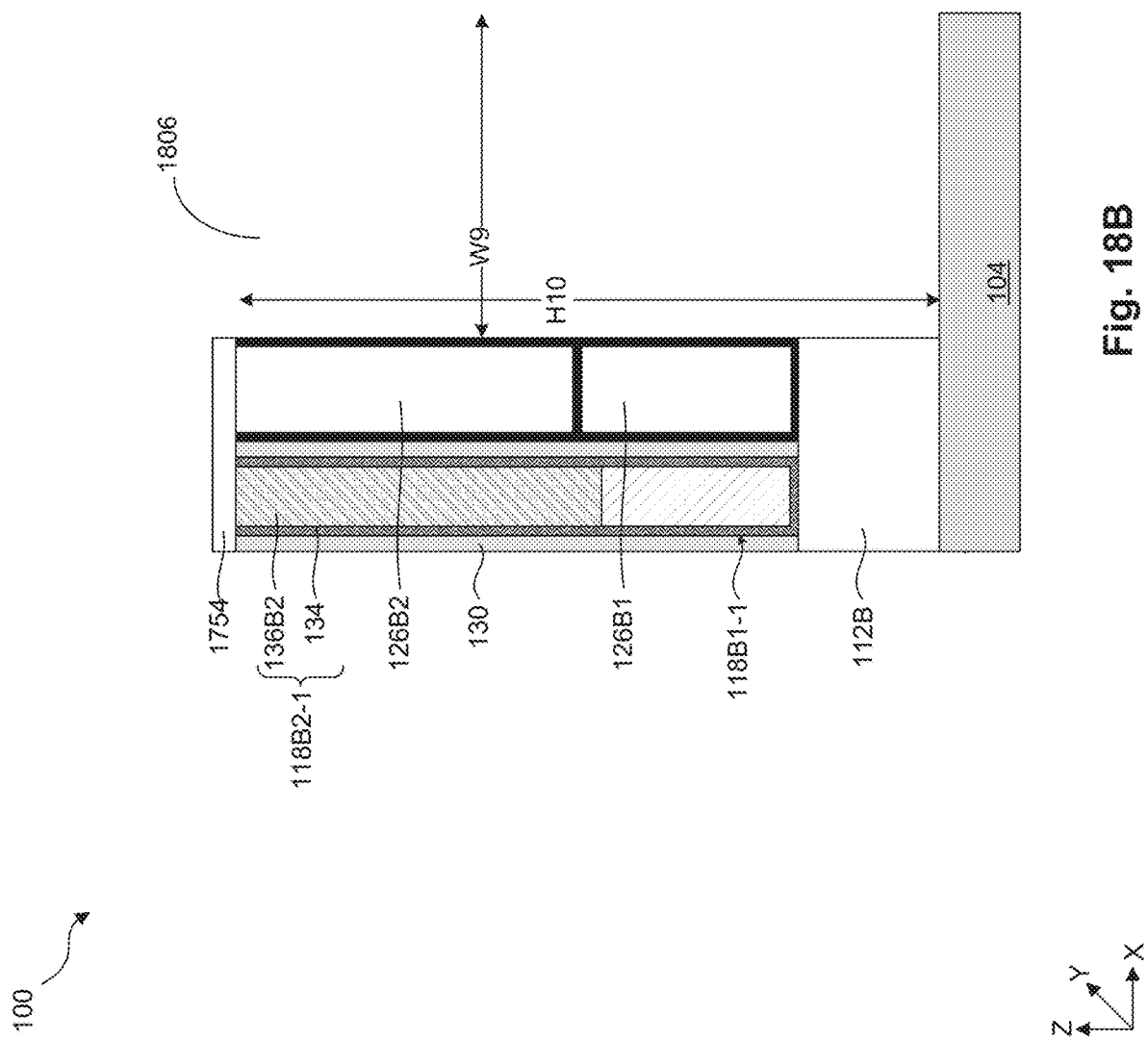
Figure 18C:
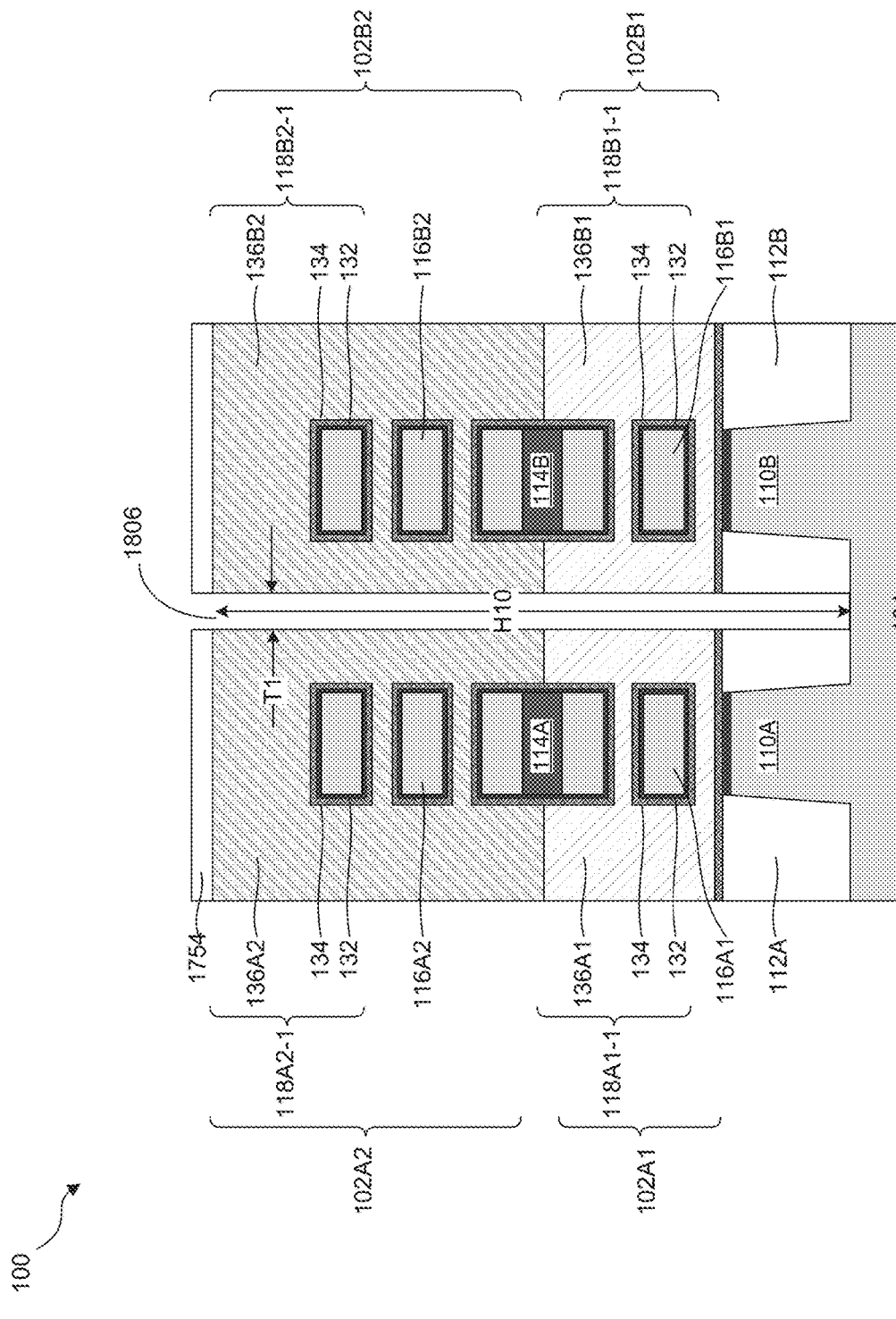
Figure 18D:
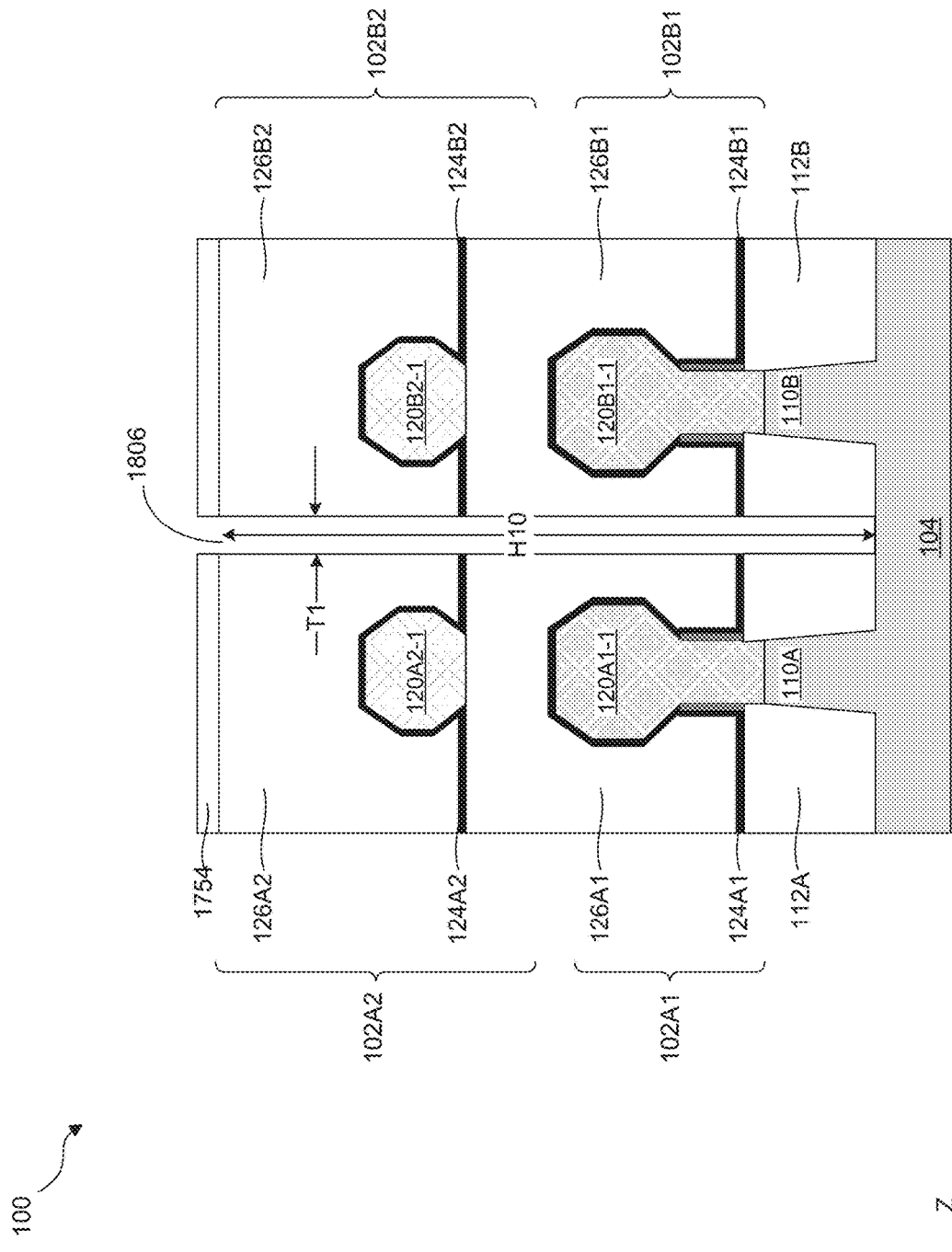
Figure 18E:
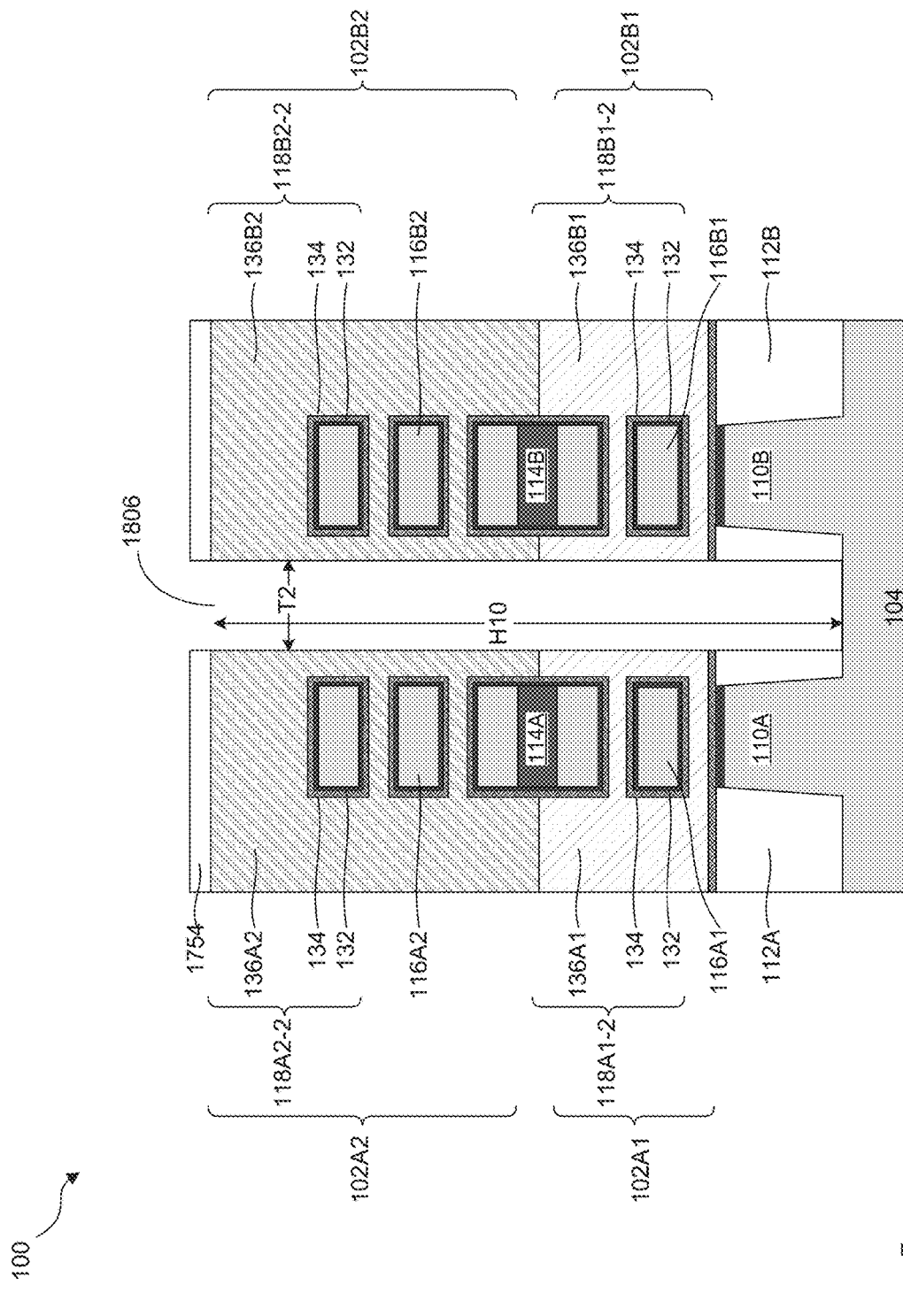
Figure 18F:
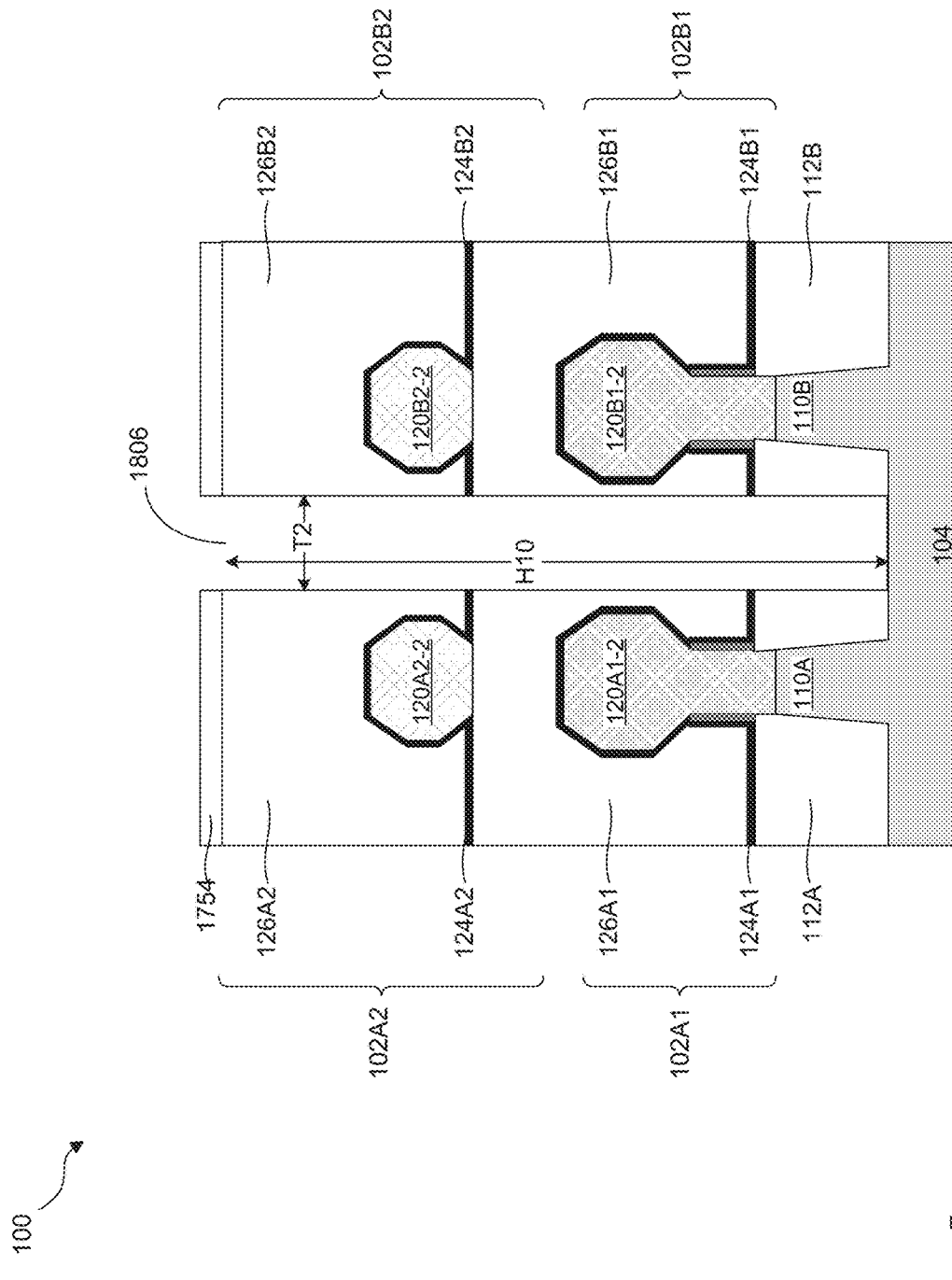

The formation of the bottom gate structures can include sequential operations of (i) forming gate openings 1318, as shown in FIGS. 13A-13B, by etching polysilicon structures 818 and nanostructured layers 748 from the structures of FIGS. 12A-12B, (ii) forming IL layers 132 on exposed regions of nanostructured layers 116A1-116A2 and 116B1-116B2 in gate openings 1318, as shown in FIGS. 14A-14B, (iii) depositing HK gate dielectric layers 134 on IL layers 132, as shown in FIGS. 14A-14B, (iv) depositing conductive layers 1436 on HK gate dielectric layers 134, as shown in FIGS. 14A-14B, and (v) etching conductive layers 1436 from gate openings 1318 above channel isolation layers 114A-114B to form bottom gate structures as shown in FIGS. 15A-15B. Conductive layers 1436 can have a material similar to that of conductive layers 136A1 discussed above. The formation of the top gate structures can include depositing conductive layers 1536 in gate openings 1318 above channel isolation layers 114A-114B, followed by a chemical mechanical polishing (CMP) process to form the top gate structures shown in FIGS. 16A-16C and 16E. The formation of the top gate structures can be followed by the formation of ESLs 124A2-124B2 and ILD layers 126A2-126B2 on the top S/D regions, as shown in FIGS. 16D and 16F.

Referring to FIG. 6, in operation 625, an isolation trench is formed to cut the top and bottom gate structures into shorter gate structures. For example, as described with reference to FIGS. 17A-18F, an isolation trench 1806 is formed through the top and bottom gate structures to cut the top and bottom gate structures into shorter gate structures of GAA FETs 102A1-102A2 and 102B1-102B2. The formation of isolation trench 1806 through the top and bottom gate structures can be referred to as the "CMG process."

The formation of isolation trench 1806 can include sequential operations of (i) depositing a nitride layer 1754 on the structures of FIGS. 16A-16F, (ii) depositing a photoresist layer 1756 on nitride layer 1754, (iii) forming openings 1757 in nitride layer 1754 and photoresist layer 1756 using a lithographic patterning process and an etching process, as shown in FIGS. 17A-17F, (iv) etching portions of the top and bottom gate structures, ESLs 124A1-124B2, ILD layers 126A1-126B2, and STI regions 112A-112B through openings 1757 in patterned nitride layer 1754 and patterned photoresist layer 1756 to form isolation trench 1806, as shown in FIGS. 18B-18F. Isolation trench 1806 is not visible in the cross-sectional view of FIG. 18A. In subsequent processing, (i) the portion of isolation trench 1806 visible in FIG. 18B can form the portions of isolation structure 106 and vertical interconnect structure 108 shown along line B-B in FIG. 1H, (ii) the portion of isolation trench 1806 visible in FIGS. 18C and 18D can form the portions of isolation structure 106 shown along lines C-C and D-D, respectively in FIG. 1H, and (iii) the portion of isolation trench 1806 visible in FIGS. 18E and 18F can form the portions of isolation structure 106 and vertical interconnect structure 108 shown along lines E-E and F—F, respectively in FIG. 1H.

In some embodiments, the formation of isolation trench 1806 includes forming a first portion (shown in FIGS. 18C-18D) with a dimension T1 and a second portion (shown in FIGS. 18E-18F) with a dimension T2, which is greater than dimension T1. The first portion of isolation trench 1806 corresponds to the subsequently-formed dielectric fill portion 106A (shown in FIGS. 20C-20D) and the second portion of the isolation trench 1806 corresponds to the subsequently-formed dielectric liner portion 106B (shown in FIGS. 20E-20F). In some embodiments, isolation trench 1806 can be formed with a height H10 of about 180 nm to about 220 nm, dimension T1 of about 10 nm to about 20 nm, and dimension T2 of about 30 nm to about 40 nm. These ranges of height H10 and dimension T1-T2 can provide the first portion of isolation trench with an aspect ratio (e.g., H10:T1) of about 9 to about 22 and the second portion of isolation trench with an aspect ratio (e.g., H10:T2) of about 5 to about 7 without compromising device size and manufacturing cost. Within these aspect ratio ranges, fabrication defects (e.g., voids) in subsequently-formed isolation structure 106 and vertical interconnect structure 108 can be prevented or minimized.

Figure 19A:
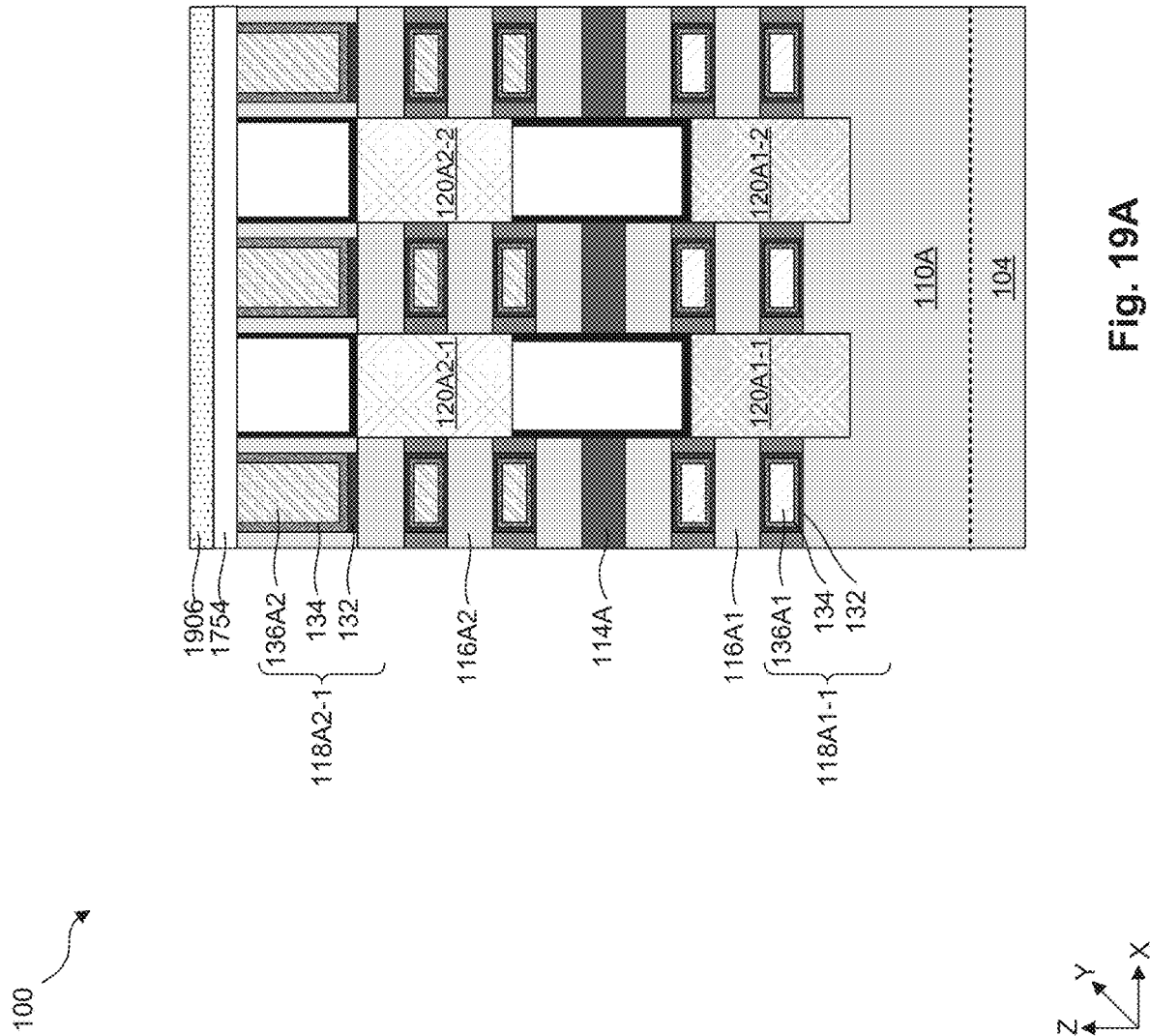
Figure 19B:
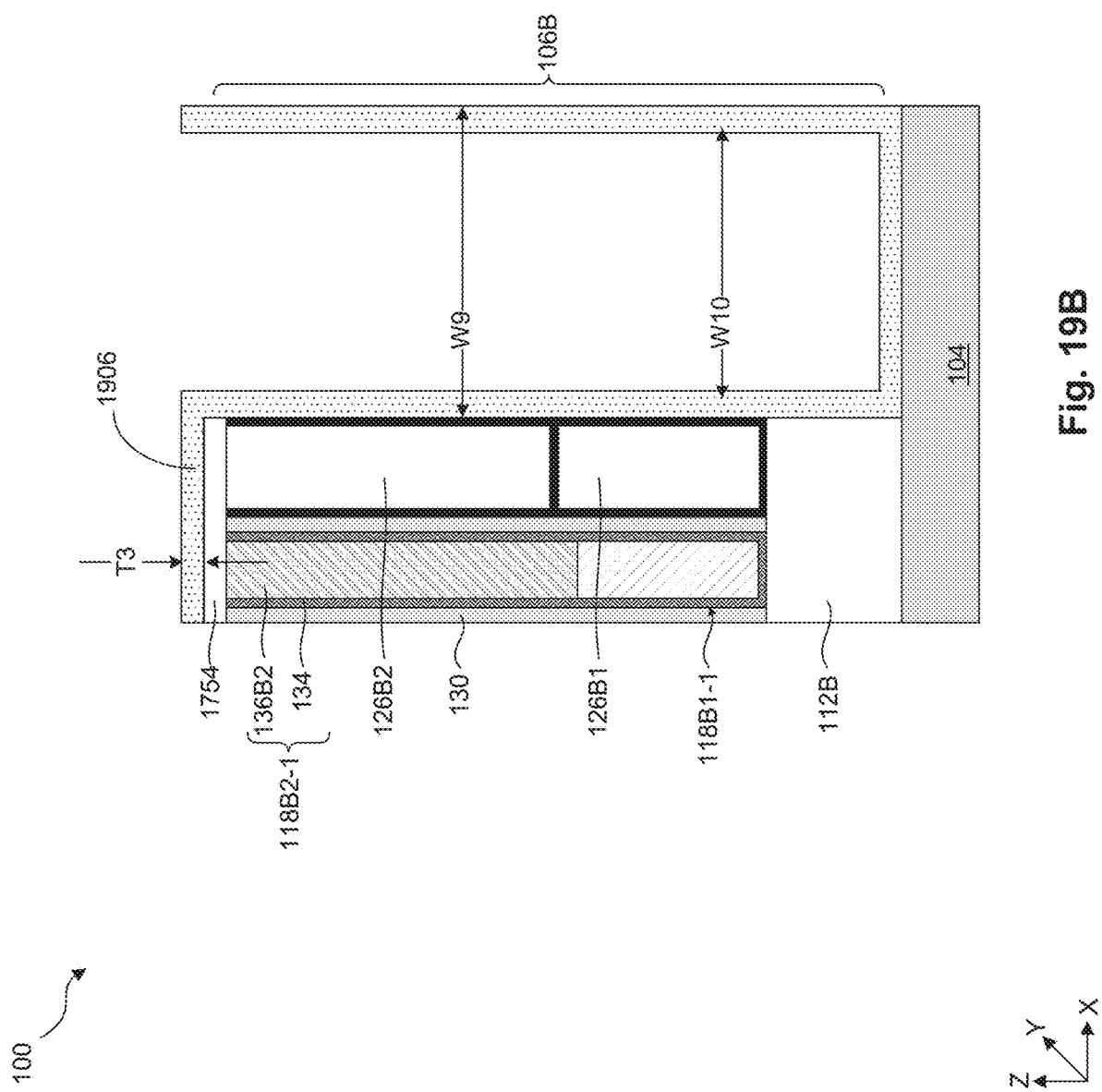
Figure 19C:
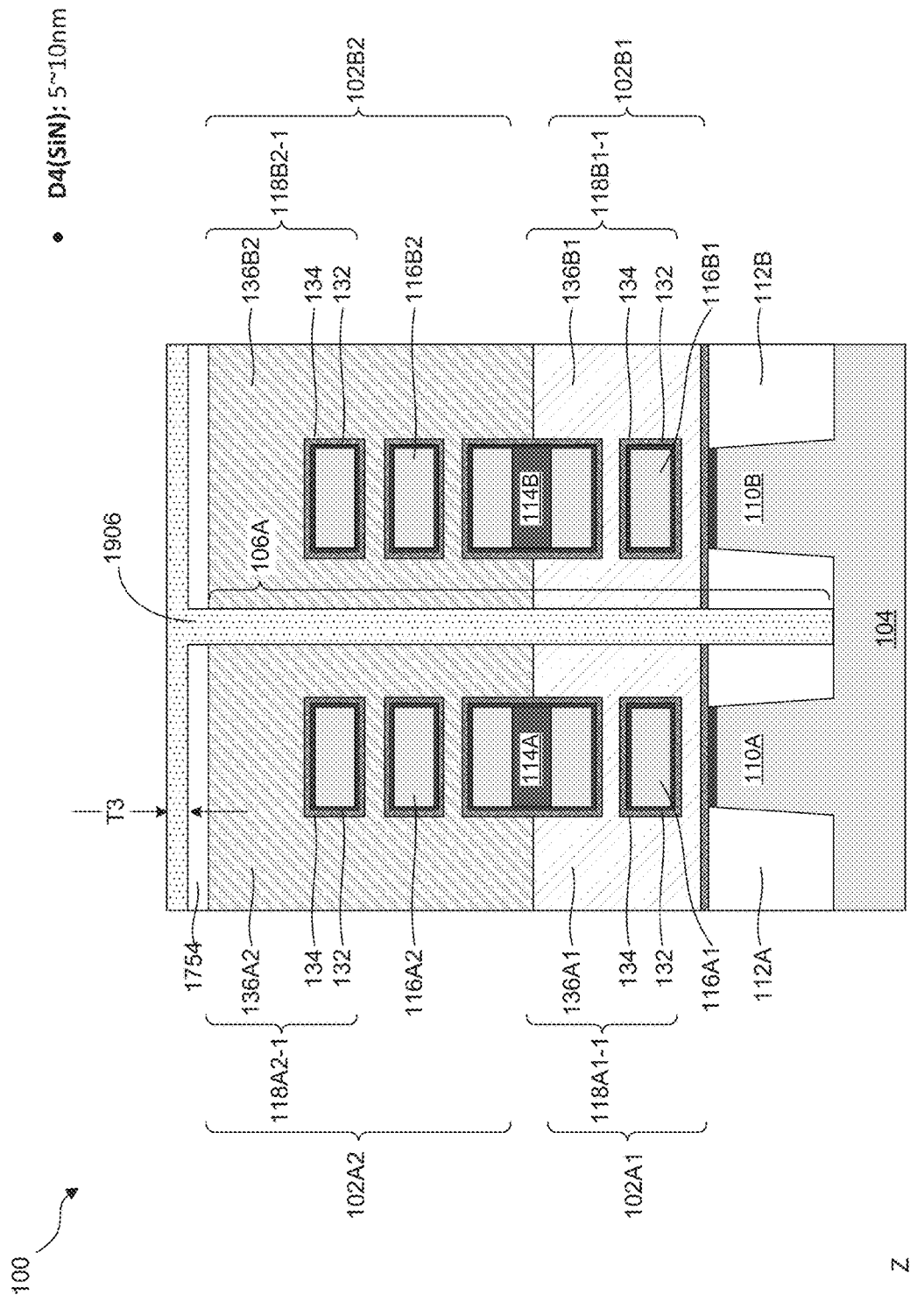
Figure 19D:
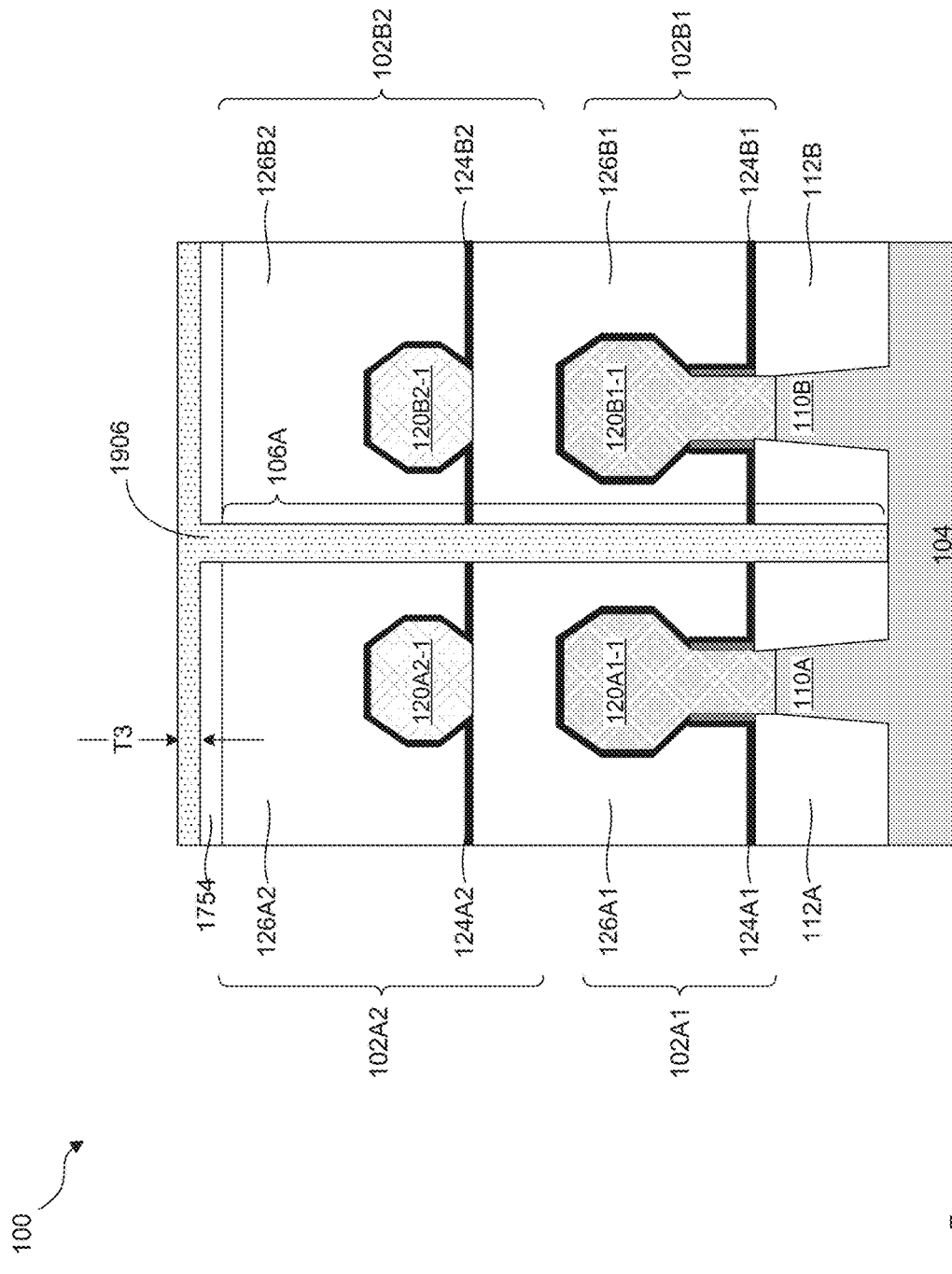
Figure 19E:
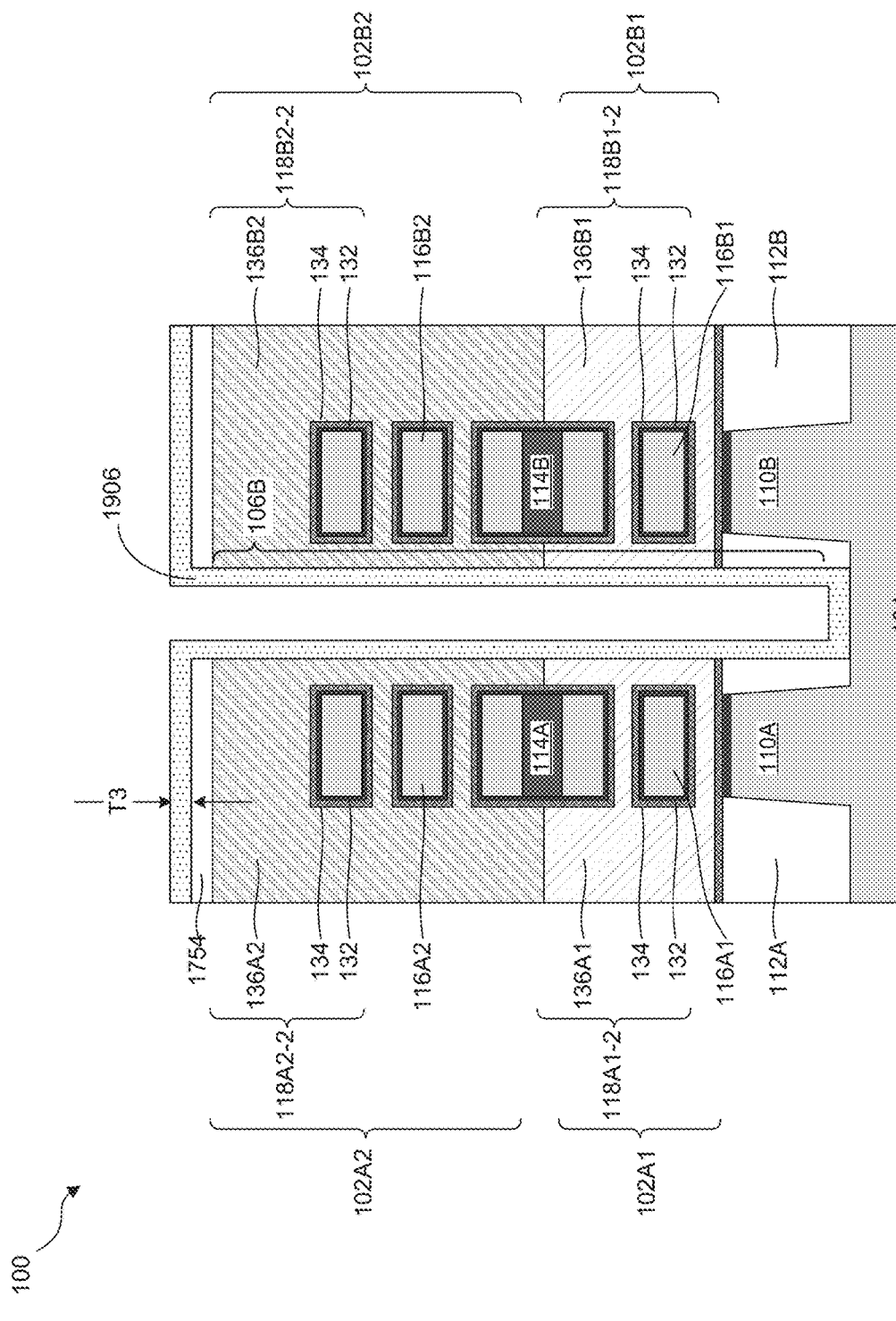
Figure 19F:
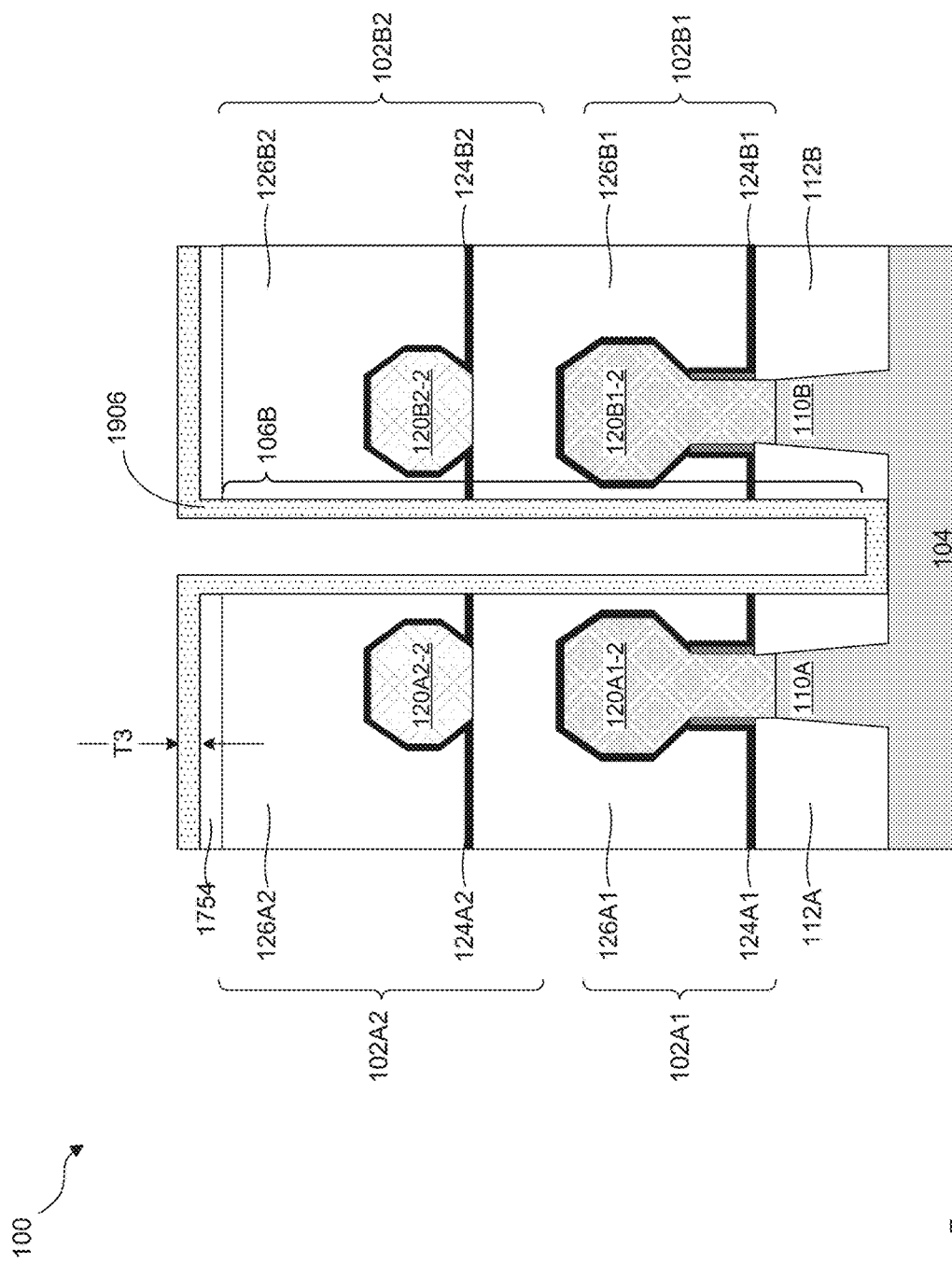

Referring to FIG. 6, in operation 630, an isolation structure with a fill portion and a liner portion is formed in the isolation trench. For example, as described with reference to FIGS. 19B-19F, isolation structure 106 with dielectric fill portion 106A and dielectric liner portion 106B are formed in the first and second portions of isolation trench 1806, respectively. The formation of dielectric fill portion 106A and dielectric liner portion 106B can include depositing a nitride layer 1906 with a thickness T3 of about 5 nm to about 10 nm on the structures of FIGS. 18A-18F to form the structures of FIGS. 19A-19F. This range of thickness T3 can facilitate the merging of nitride layer 1906 deposited on sidewalls of the first portion of isolation trench 1806 to form dielectric fill portion 106A, as shown in FIGS. 19C-19D. Below this range of thickness T3, nitride layer 1906 deposited on sidewalls of the first portion of isolation trench 1806 may not merge to fill the first portion of isolation trench 1806. On the other hand, above this range of thickness T3, nitride layer 1906 may form an overhang at the opening of the first portion of isolation trench 1806 and constrict or close the opening of the first portion, thus preventing the first portion of isolation trench 1806 from being adequately filled with nitride layer 1906.

Figure 20A:
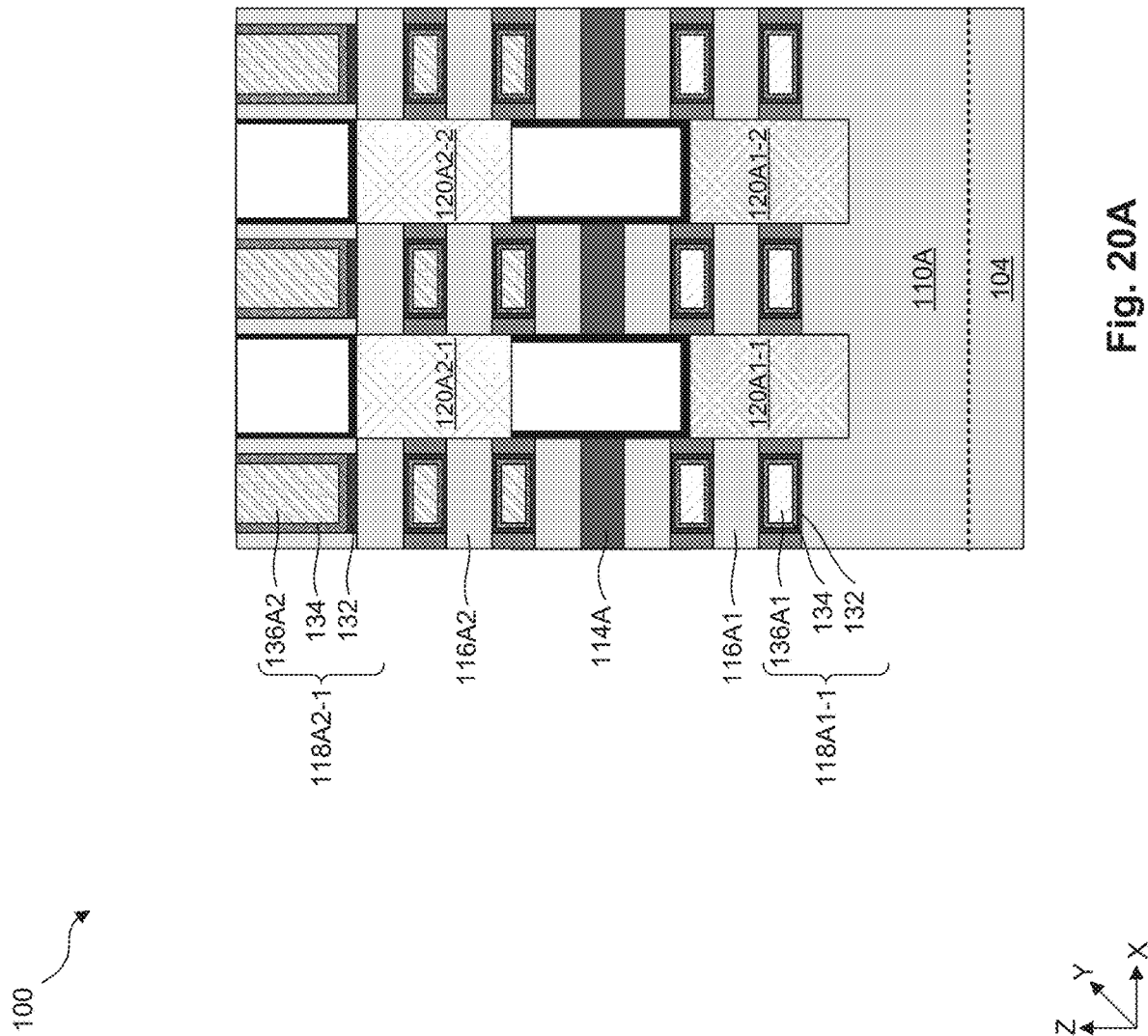
Figure 20B:
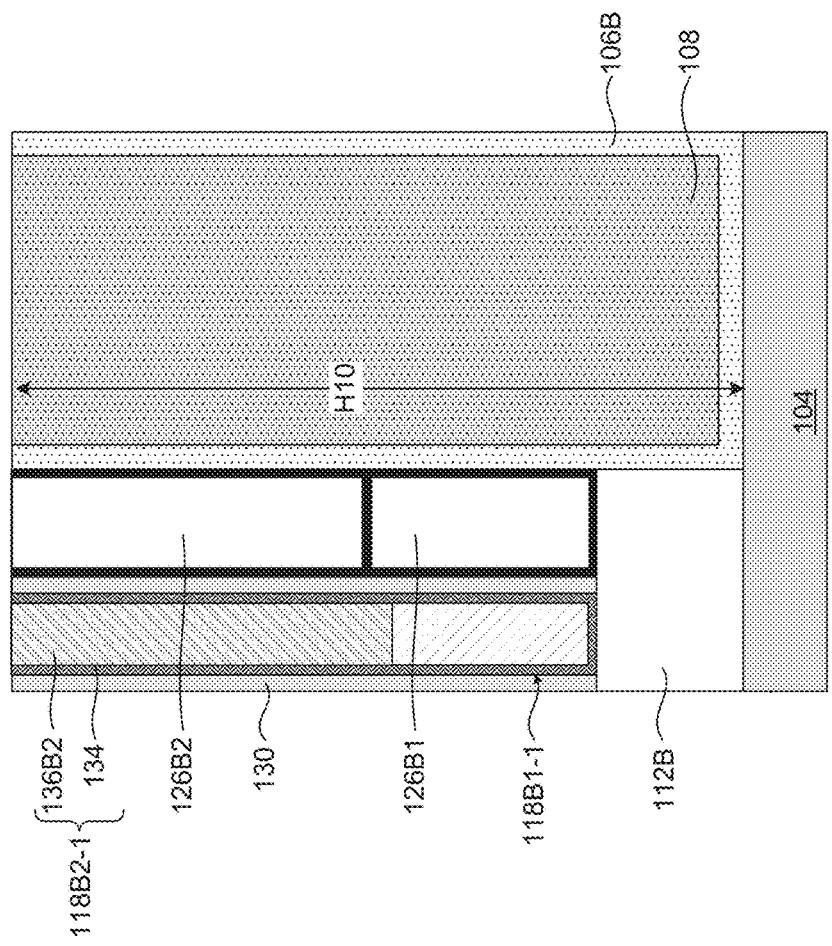
Figure 20C:
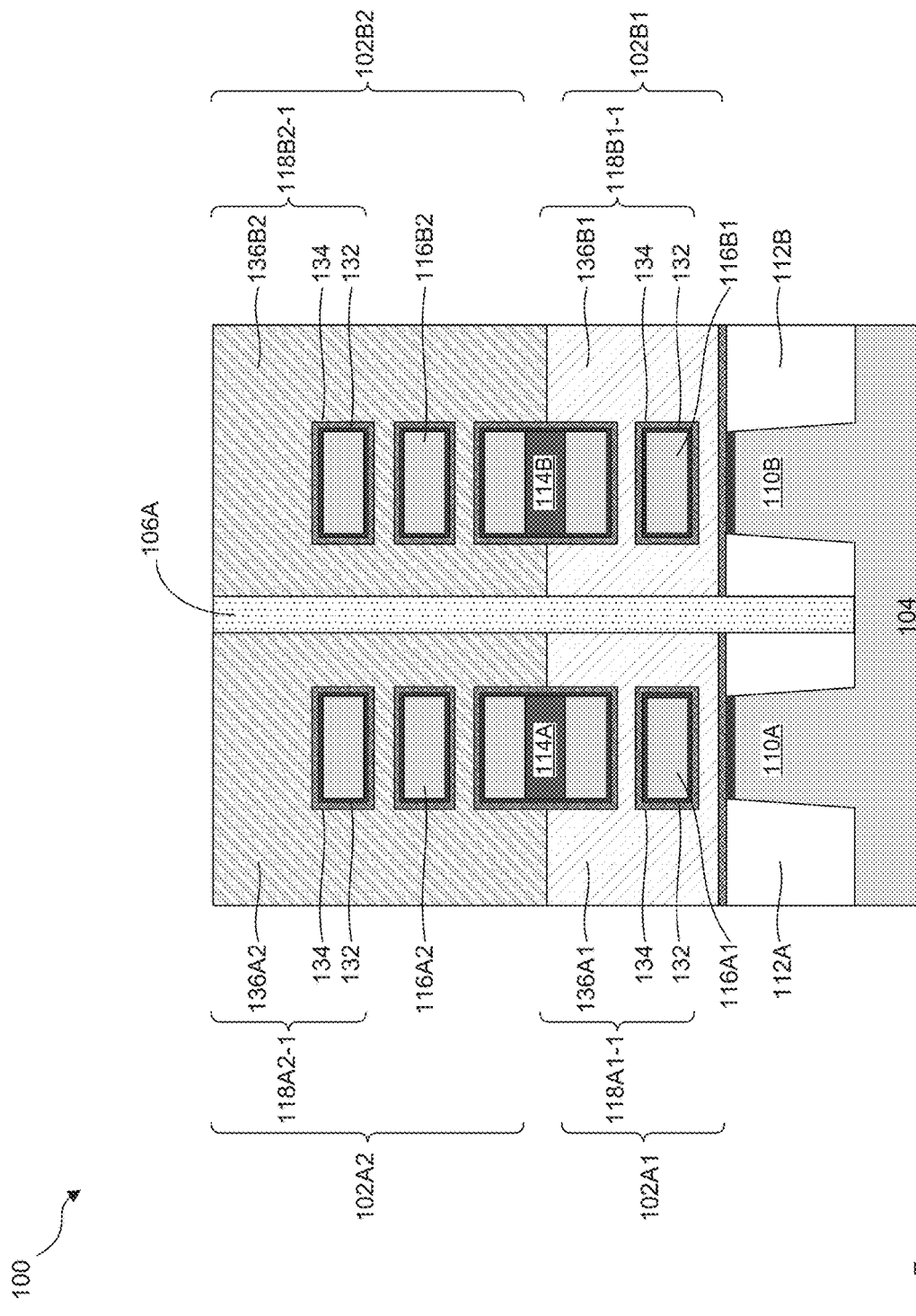
Figure 20D:
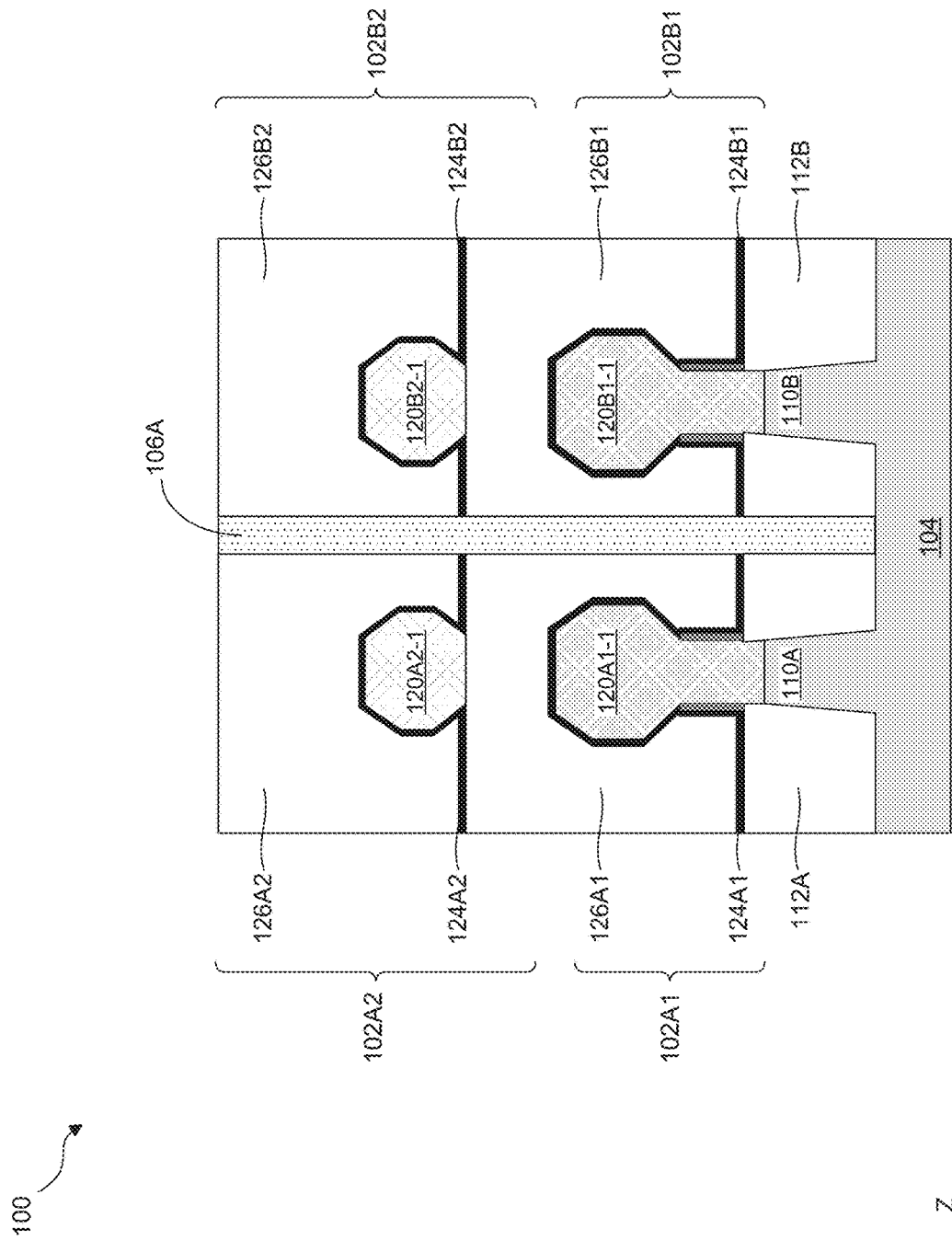
Figure 20E:
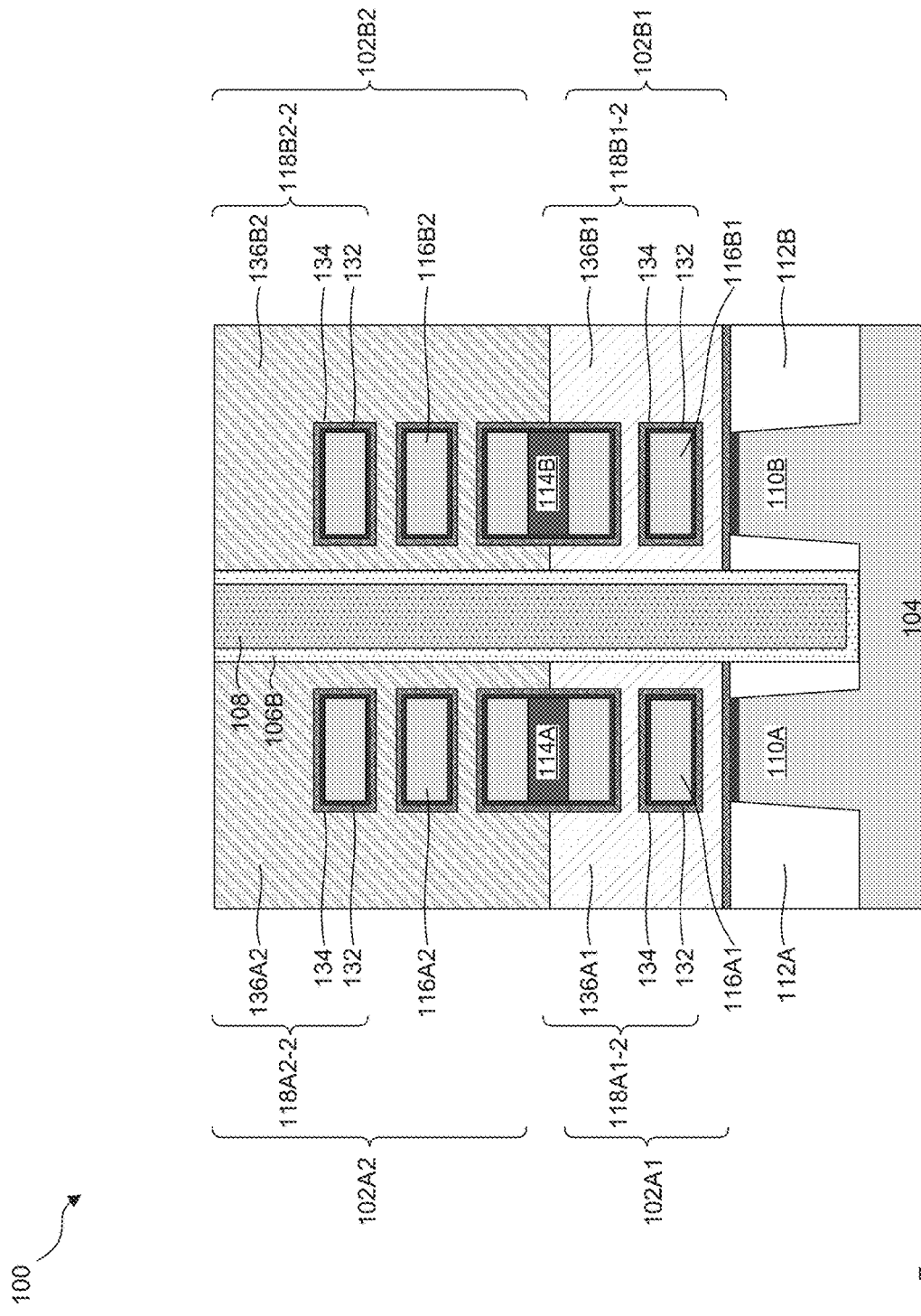
Figure 20F:
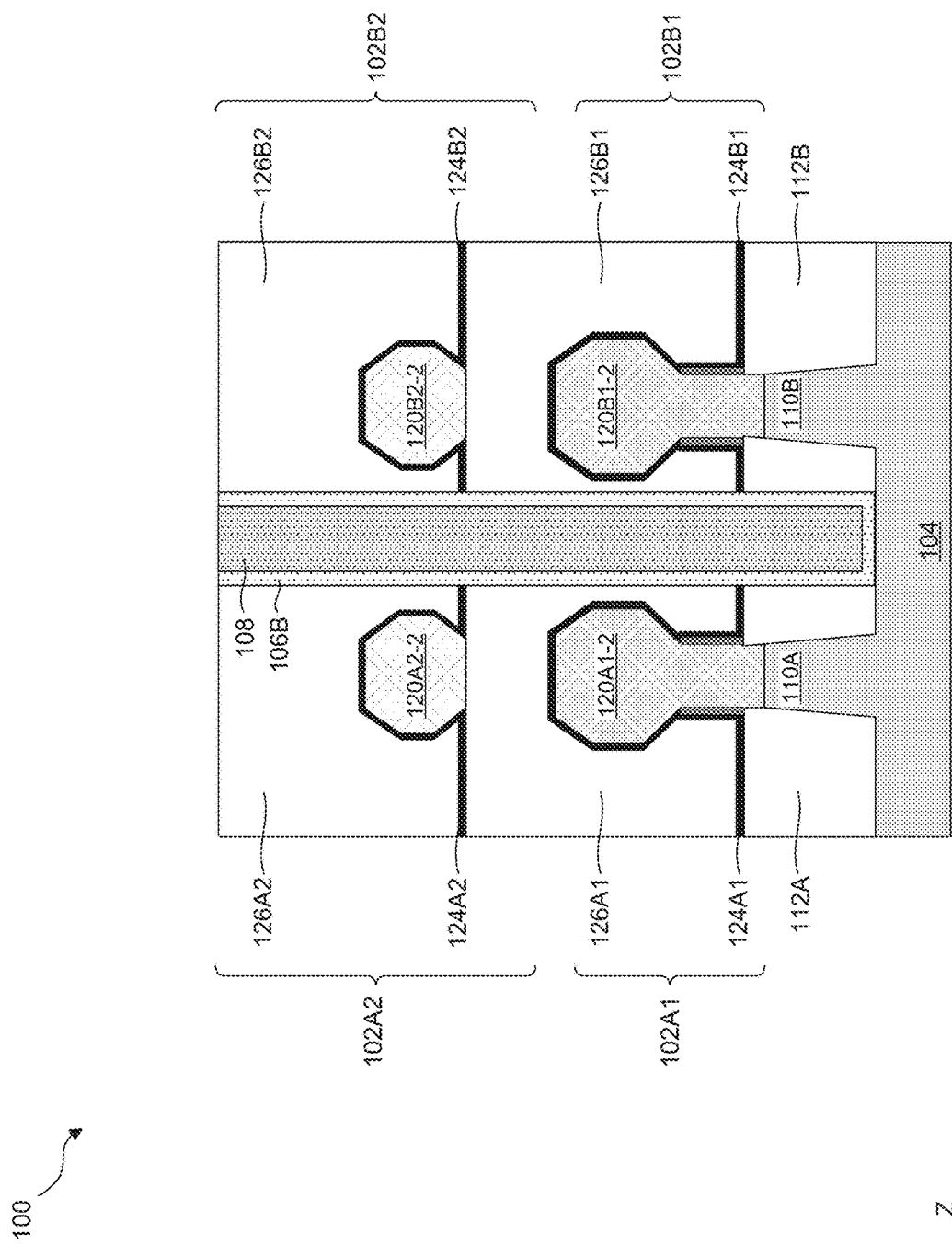
Figure 21A:
Figure 21B:
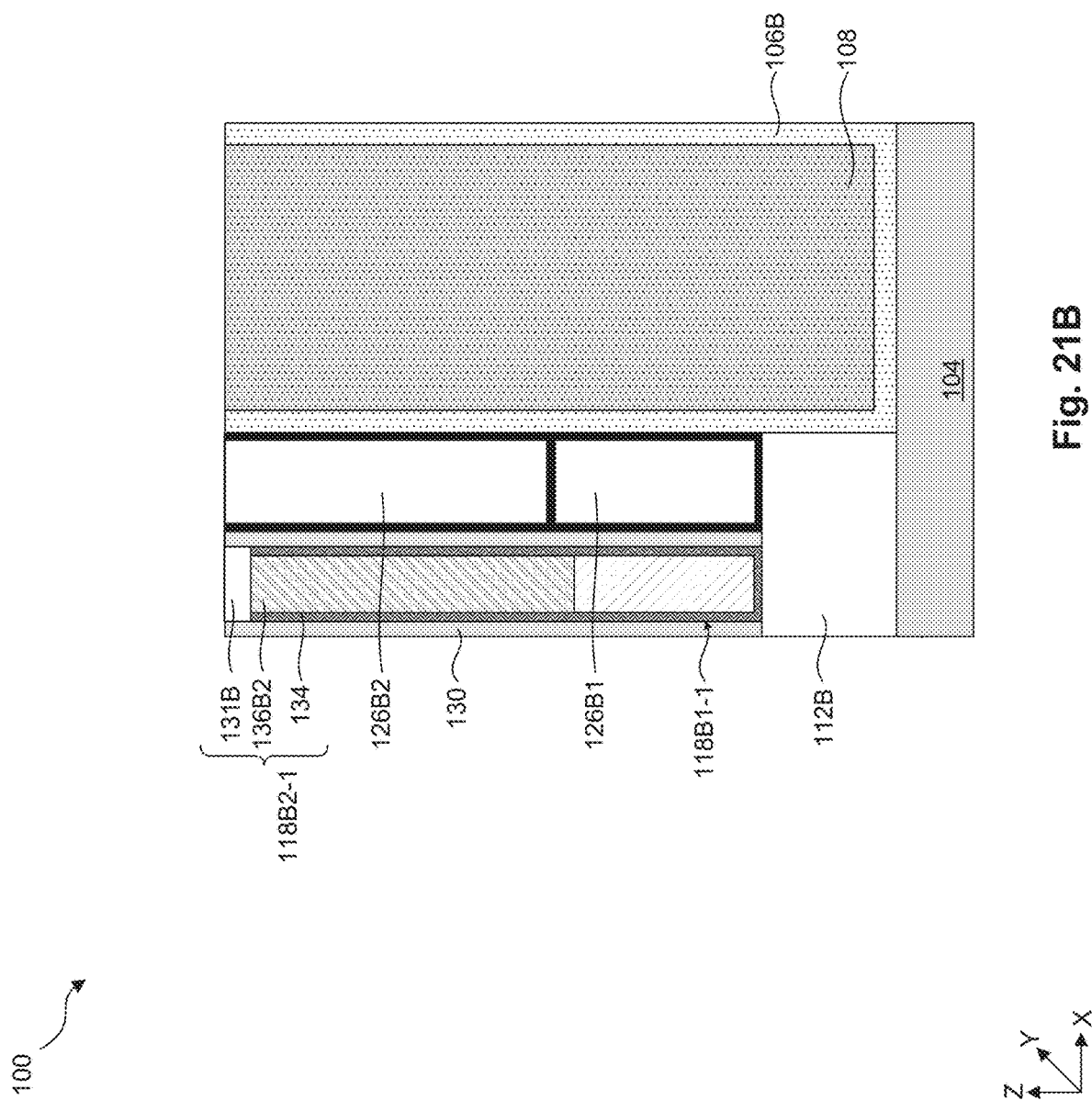
Figure 21C:
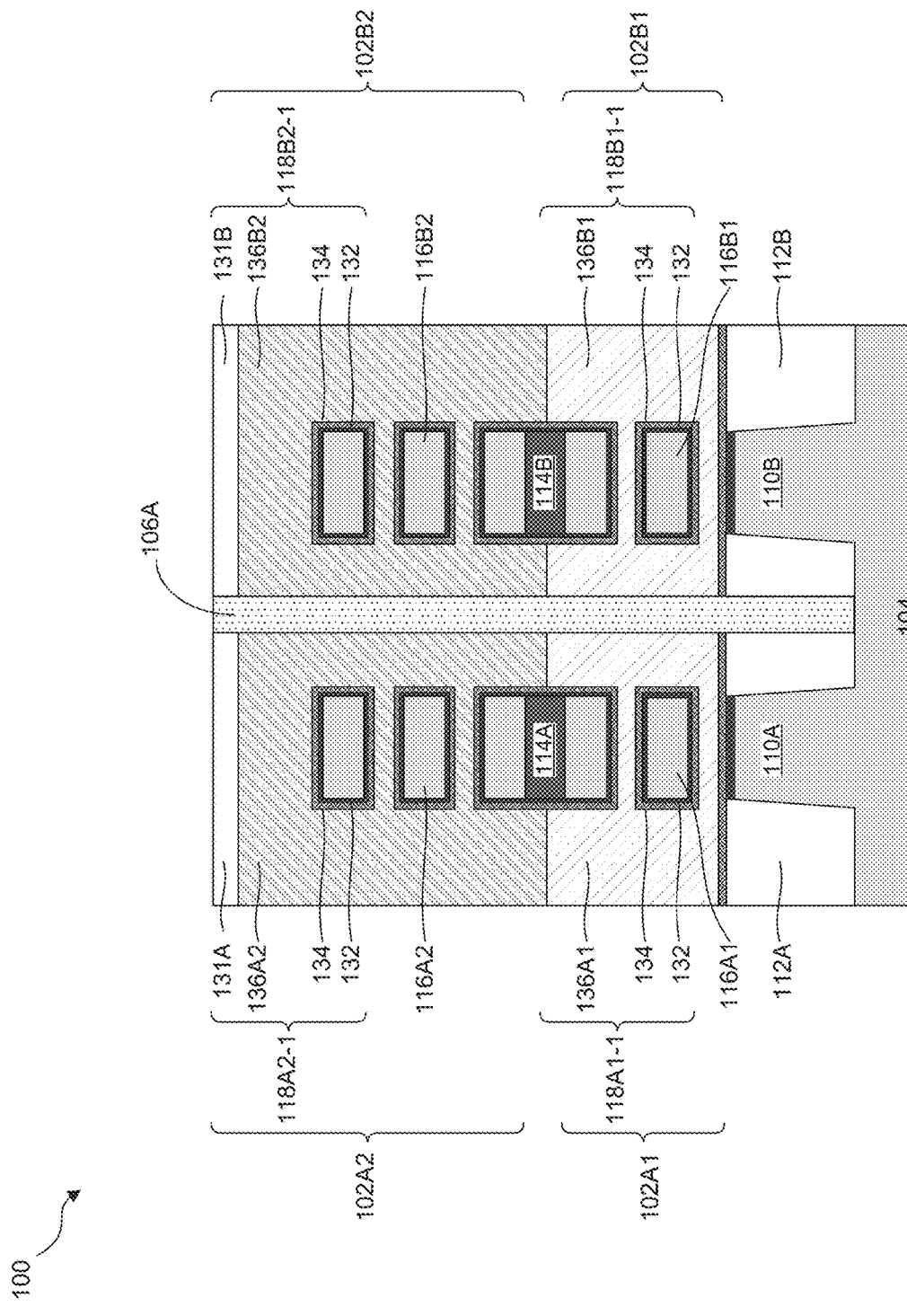
Figure 21D:
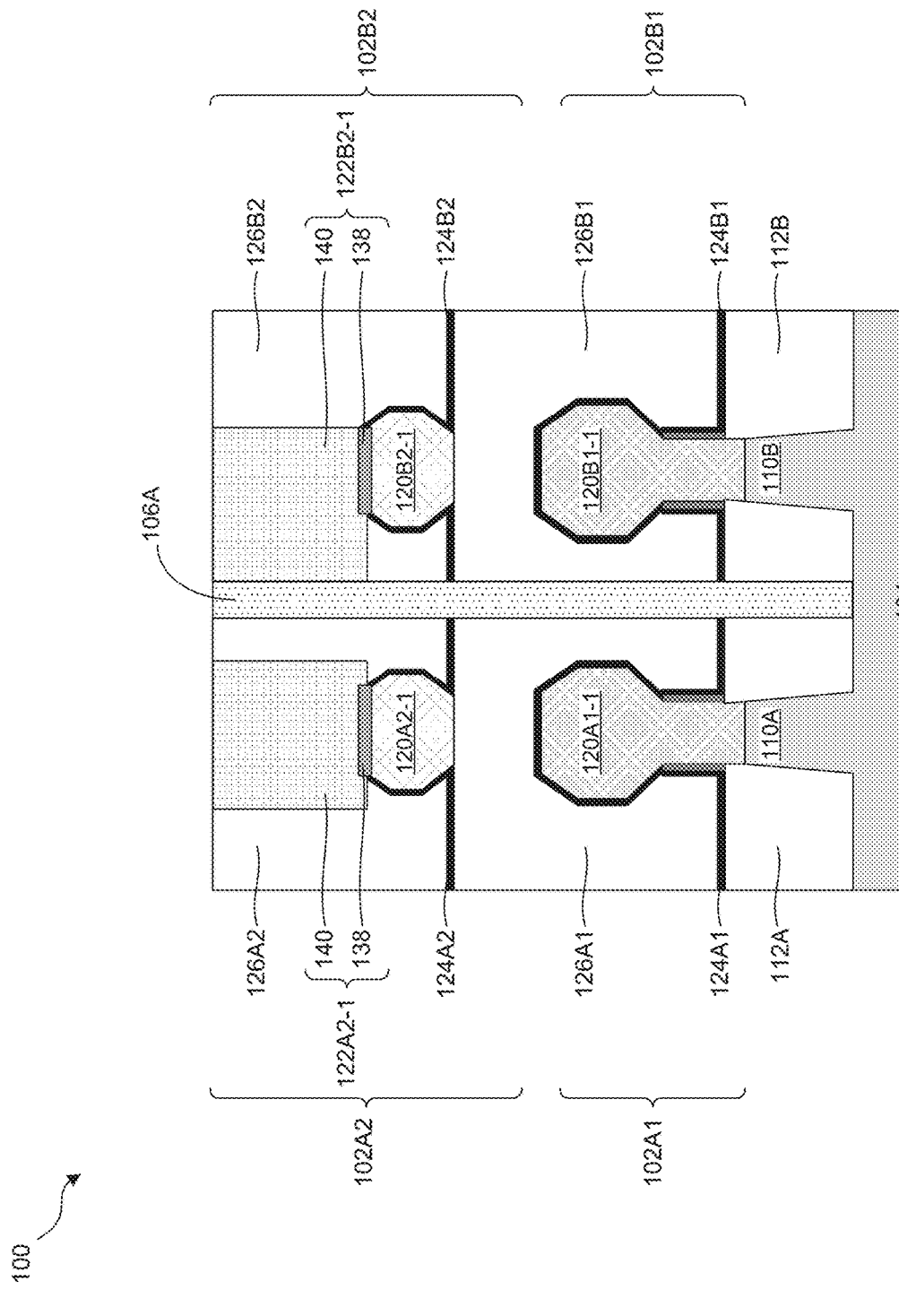
Figure 21E:
Figure 21F:
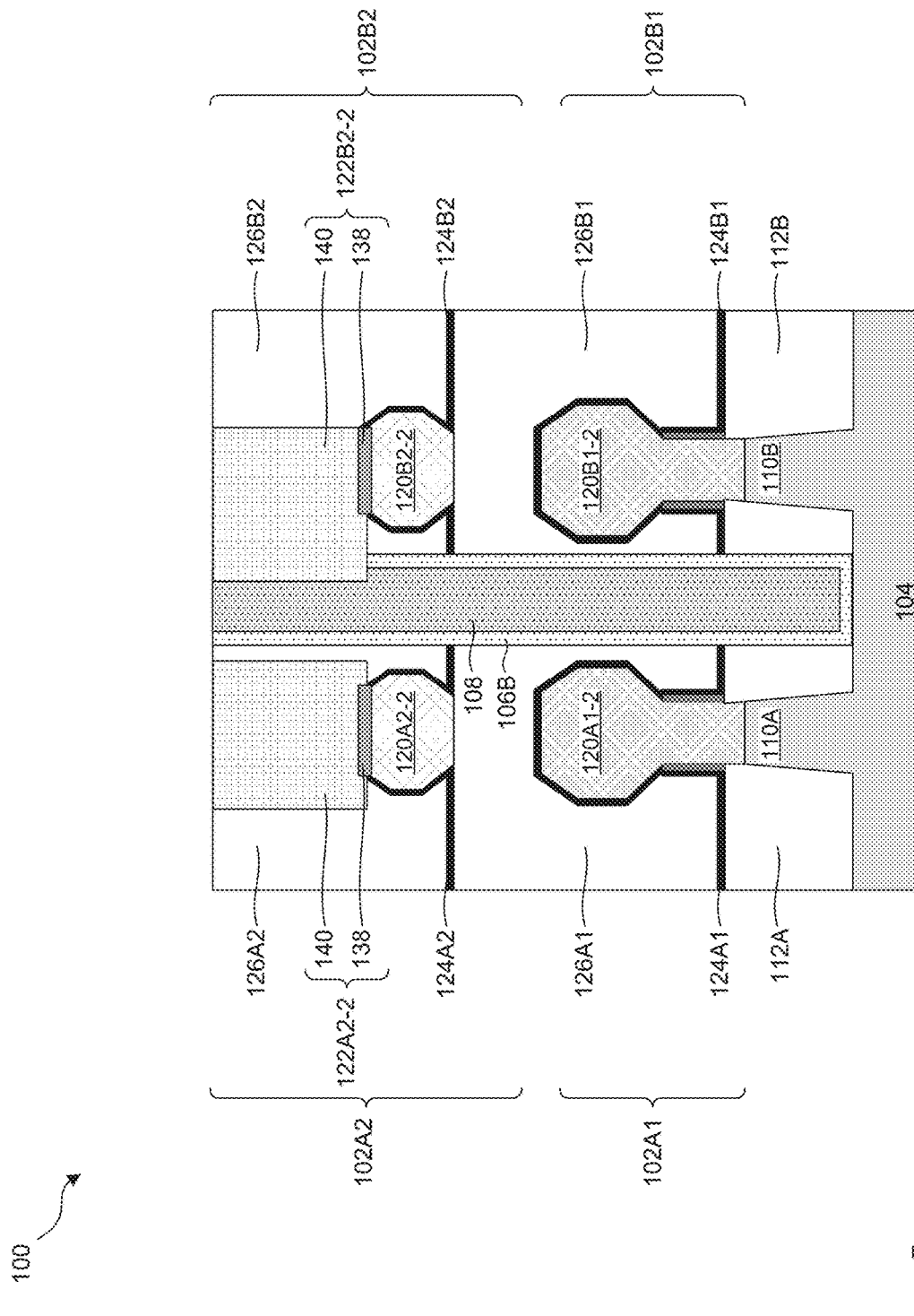

Referring to FIG. 6, in operation 635, a vertical interconnect structure is formed in the liner portion of the isolation structure. For example, as described with reference to FIGS. 20B and 20E-20F, vertical interconnect structure 108 is formed in dielectric liner portion 106B. The formation of vertical interconnect structure 108 can include depositing a conductive material on the structures of FIGS. 19A-19F, followed by a CMP process to form the structures of FIGS. 20A-20F. The deposition process fills the second portion of isolation trench 1806 with the conductive material, as shown in FIGS. 20B and 20E-20F. The CMP process can substantially coplanarize top surfaces of top gate structures, vertical interconnect structure 108, dielectric fill portion 106A, and dielectric liner portion 106B. Vertical interconnect structure 108 is not visible in the cross-sectional views of FIGS. 20A and 20C-20D.

Referring to FIG. 6, in operation 640, front-side S/D contact structures are formed on front-side surfaces of the top S/D regions. For example, as described with reference to FIGS. 21A, 21D, and 21F, front-side S/D contact structures 122A2-1, 122A2-2, 122B2-1, and 122B2-2 are formed on front-side surfaces of top S/D regions 120A2-1, 120A2-2, 120B2-1, and 120B2-2. Front-side S/D contact structures are not visible in the cross-sectional views of FIGS. 21B-21C and 21E. In some embodiments, gate capping layers 131A-131B (shown in FIGS. 21A, 21C, and 21E) can be formed prior to forming the front-side S/D contact structures.

Figure 22A:
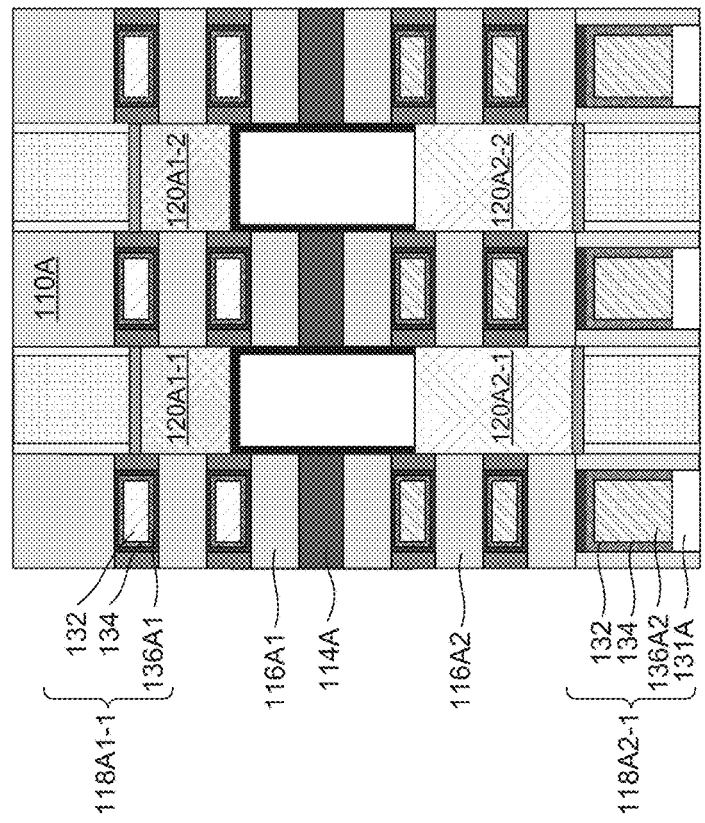
Figure 22B:
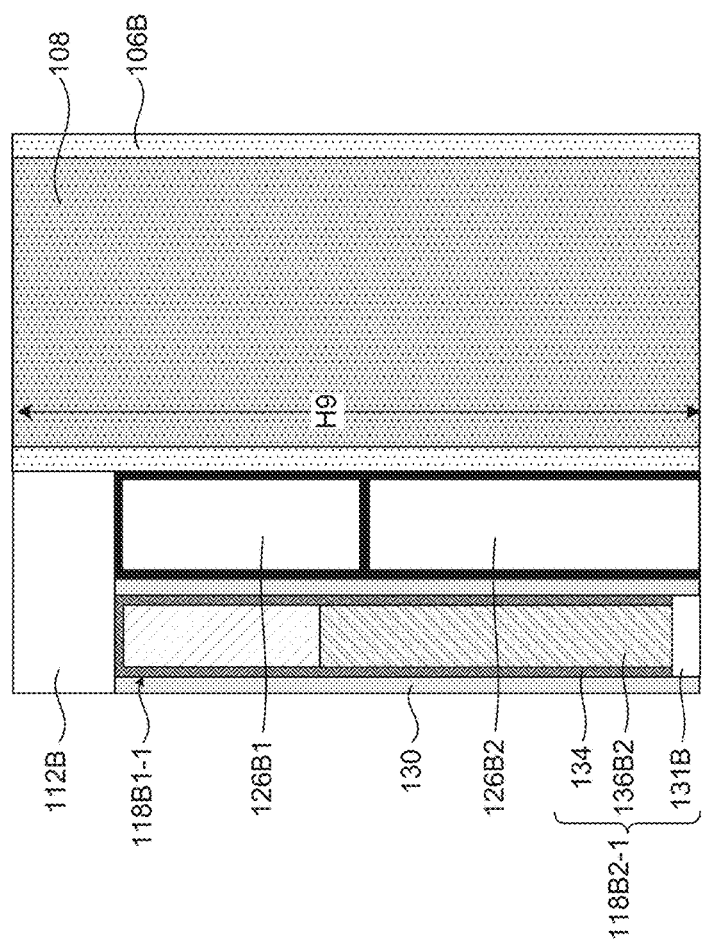
Figure 22C:
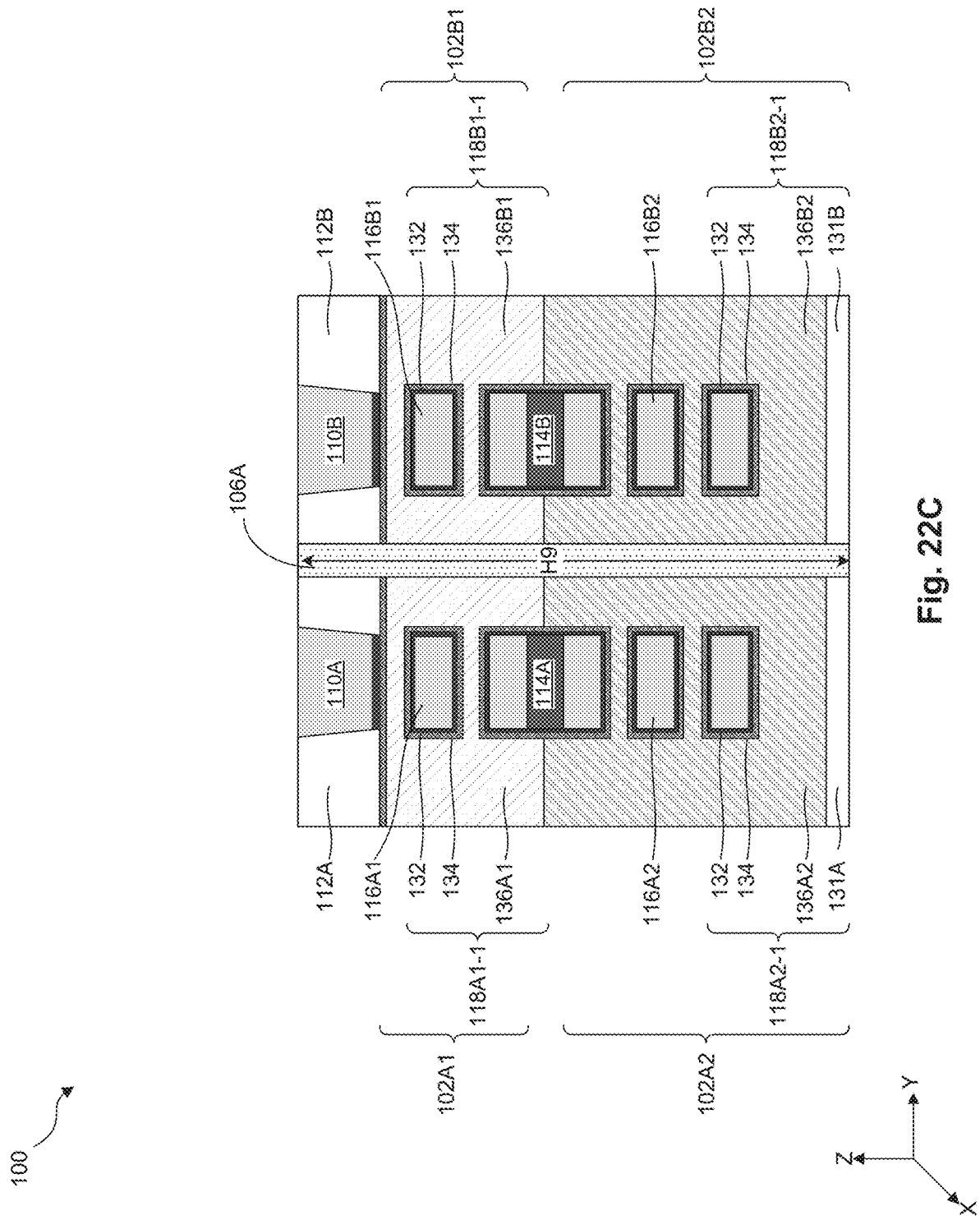
Figure 22D:
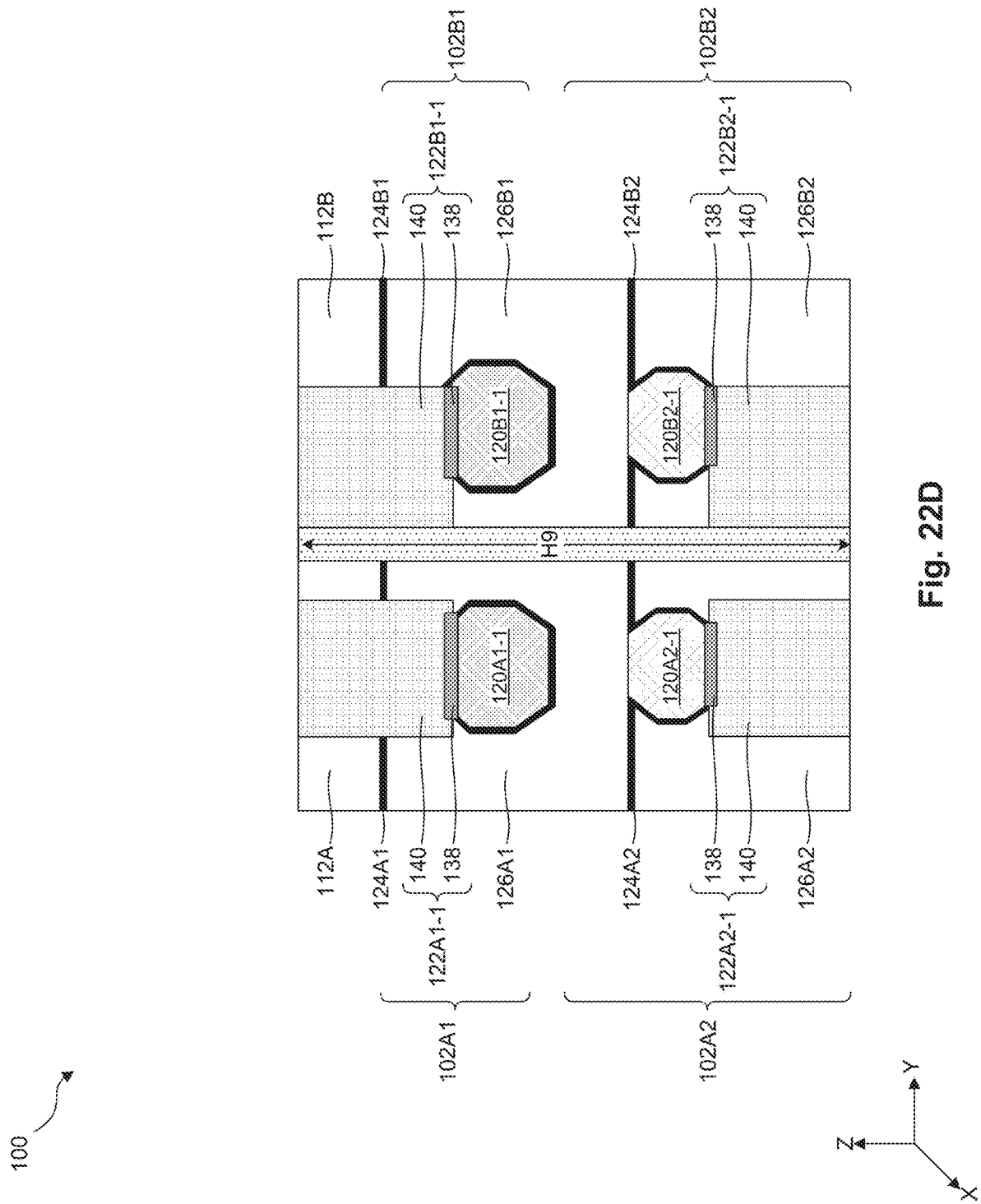
Figure 22E:
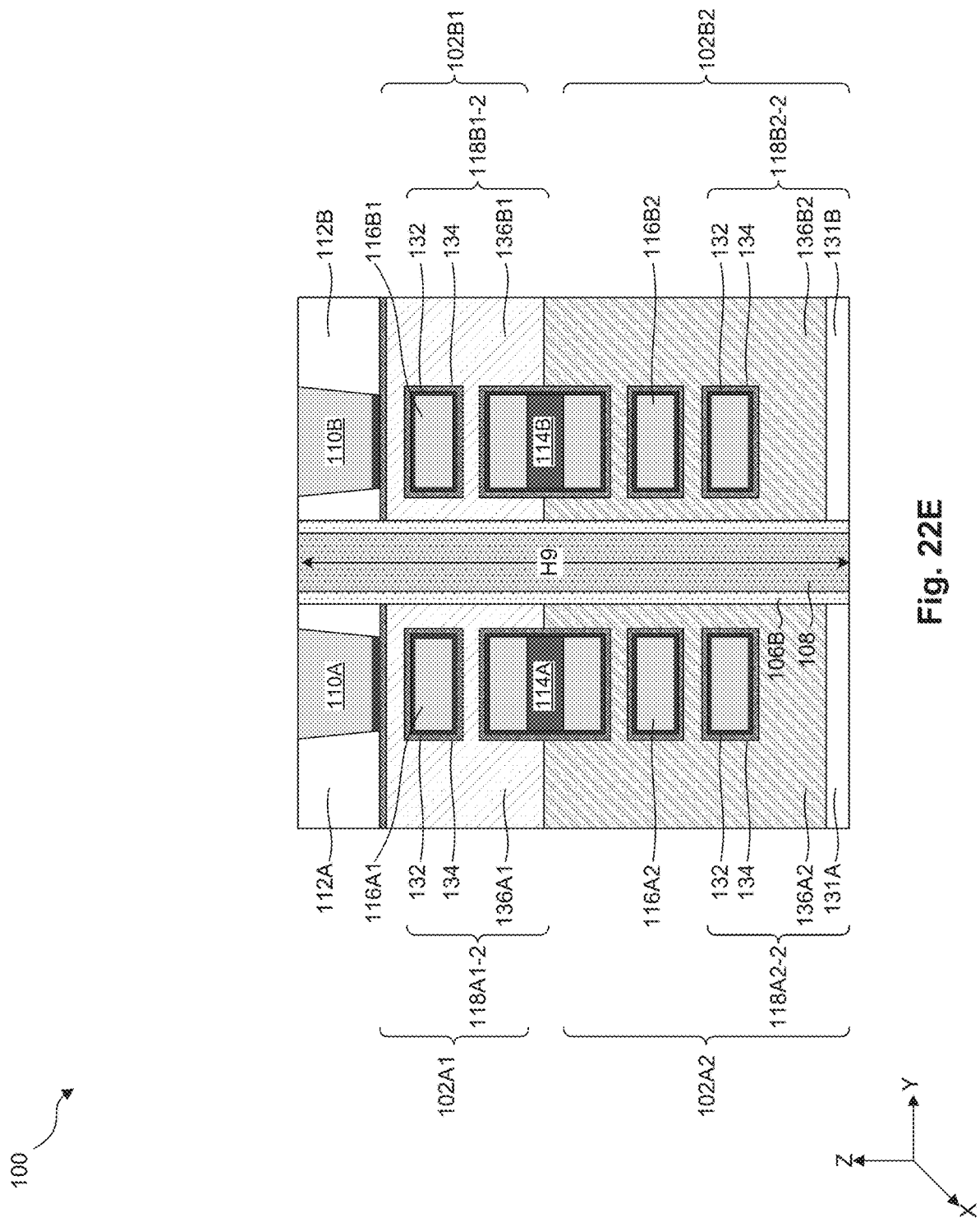
Figure 22F:
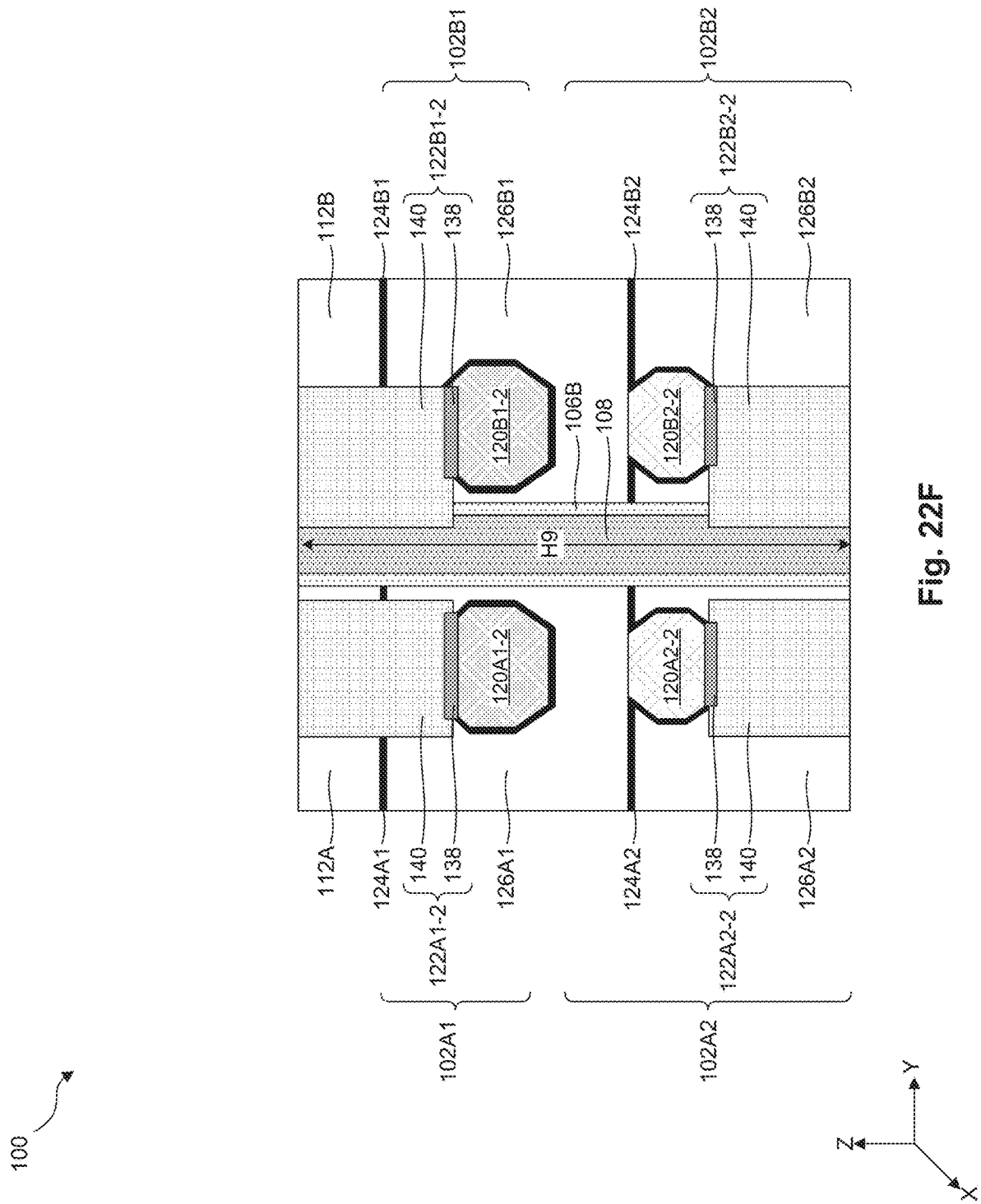

Referring to FIG. 6, in operation 645, back-side S/D contact structures are formed on back-side surfaces of the bottom S/D regions. For example, as described with reference to FIGS. 22A, 22D, and 22F, back-side S/D contact structures 122A1-1, 122A1-2, 122B1-1, and 122B1-2 are formed on back-side surfaces of bottom S/D regions 120A2-1, 120A2-2, 120B2-1, and 120B2-2. Back-side S/D contact structures are not visible in cross-sectional views of FIGS. 22B-22C and 22E. The formation of the back-side S/D contact structures can include sequential operations of (i) thinning or removing substrate 104, as shown in FIGS. 22A-22F, (ii) forming S/D contact openings (not shown) by removing portions of fin structures 110A-110B under the bottom S/D regions, (iii) forming silicide layers 138 in the S/D contact openings, as shown in FIGS. 22A, 22D, and 22F, and (iv) forming contact plugs 140 on silicide layers 138, as shown in FIGS. 22A, 22D, and 22F. In some embodiments, a portion of dielectric liner portion 106B in physical contact with substrate 104, as shown in FIGS. 21B-21F can be removed during the thinning or removal of substrate 104, as shown in FIGS. 22B-22F.

The present disclosure provides example semiconductor devices (e.g., semiconductor device 100) with stacked FETs (e.g., stacked FETs 102A-102B) and vertical interconnect structures (e.g., vertical interconnect structures 108, 208A-208B, and 508) between adjacent stacked FETs. The present disclosure further provides example methods (e.g., method 600) of forming the semiconductor devices. With the use of stacked FETs, the device density of ICs can be increased without aggressively scaling down the devices and compromising the electrical isolation between the devices in the IC. In some embodiments, each of the stacked FETs can include a stack of different conductivity type GAA FETs (e.g., GAA FETs 102A1-102A2) and/or can include a stack of the same conductivity type GAA FETs. Each of the stacked FETs can further include a channel isolation layer (e.g., channel isolation layers 114A-114B). The channel isolation layer can electrically isolate the channel regions of the stacked FETs from each other.

In some embodiments, the vertical interconnect structures (also referred to as "conductive bridge structures" and "through-via structures") can provide electrical connections between top and bottom GAA FETs (e.g., GAA FETs 102B1-102B2) in a stacked FET (e.g., stacked FET 102B). In some embodiments, the vertical interconnect structures can provide electrical connections between top GAA FETs and an interconnect structure on a back-side of the semiconductor device. In some embodiments, the vertical interconnect structures can provide electrical connections between bottom GAA FETs and an interconnect structure on a front-side of the semiconductor device. The vertical interconnect structures can be electrically connected to S/D contact structures (e.g., S/D contact structures 122B1-2 and 122B2-2) of the top and/or bottom GAA FETs (e.g., GAA FETs 102B1-102B2).

The semiconductor device can further include isolation structures (e.g., isolation structures 106, 206, 306A-306B, 406, and 506) formed in a CMG process to "cut" long metal gate structures, extending over two or more of the stacked FETs, into shorter gate portions and to electrically isolate adjacent stacked FETs from each other. One or more of the isolation structures can include dielectric fill portions (e.g., dielectric fill portions 106A, 206A, 406, and 506A) and dielectric liner portions (e.g., dielectric liner portions 106B, 206B1, 206B2, 306A-306B, and 506B). The vertical interconnect structures can be formed in the dielectric liner portions to reduce the device area occupied by the isolation structures and the vertical interconnect structures in the semiconductor device compared to the device area occupied by vertical interconnect structures formed adjacent to isolation structures. The formation of the vertical interconnect structures in the isolation structures also relaxes the dimensional constraints on the vertical interconnect structures. Larger vertical interconnect structures can be formed in the isolation structures, which reduces the resistance of the vertical interconnect structures by about 60% to about 90% compared to the resistance of vertical interconnect structures formed adjacent to isolation structures.

Furthermore, the vertical interconnect structures can be formed in the isolation structures with fewer process steps than the number of process steps involved in forming vertical interconnect structures adjacent to isolation structures. For example, the isolation trenches (e.g., isolation trench 1806) formed using a photolithographic process and an etch process during the CMG process (e.g., operation 625 of method 600) can be used to form both the isolation structures and the vertical interconnect structures. Portions of the isolation trenches can be filled with a dielectric material to form the dielectric fill portions (e.g., operation 630 of method 600). Other portions of the isolation trenches can be lined with the dielectric material to form the dielectric liner portions (e.g., operation 630 of method 600), which can be subsequently filled with a conductive material to form the vertical interconnect structures (e.g., operation 630 of method 600). Thus, a single photolithographic process and a single etch process can be used to form both the vertical interconnect structures and the isolation structures, instead of the multiple photolithographic processes and multiple etch processes used for forming vertical interconnect structures adjacent to isolation structures.

In some embodiments, a semiconductor device includes a first FET, a second FET, an isolation structure, and a conductive structure. The first FET includes a first fin structure, a first array of gate structures disposed on the first fin structure, and a first array of S/D regions disposed on the first fin structure. The second FET includes a second fin structure, a second array of gate structures disposed on the second fin structure, and a second array of S/D regions disposed on the second fin structure. The isolation structure includes a fill portion and a liner portion disposed between the first and second FETs and in physical contact with the first and second arrays of gate structures. The conductive structure is disposed in the liner portion of the isolation structure and conductively coupled to a S/D region of the second array of S/D regions.

In some embodiments, a semiconductor device includes a first stacked FET, a second stacked FET, an isolation structure, and a vertical interconnect structure. The first stacked FET includes a first GAA FET of a first conductivity type and a second GAA FET of a second conductivity type disposed on the first GAA FET. The first and second conductivity types are different from each other. The second stacked FET includes a third GAA FET of the first conductivity type and a fourth GAA FET of the second conductivity type disposed on the third GAA FET. The isolation structure includes a dielectric fill portion and a dielectric liner portion disposed between the first and second stacked FETs. The vertical interconnect structure is surrounded by the dielectric liner portion and conductively coupled to S/D regions of the third and fourth GAA FETs.

In some embodiments, a method includes forming first and second fin structures on a substrate, forming first and second arrays of S/D regions on the first and second fin structures, respectively, forming third and fourth arrays of S/D regions on the first and second arrays of S/D regions, respectively, forming an array of gate structures on the first and second fin structures, forming an isolation trench through the array of gate structures and between the first and second arrays of S/D regions, depositing a nitride layer in the isolation trench to fill a first portion of the isolation trench and form a liner along sidewalls of a second portion of the isolation trench, and depositing a conductive material on the liner to fill the second portion of the isolation trench.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first field effect transistor (FET), comprising:
      a first fin structure,
      a first array of gate structures disposed on the first fin structure, and
      a first array of source/drain (S/D) regions;
   a second FET, comprising:
      a second fin structure,
      a second array of gate structures disposed on the second fin structure, and
      a second array of S/D regions;
   an isolation structure comprising a fill portion and a liner portion disposed between the first and second FETs and in physical contact with the first and second arrays of gate structures; and
   a conductive structure disposed in the liner portion of the isolation structure and conductively coupled to a S/D region of the second array of S/D regions.

2. The semiconductor device of claim 1, wherein the conductive structure is conductively coupled to first and second S/D regions of the second array of S/D regions, and wherein the second S/D region is disposed on the first S/D region.

3. The semiconductor device of claim 1, further comprising first and second contact structures disposed on first and second S/D regions of the second array of S/D regions, respectively, wherein the first and second contact structures are in physical contact with the conductive structure, and wherein the second S/D region is disposed on the first S/D region.

4. The semiconductor device of claim 1, wherein the first array of S/D regions is electrically isolated from the conductive structure.

5. The semiconductor device of claim 1, wherein sidewalls of the fill portion and liner portion facing the first array of gate structures are substantially coplanar with each other.

6. The semiconductor device of claim 1, wherein sidewalls of the fill portion and liner portion facing the second array of gate structures are non-coplanar with each other.

7. The semiconductor device of claim 1, wherein a portion of the liner portion and a portion of the conductive structure protrudes from a sidewall of the fill portion facing the second array of gate structures.

8. The semiconductor device of claim 1, wherein a width of the conductive structure is greater than a width of the S/D region of the second array of S/D regions or is greater than a gate pitch of the second array of gate structures.

9. The semiconductor device of claim 1, wherein the isolation structure further comprises a second liner portion coupled to the liner portion through the fill portion, and further comprising a second conductive structure disposed in the second liner portion.

10. The semiconductor device of claim 1, further comprising:
    a first contact structure disposed on a first S/D region of the first array of S/D regions; and
    a second contact structure disposed on a second S/D region of the second array of S/D regions,
    wherein the first and second contact structures are in physical contact with the conductive structure.

11. A semiconductor device, comprising:
    first and second fin structures;
    a first plurality of gate structures disposed on the first fin structure;
    a first plurality of source/drain regions disposed adjacent to the first plurality of gate structures;
    a second plurality of gate structures disposed on the second fin structure;
    a second plurality of source/drain regions disposed adjacent to the second plurality of gate structures;
    a conductive structure coupled to the second plurality of source/drain regions and disposed between the first and second fin structures, and between the first and second plurality of gate structures, and between the first and second plurality of source/drain regions; and
    a dielectric structure, comprising:
       a fill portion disposed between the first and second plurality of source/drain regions; and a liner portion surrounding the conductive structure and disposed between the first and second plurality of gate structures, wherein the liner portion is in contact with the first and second plurality of gate structures and the conductive structure.

12. The semiconductor device of claim 11, wherein the fill portion is disposed adjacent to the conductive structure.

13. The semiconductor device of claim 11, further comprising a contact structure disposed on a surface of at least one of the first plurality of source/drain regions and in physical contact with a sidewall of the conductive structure.

14. The semiconductor device of claim 11, further comprising:
   a third source/drain region disposed on at least one of the first plurality of source/drain regions;
   a front contact structure disposed on a top surface of the third source/drain region and in physical contact with a sidewall of the conductive structure; and
   a back contact structure disposed on a bottom surface of at least one of the first plurality of source/drain regions and in physical contact with the sidewall of the conductive structure.

15. A semiconductor device, comprising:
   first and second fin structures;
   a first array of gate structures disposed on the first fin structure;
   a second array of gate structures disposed on the second fin structure;
   a first array of source/drain regions disposed on the first fin structure;
   a second array of source/drain regions disposed on the second fin structure;
   a conductive structure extending vertically between the first and second array of gate structures and between the first and second fin structures, wherein the conductive structure is conductively coupled to a source/drain region of the second array of source/drain regions; and
   an isolation structure, comprising:
      fill portion disposed between the first and second array of gate structures, and
      a liner portion surrounding the conductive structure and in contact with the first and second array of gate structures.

16. The semiconductor device of claim 15, wherein the fill portion comprises a nitride material.

17. The semiconductor device of claim 15, wherein the isolation structure further comprises another liner portion coupled to the liner portion through the fill portion.

18. The semiconductor device of claim 17, further comprising another conductive structure surrounded by the other liner portion.

19. The semiconductor device of claim 15, further comprising:
   a contact structure disposed on the source/drain region of the second array of source/drain regions and in physical contact with a sidewall of the conductive structure.

20. The semiconductor device of claim 15, further comprising:
   a contact structure disposed on the source/drain region of the second array of source/drain regions and in physical contact with a sidewall of the conductive structure and a sidewall of the fill portion.

* * * * *

UNITED STATES PATENT AND TRADEMARK OFFICE
CERTIFICATE OF CORRECTION

| | | |
|---|---|---|
| PATENT NO. | : 12,417,941 B2 | Page 1 of 1 |
| APPLICATION NO. | : 17/821042 | |
| DATED | : September 16, 2025 | |
| INVENTOR(S) | : Huang et al. | |

It is certified that error appears in the above-identified patent and that said Letters Patent is hereby corrected as shown below:

On the Title Page

On item [72], Line 1, delete "Jui-Chen" and insert -- Jui-Chien --, therefor.

In the Specification

In Column 7, Line 30, delete "(TiAlC)," and insert -- (TiAlC), --, therefor.

In Column 7, Line 31, delete "(TaAlC)," and insert -- (TaAlC), --, therefor.

Signed and Sealed this
Eighteenth Day of November, 2025

John A. Squires
*Director of the United States Patent and Trademark Office*